United States Patent
Yoshimoto et al.

(10) Patent No.: US 9,490,247 B2
(45) Date of Patent: Nov. 8, 2016

(54) SEMICONDUCTOR DEVICE AND METHOD FOR MANUFACTURING SAME

(71) Applicant: HITACHI, LTD., Chiyoda-ku, Tokyo (JP)

(72) Inventors: Hiroyuki Yoshimoto, Tokyo (JP); Akio Shima, Tokyo (JP); Digh Hisamoto, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/914,883

(22) PCT Filed: Aug. 29, 2013

(86) PCT No.: PCT/JP2013/073075
§ 371 (c)(1),
(2) Date: Feb. 26, 2016

(87) PCT Pub. No.: WO2015/029175
PCT Pub. Date: Mar. 5, 2015

(65) Prior Publication Data
US 2016/0284690 A1    Sep. 29, 2016

(51) Int. Cl.
*H01L 29/74* (2006.01)
*H01L 21/332* (2006.01)
(Continued)

(52) U.S. Cl.
CPC ....... *H01L 27/0623* (2013.01); *H01L 21/8249* (2013.01); *H01L 29/0804* (2013.01);
(Continued)

(58) Field of Classification Search
CPC ........... H01L 27/0623; H01L 21/8249; H01L 29/0804; H01L 29/0821; H01L 29/1095; H01L 29/36; H01L 29/66348; H01L 29/7397

USPC ......... 438/322, 326, 133, 135; 257/133, 140
See application file for complete search history.

(56) References Cited

U.S. PATENT DOCUMENTS 6,392,859 B1 *   5/2002   Ohshima ............. H01L 27/0248
                                            257/E27.112
7,723,783 B2     5/2010   Saito et al.
(Continued)

FOREIGN PATENT DOCUMENTS

JP    2001-127286 A    5/2001
JP    2004-022941 A    1/2004
(Continued)

OTHER PUBLICATIONS

Antoniou, M., et al; The Soft Punchthrough+ Superjunction Insulated Gate Bipolar Transistor: A High Speed Structure With Enhanced Electron Injection; IEEE Trans, Electron Devices, vol. 58, pp. 769-775, 2011.
(Continued)

*Primary Examiner* — Kevin M Picardat
(74) *Attorney, Agent, or Firm* — Miles & Stockbridge P.C.

(57) ABSTRACT

An IGBT (50) includes a $p^+$ collector region (3) and an $n^{--}$ drift region (1), in which a first transistor (TR1) and a second transistor (TR2) are formed on the $n^{--}$ drift region (1). In the $n^{--}$ drift region (1), a p-type hole extraction region (14) is formed in contact with the second transistor (TR2). When the IGBT (50) is in an on-state, electrons and holes flow through the first transistor (TR1), but a current does not flow through the second transistor (TR2). On the other hand, when the IGBT (50) is switched from the on-state to an off-state, holes flow through the first transistor (TR1), and holes flow through the hole extraction region (14) and the second transistor (TR2).

15 Claims, 28 Drawing Sheets

(51) Int. Cl.
*H01L 27/06* (2006.01)
*H01L 29/739* (2006.01)
*H01L 29/66* (2006.01)
*H01L 29/10* (2006.01)
*H01L 29/08* (2006.01)
*H01L 29/36* (2006.01)
*H01L 21/8249* (2006.01)

(52) U.S. Cl.
CPC ....... *H01L29/0821* (2013.01); *H01L 29/1095* (2013.01); *H01L 29/36* (2013.01); *H01L 29/66348* (2013.01); *H01L 29/7397* (2013.01)

(56) References Cited

U.S. PATENT DOCUMENTS

| | | |
|---|---|---|
| 7,800,168 B2 | 9/2010 | Ogura et al. |
| 7,939,886 B2 | 5/2011 | Takemori et al. |
| 2005/0156201 A1 | 7/2005 | Matsuda |
| 2008/0283867 A1 | 11/2008 | Mori et al. |
| 2013/0113087 A1* | 5/2013 | Ruething ............ H01L 29/0696 257/655 |
| 2015/0187752 A1* | 7/2015 | Salman ............... H01L 27/0259 257/526 |

FOREIGN PATENT DOCUMENTS

| | | |
|---|---|---|
| JP | 2004-221370 A | 8/2004 |
| JP | 2005-209811 A | 8/2005 |
| JP | 2007-149736 A | 6/2007 |
| JP | 2007-221012 A | 8/2007 |
| JP | 2008-288386 A | 11/2008 |
| WO | WO 2007/060716 A1 | 5/2007 |

OTHER PUBLICATIONS

Antoniou, M., et al.; "The Semi-Superjunction IGBT": IEEE Electron Device Letters, vol. 31, pp. 591-593, 2010.
Yuan T. et al., Fundamentals of Modern VLSI Devices, Cambridge University Press, 1998, pp. 149-150.

* cited by examiner

SEMICONDUCTOR DEVICE AND METHOD FOR MANUFACTURING SAME

TECHNICAL FIELD

The present invention relates to a semiconductor device and a technique for manufacturing the same, and relates to a semiconductor device including an insulated gate bipolar transistor and a technique for manufacturing the same.

RELATED ART

Insulated gate bipolar transistors (IGBTs) are semiconductor elements used as current-controlling devices mainly in the fields of power electronics. The IGBT includes three terminals: a collector electrode provided on the back surface, and an emitter electrode and a gate electrode provided on the front surface, and has a structure of a combination of a metal insulator semiconductor field effect transistor (MISFET) and a bipolar transistor. As the IGBTs, there is an IGBT in which a p-type collector region, an n-type drift region, a p-type base region, and an n-type emitter region are provided between the collector electrode and the emitter electrode, and further, the gate electrode is provided so as to be in contact with the base region via a gate insulating film.

The IGBT allows a high current to flow therethrough by utilizing an excess accumulation effect of minority carriers. Therefore, compared to a power device having another structure such as a power MISFET, the IGBT has features that can allow a high current to flow therethrough in an on-state and can maintain a high breakdown voltage in an off-state.

Various contrivances have been made for the IGBT to promote the excess accumulation effect. One of the contrivances is the utilization of an injection enhancement (IE) effect. The IE effect is to increase the concentration of charges accumulated in the n-type drift region by making holes less likely to be discharged from the emitter electrode side when the IGBT is in the on-state.

JP-A-2005-209811 (PTL 1) discloses, as the utilization of the IE effect, a technique in which the area of the emitter region is reduced to thereby increase the concentration of charges accumulated in the n-type drift region. Moreover, JP-A-2008-288386 (PTL 2) discloses, as the utilization of the IE effect, a technique in which an n-type barrier region (hole barrier layer) is provided between the n-type drift region and the p-type base region to thereby increase the concentration of charges accumulated in the n-type drift region. By the utilization of the IE effect described above, although the resistance increases more on the emitter electrode side than in the drift region, the resistance in the drift region decreases more than that. Therefore, a collector voltage (on-voltage) for causing a rated collector current to flow can be reduced.

As a problem that is in a trade-off relationship with the promotion of the IE effect, there is a latch-up problem. This is a problem in that when the concentration of holes in the drift region becomes too high due to the IE effect, a pnp parasitic bipolar transistor composed of an inversion layer and the like is brought into the on-state, resulting in latch-up. JP-A-2001-127286 (PTL 3) discloses, as a solution to this problem, a technique in which a second emitter region through which only holes can flow when the IGBT is in the on-state is formed. Moreover, JP-A-2004-221370 (PTL 4) discloses a technique in which the n-type barrier region (hole barrier layer) is inserted into the second emitter region in order to prevent a reduction in IE effect due to a current composed of holes flowing into the second emitter region when the IGBT is in the on-state.

On the other hand, in an IGBT (Si-IGBT) formed on a silicon (Si) substrate disclosed in NPL 1, a pillar-shaped $p^+$ layer is formed in the upper half of a drift layer. Moreover, in a trench-type Si-IGBT disclosed in NPL 2, a pillar-shaped $p^+$ layer similar to that in NPL 1 is formed below a trench gate. However, in the Si-IGBT disclosed in NPL 1 and the trench-type Si-IGBT disclosed in NPL 2, a gate structure for discharging holes is not formed, and the $p^+$ layer and an emitter are not directly connected.

CITATION LIST

Patent Literature

PTL 1: JP-A-2005-209811
PTL 2: JP-A-2008-288386
PTL 3: JP-A-2001-127286
PTL 4: JP-A-2004-221370

Non-Patent Literature

NPL 1: IEEE Trans. Electron Devices, Vol. 58, pp. 769-775, 2011.
NPL 2: IEEE Electron Device Letters, Vol. 31, pp. 591-593, 2010.

SUMMARY OF INVENTION

Technical Problem

When the IGBT is switched from the on-state to the off-state, the collector voltage increases from a voltage substantially equal to 0 V to a power supply voltage. However, even after the collector voltage increases equal to the power supply voltage, the collector current continues flowing while decreasing for a constant time (hereinafter this current is referred to as "tail current"). This tail current increases a loss when the IGBT is switched from the on-state to the off-state, that is, what is called a turn-off loss.

Moreover, when the IGBT is switched from the on-state to the off-state, an electric field is increased in a space charge region as a portion of the n-type drift region on the emitter electrode side, the velocity of holes saturates, and the holes are prevented from flowing out to the emitter electrode side. Due to this, electron and hole charges are excessively accumulated in a conductivity modulated region as a portion of the n-type drift region on the collector electrode side, so that the tail current described above occurs. As a result, the switching loss cannot be reduced, which reduces the performance of the semiconductor device.

An object of the invention is to provide a technique capable of improving the performance of a semiconductor device.

The above and other objects and novel features of the invention will be apparent from the description of the specification and the accompanying drawings.

Solution to Problem

An outline of a typical one of the inventions disclosed in the application will be briefly described below.

A semiconductor device according to a typical embodiment is an IGBT including a $p^+$ collector region and an $n^{--}$ drift region formed on the upper surface side of the $p^+$ collector region, in which a first transistor and a second transistor are formed on the n⁻⁻ drift region. An emitter electrode is connected to the first transistor and the second transistor, and a collector electrode is connected to the p⁺ collector region. In the n⁻⁻ drift region, a p-type hole extraction region is formed in contact with the second transistor. When the first transistor and the second transistor are in an on-state, a current composed of electrons and holes flows from the collector electrode through the first transistor to the emitter electrode but does not flow through the second transistor. On the other hand, when the first transistor and the second transistor are switched from the on-state to an off-state, a current composed of holes flows from the n⁻⁻ drift region through the first transistor to the emitter electrode, and a current composed of holes flows from the n⁻⁻ drift region through the hole extraction region and the second transistor to the emitter electrode.

A method for manufacturing a semiconductor device according to a typical embodiment is a method for forming a first transistor and a second transistor on a substrate including a p⁺ collector region and an n⁻⁻ drift region formed on the upper surface side of the p⁺ collector region. First, a semiconductor substrate including the n⁻⁻ drift region and a p-type hole extraction region formed in a portion of the n⁻⁻ drift region on the upper surface side in a region where the second transistor is to be formed is prepared. Next, a semiconductor layer is formed on the n⁻⁻ drift region including the hole extraction region. Next, a pair of first trenches and a pair of second trenches are formed so as to penetrate the semiconductor layer. Next, a gate insulating film and a gate electrode are formed in the interiors of the pair of first trenches and the pair of second trenches. Next, a p⁺ channel region, an n⁺⁺ emitter region, and a p⁺⁺ emitter region are formed in a first region interposed between the pair of first trenches, and a p⁻ channel region and a p⁺⁺ emitter region are formed in a second region interposed between the pair of second trenches.

Advantageous Effect of the Invention

An advantageous effect obtained by a typical one of the inventions disclosed in the application will be briefly described below.

According to a typical embodiment, the performance of a semiconductor device can be improved.

DESCRIPTION OF EMBODIMENTS

Figure 1:
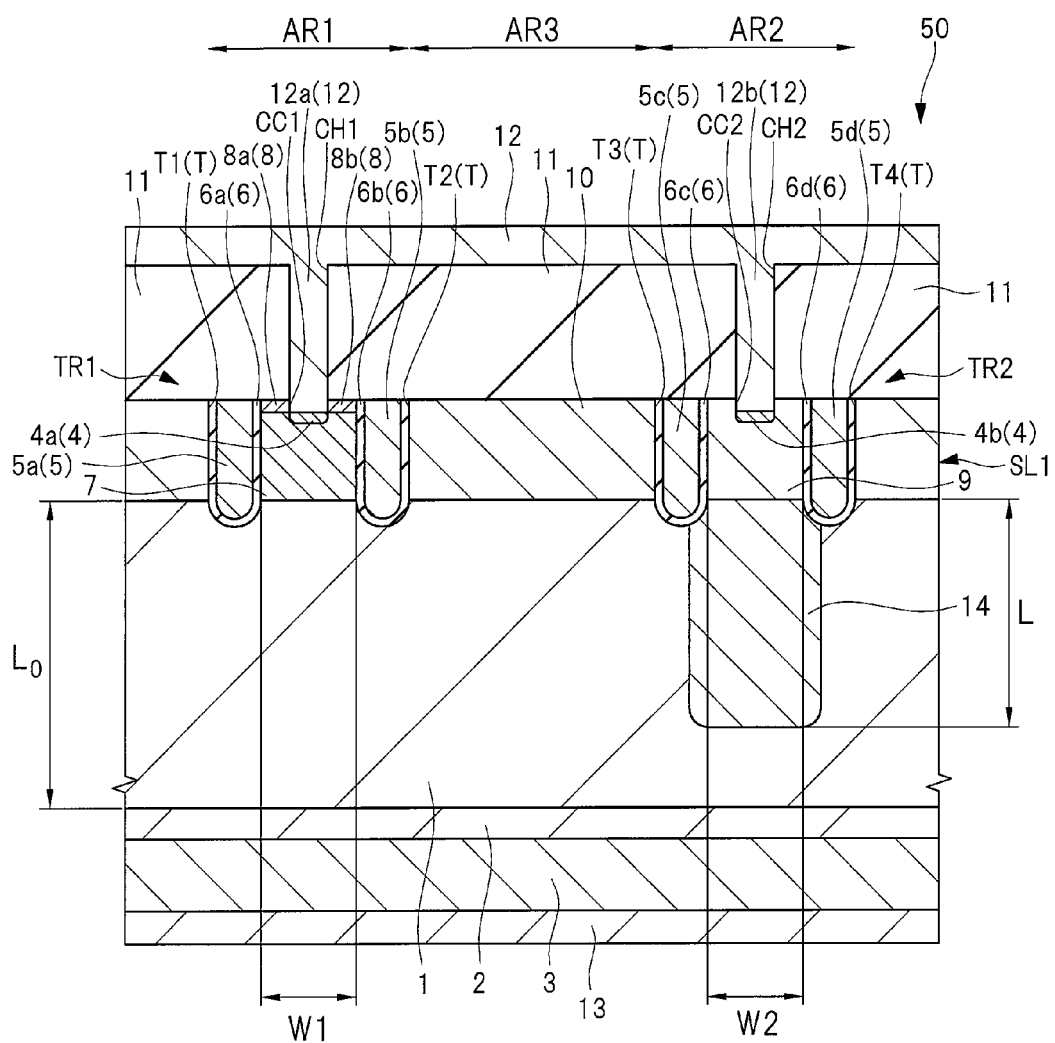
FIG. 1 is a cross-sectional view of a main portion of a semiconductor device of Embodiment 1.

In the following embodiments, the invention will be described in a plurality of sections or embodiments when required as a matter of convenience. However, these sections or embodiments are not irrelevant to each other unless otherwise stated, and the one relates to the entire or a part of the other as a modified example, details, or a supplementary explanation thereof.

Moreover, in the following embodiments, when referring to the number of elements (including number of pieces, numerical values, amount, and range), the number of the elements is not limited to a specific number unless otherwise stated or except the case where the number is apparently limited to a specific number in principle. The number larger or smaller than the specified number is also applicable.

Further, in the following embodiments, it goes without saying that the components (including element steps) are not always indispensable unless otherwise stated or except the case where the components are apparently indispensable in principle.

Similarly, in the following embodiments, when referring to the shape of components, the positional relationship thereof, and the like, the substantially approximate and similar shapes and the like are included therein unless otherwise stated or except the case where it can be conceived that they are apparently excluded in principle. The same goes for the numerical value and the range described above.

Hereinafter, the embodiments of the invention will be described in detail based on the drawings. Throughout the drawings for explaining the embodiments, members having the same function are denoted by the same reference numeral and sign, and the repetitive description thereof is omitted. Moreover, in the following embodiments, description of the same or similar portions is not repeated in principle unless particularly required.

In the drawings used in the embodiments, hatching may be omitted even in a cross-sectional view for the clarity of the drawings.

Embodiment 1

Semiconductor Device

A semiconductor device as one embodiment of the invention will be described with reference to the drawings. The semiconductor device of the embodiment is an insulated gate bipolar transistor (IGBT) including a first transistor and a second transistor as MISFETs.

Figure 2:
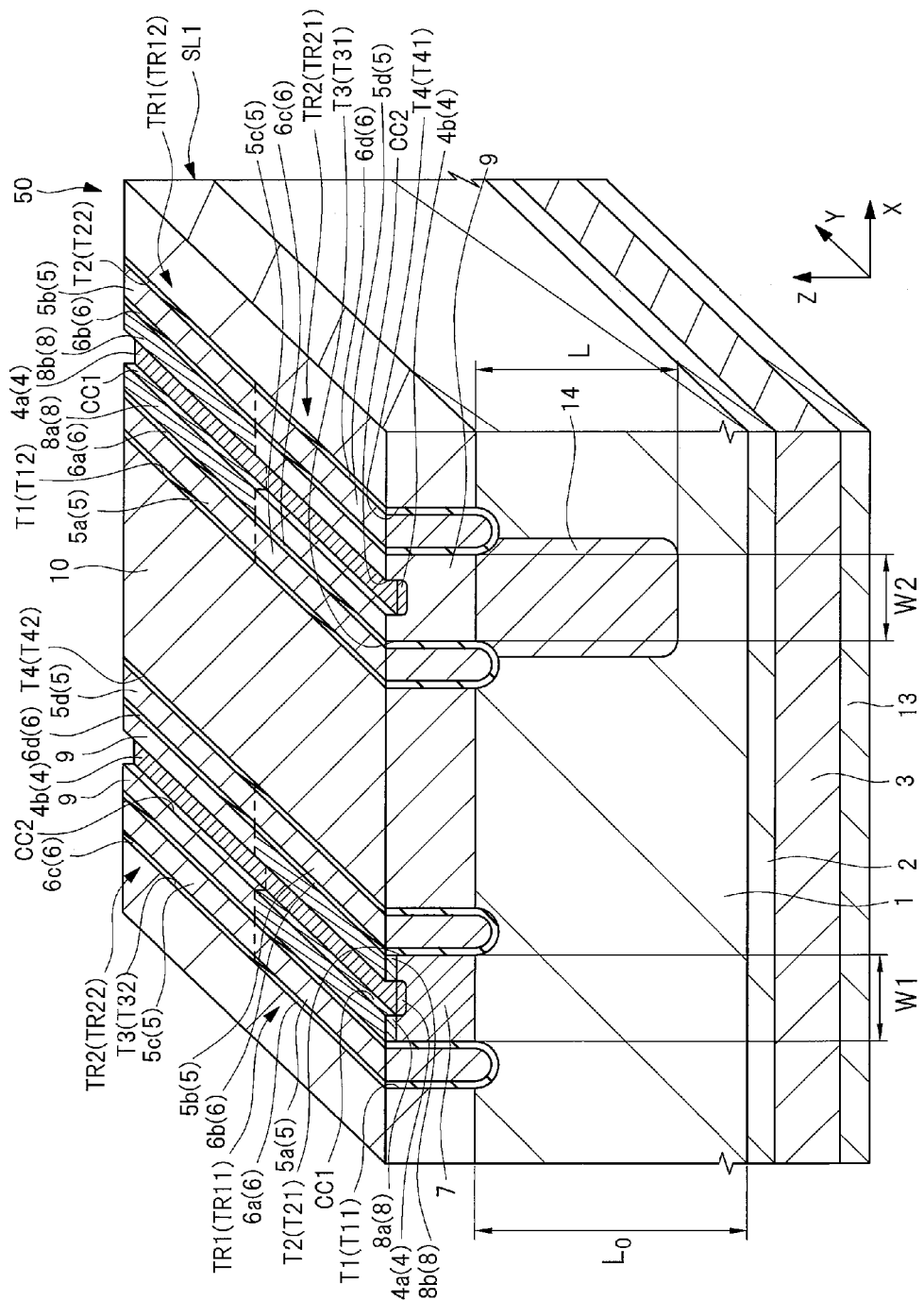
FIG. 2 is a perspective view of the semiconductor device of Embodiment 1.

FIG. 1 is a cross-sectional view of a main portion of the semiconductor device of Embodiment 1. FIG. 2 is a perspective view of the semiconductor device of Embodiment 1. In FIG. 2, a state where an interlayer insulating film 11 (see FIG. 1) and an emitter electrode 12 (see FIG. 1) are removed, that is, a see-through state, is illustrated for facilitating understanding (the same applies to FIGS. 30, 32, and 34 described later).

As shown in FIGS. 1 and 2, an IGBT 50 as the semiconductor device of Embodiment 1 includes an $n^{--}$ drift region 1, an $n^+$ buffer region 2, a $p^+$ collector region 3, a $p^{++}$ emitter region 4, a gate electrode 5, a gate insulating film 6, a $p^+$ channel region 7, an $n^{++}$ emitter region 8, and a $p^-$ channel region 9. Moreover, the IGBT 50 as the semiconductor device of Embodiment 1 includes a p-well region 10, the interlayer insulating film 11, the emitter electrode 12, a collector electrode 13, and a hole extraction region 14.

The $n^{--}$ drift region 1 is a semiconductor region made of silicon (Si) into which an n-type impurity such as, for example, phosphorus (P) or arsenic (As) has been diffused and whose conductivity type is n-type. The impurity concentration of the $n^{--}$ drift region 1 is relatively low and can be, for example, about from $5 \times 10^{13}$ to $5 \times 10^{14}$ cm$^{-3}$. Moreover, the thickness (thickness $L_0$ described later with reference to FIGS. 1 and 2) of the $n^{--}$ drift region 1 can be, for example, about from 40 to 300 μm.

The $n^+$ buffer region 2 is formed on the side opposite to the upper surface of the $n^{--}$ drift region 1, that is, on the lower surface side thereof. In other words, the $n^+$ buffer region 2 is formed on the side opposite to a first main surface of the $n^{--}$ drift region 1, that is, on a second main surface side thereof. The $n^+$ buffer region 2 is an n-type semiconductor region made of silicon (Si) into which an n-type impurity such as, for example, phosphorus (P) or arsenic (As) has been diffused. The impurity concentration of the $n^+$ buffer region 2 is high compared to the impurity concentration of the $n^{--}$ drift region 1, and can be, for example, about from $1 \times 10^{16}$ to $1 \times 10^{18}$ cm$^{-3}$. Moreover, the thickness of the $n^+$ buffer region 2 can be, for example, about from 1 to 20 μm.

The $p^+$ collector region 3 is formed on the lower surface side of the $n^+$ buffer region 2. The $p^+$ collector region 3 is a semiconductor region made of silicon (Si) into which a p-type impurity such as, for example, boron (B) has been diffused and whose conductivity type is p-type different from n-type. The impurity concentration of the $p^+$ collector region 3 is relatively high and can be, for example, about from $1 \times 10^{17}$ to $5 \times 10^{18}$ cm$^{-3}$. Moreover, the thickness of the $p^+$ collector region 3 can be, for example, about from 0.1 to 200 μm.

The $n^+$ buffer region 2 is an n-type semiconductor region formed between the $n^{--}$ drift region 1 and the $p^+$ collector region 3. A structure may be employed in which the $n^+$ buffer region 2 is not formed between the $n^{--}$ drift region 1 and the $p^+$ collector region 3 and the $n^{--}$ drift region 1 and the $p^+$ collector region 3 are in direct contact with each other.

A semiconductor layer SL1 made of, for example, silicon (Si) is formed on the upper surface side of the $n^{--}$ drift region 1. The $p^{++}$ emitter region 4, the gate electrode 5, the gate insulating film 6, the $p^+$ channel region 7, the $n^{++}$ emitter region 8, and the $p^-$ channel region 9 are formed in the semiconductor layer SL1. A trench T is formed in the semiconductor layer SL1 so as to penetrate the semiconductor layer SL1. Specifically, trenches T1, T2, T3, and T4 are formed as the trench T. The thickness of the semiconductor layer SL1 can be, for example, about from 1 to 5 μm.

In the specification of the application, the trenches T1, T2, T3, and T4, for example, mean the trench T1, the trench T2, the trench T3, and the trench T4.

The trenches T1 and T2 constitute a pair of trenches formed spaced apart from each other. In a plan view, the trenches T1 and T2 and a region interposed between the trenches T1 and T2 are defined as a first region AR1. In this case, a first transistor TR1 is formed in the trenches T1 and T2 and a portion of the semiconductor layer SL1 interposed between the trenches T1 and T2. That is, the first transistor TR1 is formed, in the plan view, in the first region AR1 and in the semiconductor layer SL1.

In the specification of the application, the phrase "in the plan view" means viewing the semiconductor device from a direction vertical to the upper surface of a semiconductor substrate 3S, that is, the upper surface of the $n^{--}$ drift region 1.

The trenches T3 and T4 constitute a pair of trenches formed spaced apart from each other. In the plan view, the trenches T3 and T4 and a region interposed between the trenches T3 and T4 are defined as a second region AR2. In this case, a second transistor TR2 is formed in the trenches T3 and T4 and a portion of the semiconductor layer SL1 interposed between the trenches T3 and T4. That is, the second transistor TR2 is formed, in the plan view, in the second region AR2 and in the semiconductor layer SL1.

In the plan view, a region between the first region AR1 and the second region AR2 is defined as a third region AR3. In this case, the p-well region 10 is formed in a portion of the semiconductor layer SL1 interposed between the trenches T2 and T3. That is, the p-well region 10 is formed, in the plan view, in the third region AR3 and in the semiconductor layer SL1.

As shown in the perspective view of FIG. 2, the trenches T1, T2, T3, and T4 are formed along one direction in the plan view, that is, along the Y-axis direction in FIG. 2.

The $p^{++}$ emitter region 4 is formed in the semiconductor layer SL1 and is a p-type semiconductor region made of silicon (Si) into which a p-type impurity such as, for example, boron (B) has been diffused. Two $p^{++}$ emitter regions 4a and 4b are formed as the $p^{++}$ emitter region 4. The impurity concentration of the $p^{++}$ emitter region 4 is higher than the impurity concentration of the $p^+$ collector region 3 and can be, for example, about from $1\times10^{18}$ to $5\times10^{20}$ cm$^{-3}$.

The $p^{++}$ emitter region 4a is formed spaced apart from both the trenches T1 and T2 in a portion of the semiconductor layer SL1 interposed between the pair of trenches T1 and T2 in the first region AR1. That is, the trenches T1 and T2 are formed on both sides of the $p^{++}$ emitter region 4a at positions spaced apart from the $p^{++}$ emitter region 4a. Moreover, the $p^{++}$ emitter region 4a is in contact with an emitter electrode 12a.

The $p^{++}$ emitter region 4b is formed spaced apart from both the trenches T3 and T4 in a portion of the semiconductor layer SL1 interposed between the pair of trenches T3 and T4 in the second region AR2. That is, the trenches T3 and T4 are formed on both sides of the $p^{++}$ emitter region 4b at positions spaced apart from the $p^{++}$ emitter region 4b. Moreover, the $p^{++}$ emitter region 4b is in contact with an emitter electrode 12b.

The gate electrode 5 is a pair of electrodes formed on both sides of the $p^{++}$ emitter region 4. As the gate electrode 5, a pair of gate electrodes 5a and 5b and a pair of gate electrodes 5c and 5d are formed. The gate electrode 5 is a conductor film made of a polysilicon film into which an n-type impurity such as, for example, phosphorus (P) or arsenic (As) has been diffused at a high concentration, and is formed by, for example, a chemical vapor deposition (CVD) method or the like.

The gate electrodes 5a and 5b are electrodes formed in the interiors of the pair of trenches T1 and T2, respectively, in the first region AR1. As described above, since the pair of trenches T1 and T2 are formed on both sides of the $p^{++}$ emitter region 4a, also the gate electrodes 5a and 5b are a pair of gate electrodes formed on both sides of the $p^{++}$ emitter region 4a. Although not shown in the drawing, the gate electrodes 5a and 5b are electrically connected to each other at a position on the far side (or the near side) of the cross-section shown in FIG. 1.

The gate electrodes 5c and 5d are electrodes formed in the interiors of the pair of trenches T3 and T4, respectively, in the second region AR2. As described above, since the pair of trenches T3 and T4 are formed on both sides of the $p^{++}$ emitter region 4b, also the gate electrodes 5c and 5d are a pair of gate electrodes formed on both sides of the $p^{++}$ emitter region 4b. Although not shown in the drawing, the gate electrodes 5c and 5d are electrically connected to each other at a position on the far side (or the near side) of the cross-section shown in FIG. 1.

The gate insulating film 6 covers the surface of the gate electrode 5. As the gate insulating film 6, four gate insulating films 6a, 6b, 6c, and 6d are formed. The gate insulating film 6 is an insulating film made of, for example, a silicon oxide film and is formed by, for example, a thermal oxidation method, a CVD method, or the like before forming the gate electrode 5.

The gate insulating films 6a and 6b are formed on the inner walls of the pair of trenches T1 and T2, respectively, in the first region AR1, and cover the surfaces of the pair of gate electrodes 5a and 5b.

The gate insulating films 6c and 6d are formed on the inner walls of the pair of trenches T3 and T4, respectively, in the second region AR2, and cover the surfaces of the pair of gate electrodes 5c and 5d.

The $p^+$ channel region 7 is formed in a portion of the semiconductor layer SL1 interposed between the pair of trenches T1 and T2 in the first region AR1 and is a p-type semiconductor region made of silicon (Si) into which a p-type impurity such as, for example, boron (B) has been diffused. The $p^+$ channel region 7 is in contact with all of the $p^{++}$ emitter region 4a, the gate insulating films 6a and 6b, and the $n^{--}$ drift region 1. The impurity concentration of the $p^+$ channel region 7 is lower than the impurity concentration of the $p^{++}$ emitter region 4a and can be, for example, about from $5\times10^{15}$ to $1\times10^{18}$ cm$^{-3}$.

The $n^{++}$ emitter region 8 is formed in a portion of the semiconductor layer SL1 interposed between the pair of trenches T1 and T2 in the first region AR1 and is an n-type semiconductor region made of silicon (Si) into which an n-type impurity such as, for example, phosphorus (P) or arsenic (As) has been diffused. As the $n^{++}$ emitter region 8, two $n^{++}$ emitter regions 8a and 8b are formed. The $n^{++}$ emitter region 8a is in contact with all of the emitter electrode 12 (the emitter electrode 12a), the gate insulating film 6a, and the $p^+$ channel region 7. The $n^{++}$ emitter region 8b is in contact with all of the emitter electrode 12 (the emitter electrode 12a), the gate insulating film 6b, and the $p^+$ channel region 7. The impurity concentration of the $n^{++}$ emitter region 8 (the $n^{++}$ emitter regions 8a and 8b) is higher than the impurity concentration of the $n^{--}$ drift region 1 and can be, for example, about from $1\times10^{18}$ to $5\times10^{20}$ cm$^{-3}$.

The $p^-$ channel region 9 is formed in a portion of the semiconductor layer SL1 interposed between the pair of trenches T3 and T4 in the second region AR2 and is a p-type semiconductor region made of silicon (Si) into which a p-type impurity such as, for example, boron (B) has been diffused. The p⁻ channel region 9 is in contact with all of the p⁺⁺ emitter region 4b, the gate insulating films 6c and 6d, and the n⁻⁻ drift region 1. The impurity concentration of the p⁻ channel region 9 is lower than the impurity concentration of the p⁺ channel region 7 and can be, for example, about from $1 \times 10^{15}$ to $5 \times 10^{16}$ cm⁻³.

The p⁺⁺ emitter region 4a, the pair of gate electrodes 5a and 5b, the pair of gate insulating films 6a and 6b, the p⁺ channel region 7, and the n⁺⁺ emitter regions 8a and 8b constitute the first transistor TR1. The first transistor TR1 is a MISFET including the pair of gate electrodes 5a and 5b, the pair of gate insulating films 6a and 6b, and the p⁺ channel region 7.

The p⁺⁺ emitter region 4b, the pair of gate electrodes 5c and 5d, the pair of gate insulating films 6c and 6d, and the p⁻ channel region 9 constitute the second transistor TR2. The second transistor TR2 is a MISFET including the pair of gate electrodes 5c and 5d, the pair of gate insulating films 6c and 6d, and the p⁻ channel region 9.

As shown in the perspective view of FIG. 2, the trenches T1, T2, T3, and T4 are formed along one direction, that is, the Y-axis direction in FIG. 2. As a result, the p⁺⁺ emitter region 4 (the p⁺⁺ emitter region 4a), the p⁺ channel region 7, and the n⁺⁺ emitter region 8 (the n⁺⁺ emitter regions 8a and 8b), which are formed between the pair of trenches T1 and T2, are formed along the Y-axis direction in FIG. 2. Moreover, the p⁺⁺ emitter region 4 (the p⁺⁺ emitter region 4b) and the p⁻ channel region 9, which are formed between the pair of trenches T3 and T4, are formed along the Y-axis direction in FIG. 2. Further, the gate electrode 5 (the gate electrodes 5a, 5b, 5c, and 5d) and the gate insulating film 6 (the gate insulating films 6a, 6b, 6c, and 6d), which are formed in the interiors of the trenches T1, T2, T3, and T4, are also formed along the Y-axis direction in FIG. 2.

The p-well region 10 is formed in the semiconductor layer SL1 in the third region AR3 and is a p-type semiconductor region made of silicon (Si) into which a p-type impurity such as, for example, boron (B) has been diffused. The p-well region 10 facilitates the movement of holes toward the first transistor TR1 or the second transistor TR2. The impurity concentration of the p-well region 10 can be, for example, about from $5 \times 10^{16}$ to $1 \times 10^{18}$ cm⁻³.

The interlayer insulating film 11 is an insulating film formed on the upper surface side of the semiconductor layer SL1. Contact holes CH1 and CH2 are formed in portions of the interlayer insulating film 11 located on the p⁺⁺ emitter region 4 in the plan view. Specifically, the contact hole CH1 is formed in a portion of the interlayer insulating film 11 located on the p⁺⁺ emitter region 4a in the first region AR1. The contact hole CH2 is formed in a portion of the interlayer insulating film 11 located on the p⁺⁺ emitter region 4b in the second region AR2. As the interlayer insulating film 11, for example, a silicon oxide film can be used.

The emitter electrode 12 is an electrode formed so as to cover the upper surface of the interlayer insulating film 11 and fill the contact holes CH1 and CH2. The emitter electrode 12 is electrically connected with the p⁺⁺ emitter region 4 and the n⁺⁺ emitter region 8, which constitute the first transistor TR1, and is electrically connected with the p⁺⁺ emitter region 4 and the p⁻ channel region 9, which constitute the second transistor TR2.

A portion of the emitter electrode 12 formed in the first region AR1 so as to fill the contact hole CH1 is defined as the emitter electrode 12a, and a portion of the emitter electrode 12 formed in the second region AR2 so as to fill the contact hole CH2 is defined as the emitter electrode 12b. In this case, the emitter electrode 12a is electrically connected with the p⁺⁺ emitter region 4a and the n⁺⁺ emitter regions 8a and 8b in the first region AR1, and the emitter electrode 12b is electrically connected with the p⁺⁺ emitter region 4b and the p⁻ channel region 9 in the second region AR2.

As the emitter electrode 12 (the emitter electrodes 12a and 12b), a stacked conductor film in which a barrier conductor film made of, for example, a titanium tungsten (TiW) film and a conductor film made of, for example, an aluminum (Al) film are stacked can be used. By the use of the stacked conductor film, the p⁺⁺ emitter regions 4a and 4b, the n⁺⁺ emitter regions 8a and 8b, and the p⁻ channel region 9 can be electrically connected with the emitter electrode 12 at a low resistance.

A recess CC1 is formed in the semiconductor layer SL1 at the same position as the contact hole CH1 in the plan view, and the emitter electrode 12a is formed so as to fill the recess CC1 and the contact hole CH1. A recess CC2 is formed in the semiconductor layer SL1 at the same position as the contact hole CH2 in the plan view, and the emitter electrode 12b is formed so as to fill the recess CC2 and the contact hole CH2.

The collector electrode 13 is an electrode formed on the lower surface side of the p⁺ collector region 3. The collector electrode 13 is electrically connected with the p⁺ collector region 3. As the collector electrode 13, a conductor film made of a metal such as aluminum (Al) or an alloy such as aluminum silicon (AlSi) can be used. By the use of the conductor film, the collector electrode 13 and the p⁺ collector region 3 can be electrically connected at a low resistance.

The hole extraction region 14 is formed in contact with the p⁻ channel region 9 within the n⁻⁻ drift region 1 below the p⁻ channel region 9 constituting the second transistor TR2 in the second region AR2. The hole extraction region 14 is a p-type semiconductor region made of silicon (Si) into which a p-type impurity such as, for example, boron (B) has been diffused. Due to the formation of the hole extraction region 14, when the first transistor TR1 and the second transistor TR2 are switched from an on-state to an off-state, a current composed of holes flows from the n⁻⁻ drift region 1 through the hole extraction region 14 and the p⁻ channel region 9 to the p⁺⁺ emitter region 4b. Hence, when the first transistor TR1 and the second transistor TR2 are switched from the on-state to the off-state, holes that are accumulated at a high concentration in the n⁻⁻ drift region 1 can be effectively discharged to the emitter electrode 12 side.

The impurity concentration of the hole extraction region 14 is relatively low, and when the impurity concentration of the hole extraction region 14 is $N_d$ (cm⁻³), it is preferable to satisfy the following formula (1).

$$N_d < 2 \times 10^{16} cm^{-3} \tag{1}$$

When the impurity concentration $N_d$ of the hole extraction region 14 is $2 \times 10^{16}$ cm⁻³ or more, there is a risk that the withstand voltage of the IGBT 50, that is, the breakdown voltage, may decrease because the electrical resistivity of the hole extraction region 14 decreases.

Moreover, when the length of the hole extraction region 14 in the vertical direction, that is, in a direction from the collector electrode 13 toward the emitter electrode 12, is L (μm), it is preferable to satisfy the following formula (2).

$$L > 3 \ \mu m \tag{2}$$

In the case where the length L of the hole extraction region 14 in the vertical direction is 3 μm or less, there is a risk that the effect of discharging the holes accumulated at a high concentration in the n⁻⁻ drift region 1 to the emitter electrode 12 side may be reduced when the first transistor TR1 and the second transistor TR2 are switched from the on-state to the off-state.

On the other hand, when a power supply voltage to be applied to the second transistor TR2 is $V_{cc}$ (V), it is preferable to satisfy the following formula (3).

$$L < 8 \times 10^{-2} \times V_{cc} \tag{3}$$

The formula (3) is derived as follows.

A breakdown electric field in the vertical direction of the $n^{--}$ drift region 1 is $E_{max}$ (V/μm); a voltage to be applied in the vertical direction of the $n^{--}$ drift region 1 when an electric field in the $n^{--}$ drift region 1 is equal to the breakdown electric field $E_{max}$ is $V_{max}$ (V); and the length of the $n^{--}$ drift region 1 in the vertical direction, that is, the thickness of the $n^{--}$ drift region 1, is $L_0$ (μm) (see FIGS. 1 and 2). In this case, the breakdown electric field $E_{max}$, the voltage $V_{max}$, and the thickness $L_0$ are in the relationship represented by the following formula (4).

$$L_0 = V_{max} / E_{max} \tag{4}$$

Moreover, when a maximum ratio of the length L (μm) of the hole extraction region 14 to the thickness $L_0$ (μm) of the $n^{--}$ drift region 1 is $R_{max}$, the thickness $L_0$, the maximum ratio $R_{max}$, and the length L are in the relationship represented by the following formula (5).

$$L < R_{max} \times L_0 \tag{5}$$

Then, the formula (4) is substituted for $L_0$ in the formula (5), where the maximum ratio $R_{mg}$ is 0.4, the voltage $V_{max}$ is twice the power supply voltage $V_{cc}$, and the breakdown electric field $E_{max}$ is 10 V/μm with the dielectric breakdown voltage of silicon taken into account, so that the formula (3) is derived.

Moreover, when the width of the hole extraction region 14 in the gate length direction of the second transistor TR2 is $W_D$ (μm) (see FIG. 13 described later), and the arrangement pitch of a transistor pair composed of the first transistor TR1 and the second transistor TR2 is $P_0$ (μm), the width $W_D$ and the arrangement pitch $P_0$ preferably satisfy the following formula (6).

$$W_D < 0.1 \times P_0 \tag{6}$$

When the width $W_D$ of the hole extraction region 14 is 0.1 times or more the arrangement pitch $P_0$, there is a risk that the withstand voltage of the IGBT 50, that is, the breakdown voltage, may decrease because the proportion of the hole extraction region 14 having a low electrical resistivity increases with respect to the $n^{--}$ drift region 1.

In Embodiment 1, the first transistor TR1 and the second transistor TR2 are adjacent to each other along one direction, that is, the Y-axis direction in FIG. 2.

In the IGBT 50 as shown in FIG. 2, first transistors TR11 and TR12 are formed as the first transistor TR1, and second transistors TR21 and TR22 are formed as the second transistor TR2. Along the Y-axis direction in FIG. 2, the first transistor TR11 and the second transistor TR22 are adjacent to each other, and the first transistor TR12 and the second transistor TR21 are adjacent to each other.

Trenches T11 and T21 are formed as the pair of trenches T1 and T2 in the first transistor TR11, and trenches T31 and T41 are formed as the pair of trenches T3 and T4 in the second transistor TR21. Trenches T12 and T22 are formed as the pair of trenches T1 and T2 in the first transistor TR12, and trenches T32 and T42 are formed as the pair of trenches T3 and T4 in the second transistor TR22. The pair of trenches T32 and T42 are formed continuously with the pair of trenches T11 and T21, respectively, along the Y-axis direction in FIG. 2. The pair of trenches T12 and T22 are formed continuously with the pair of trenches T31 and T41, respectively, along the Y-axis direction in FIG. 2.

As a result, as shown in FIG. 2, the $p^{++}$ emitter region 4b in the second transistor TR22 is formed continuously with the $p^{++}$ emitter region 4a in the first transistor TR11 along the Y-axis direction in FIG. 2. Moreover, the gate electrodes 5c and 5d in the second transistor TR22 are formed continuously with the gate electrodes 5a and 5b, respectively, in the first transistor TR11 along the Y-axis direction in FIG. 2. On the other hand, the gate insulating films 6c and 6d in the second transistor TR22 are formed continuously with the gate insulating films 6a and 6b, respectively, in the first transistor TR11 along the Y-axis direction in FIG. 2. Moreover, the $p^-$ channel region 9 in the second transistor TR22 is formed adjacent to the $p^+$ channel region 7 and the $n^{++}$ emitter regions 8a and 8b in the first transistor TR11 along the Y-axis direction in FIG. 2.

The adjacent positional relationship along the Y-axis direction in FIG. 2 between the first transistor TR12 and the second transistor TR21 is similar to the above-described adjacent positional relationship along the Y-axis direction in FIG. 2 between the first transistor TR11 and the second transistor TR22.

With the configuration described above, a gate voltage to be applied to the gate electrodes 5a and 5b of the first transistor TR1 and a gate voltage to be applied to the gate electrodes 5c and 5d of the second transistor TR2 can be collectively controlled.

Hereinafter, in the specification of the application, a spacing W1 between the pair of trenches T1 and T2, in the plan view, in the interiors of which the gate insulating films 6a and 6b and the gate electrodes 5a and 5b are formed is defined as the gate-to-gate distance of the first transistor TR1. Moreover, a spacing W2 between the pair of trenches T3 and T4, in the plan view, in the interiors of which the gate insulating films 6c and 6d and the gate electrodes 5c and 5d are formed is defined as the gate-to-gate distance of the second transistor TR2.

In Embodiment 1, when the gate-to-gate distance W2 of the second transistor TR2 is W (m), the impurity concentration of the $p^-$ channel region 9 is $N_a$ (cm$^{-3}$), the elementary charge of electron and hole is q (C), the permittivity of the $p^-$ channel region 9 is $\in$ (F/m), and the band gap of the $p^-$ channel region 9 is V (eV), it is preferable to satisfy the following formula (7).

$$W < 2 \times 10^{-3} \times (2V \in /(qN_a))^{1/2} \tag{7}$$

Specifically, when the $p^-$ channel region 9 is made of silicon (Si), and the permittivity of silicon (Si) is $\in_{si}$ (F/m), it is preferable to perform ion implantation in a manner such that the impurity concentration $N_a$ of the $p^-$ channel region 9 satisfies the following formula (8).

$$W < 2 \times 10^{-3} \times (2 \in_{si} /(qN_a))^{1/2} \tag{8}$$

Moreover, in Embodiment 1, the trenches T32 and T42 of the second transistor TR22 are formed continuously with the trenches T11 and T21, respectively, of the first transistor TR11 along the Y-axis direction in FIG. 2 as described above. Moreover, the trenches 112 and T22 of the first transistor TR12 are formed continuously with the trenches T31 and T41, respectively, of the second transistor TR21 along the Y-axis direction in FIG. 2. As a result, the spacing W1, which is a spacing between the pair of trenches T11 and T21 and a spacing between the pair of trenches T12 and T22, is equal to the spacing W2, which is a spacing between the pair of trenches T31 and T41 and a spacing between the pair of trenches T32 and T42.

The spacing between the pair of trenches T11 and T21 and the spacing between the pair of trenches T12 and T22 are equal to a spacing between the gate insulating films 6a and 6b, that is, the width of the $p^+$ channel region 7. Hence, when the thickness of the gate insulating films 6a and 6b is small compared to the width of the $p^+$ channel region 7, the gate-to-gate distance W1 in the first transistor TR1 is substantially equal to a spacing between the gate electrodes 5a and 5b.

Moreover, a spacing between the pair of trenches T31 and T41 and a spacing between the pair of trenches T32 and T42 are equal to a spacing between the gate insulating films 6c and 6d, that is, the width of the $p^-$ channel region 9. Hence, when the thickness of the gate insulating films 6c and 6d is small compared to the width of the $p^-$ channel region 9, the gate-to-gate distance W2 in the second transistor TR2 is substantially equal to a spacing between the gate electrodes 5c and 5d.

In Embodiment 1, since the second transistor TR2 is formed continuously with the first transistor TR1 along the Y-axis direction in FIG. 2, the hole extraction region 14, which is formed in contact only with the second transistor TR2, is not formed continuously along the Y-axis direction in FIG. 2.

<Operation of Semiconductor Device>

Subsequently, the operation of the IGBT 50 as the semiconductor device of Embodiment 1 will be described.

Figure 3:
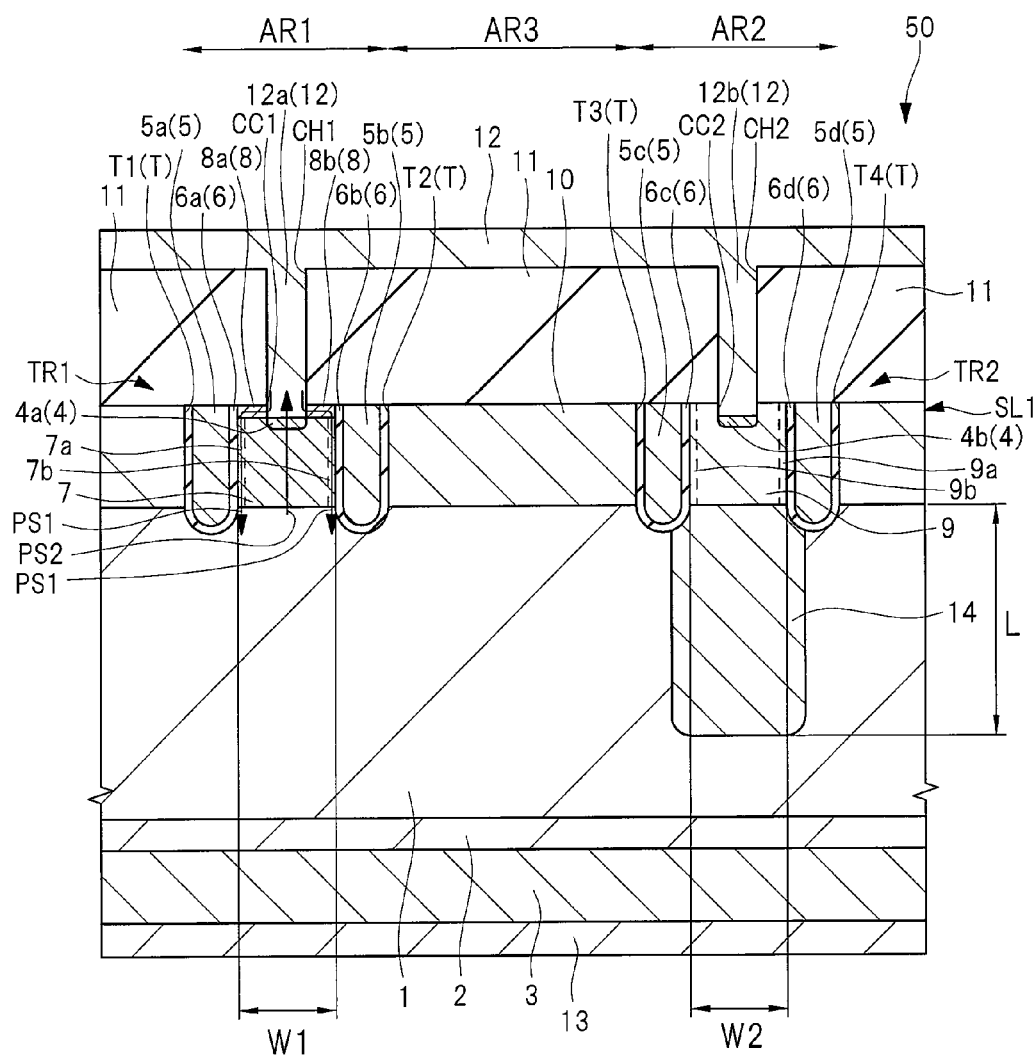
FIG. 3 is a diagram schematically showing paths through which charges flow when an IGBT is in an on-state in FIG. 1.
Figure 4:
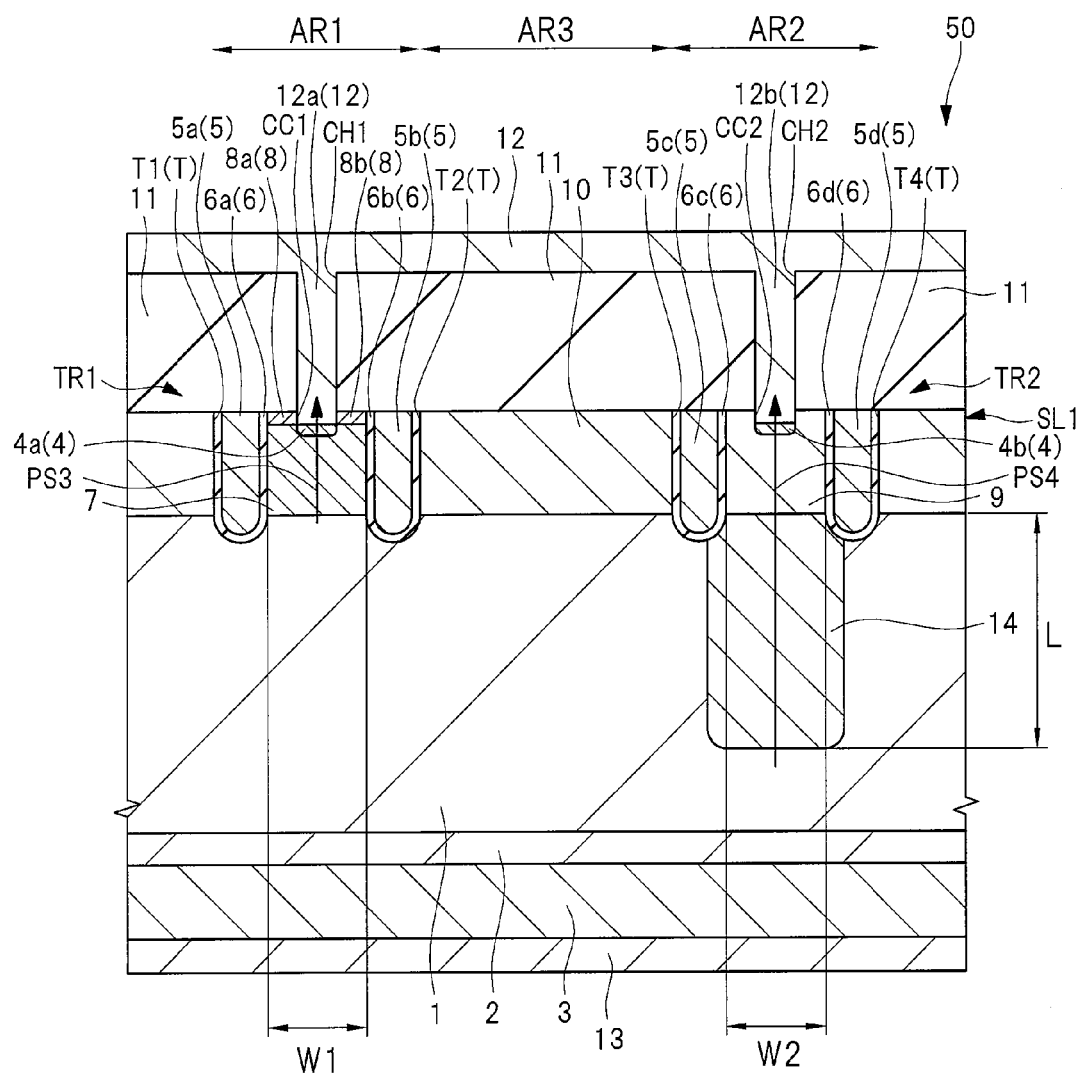
FIG. 4 is a diagram schematically showing paths through which charges flow when the IGBT is switched from the on-state to an off-state in FIG. 1.

FIG. 3 is a diagram schematically showing paths through which charges flow when the IGBT is in the on-state in FIG. 1. FIG. 4 is a diagram schematically showing paths through which charges flow when the IGBT is switched from the on-state to the off-state in FIG. 1.

First, an on-operation to bring the IGBT 50 into the on-state will be described.

A predetermined voltage, that is, a collector voltage Vc, is first applied to the collector electrode 13 so that the potential of the collector electrode 13 becomes a predetermined positive potential relative to the potential of the emitter electrode 12. Specifically, in a state where, for example, the emitter electrode 12 is grounded, the collector voltage Vc is applied to the collector electrode 13. Due to this, holes are injected from the collector electrode 13 through the $p^+$ collector region 3 and the $n^+$ buffer region 2 into the $n^{--}$ drift region 1.

In this state, a predetermined voltage is applied to the gate electrodes 5a, 5b, 5c, and 5d so that the potential of the gate electrodes 5a, 5b, 5c, and 5d becomes a predetermined positive potential relative to the emitter electrode 12. Specifically, in the state where, for example, the emitter electrode 12 is grounded, a gate voltage Vg1 is applied to the gate electrodes 5a, 5b, 5c, and 5d. The gate voltage Vg1 is a voltage to bring the first transistor TR1 and the second transistor TR2 into the on-state, and is, for example, a voltage higher than both the threshold voltage of the first transistor TR1 and the threshold voltage of the second transistor TR2.

In the first transistor TR1, the gate voltage Vg1 is applied to the gate electrodes 5a and 5b, so that a state where inversion layers 7a and 7b are formed in regions of the $p^+$ channel region 7 in contact with the gate insulating films 6a and 6b, that is, the on-state, is established. In this case, the state where the inversion layers 7a and 7b are formed is established in regions of the $p^+$ channel region 7, which are, for example, about 10 nm from the gate insulating films 6a and 6b. Then, electrons from the emitter electrode 12a are injected, that is, flow through the $n^{++}$ emitter regions 8a and 8b and the formed inversion layers 7a and 7b into the $n^{--}$ drift region 1 as shown as paths PS1 in FIG. 3.

As described above, since the collector voltage Vc is applied to the collector electrode 13, holes are injected from the collector electrode 13 into the $n^{--}$ drift region 1. As a result, the electrons injected from the emitter electrode 12a into the $n^{--}$ drift region 1 and the holes injected from the collector electrode 13 into the region 1 are attracted to each other due to Coulomb attraction in the $n^{--}$ drift region 1, and therefore, an excess charge of, for example, $1 \times 10^{16}$ cm$^{-3}$ or more is accumulated in the $n^{--}$ drift region 1. Since the resistance value of the $n^{--}$ drift region 1 is reduced by this excess accumulation effect, a high on-current can flow through the IGBT. That is, the IGBT 50 is brought into the on-state.

In the first transistor TR1, when the state where the inversion layers 7a and 7b are formed in the regions of the $p^+$ channel region 7 in contact with the gate insulating films 6a and 6b, that is, the on-state, is established, a depletion layer (not shown) is formed in regions of the $p^+$ channel region 7 some distance from the gate insulating films 6a and 6b. Therefore, the holes from the $n^{--}$ drift region 1 are discharged, that is, flows out to the emitter electrode 12a through a portion of the $p^+$ channel region 7 other than the inversion layers 7a and 7b and the depletion layers (not shown), that is, a center-side portion, as shown as a path PS2 in FIG. 3.

On the other hand, also in the second transistor TR2, the gate voltage Vg1 is applied to the gate electrodes 5c and 5d, so that a state where inversion layers 9a and 9b are formed in regions of the $p^-$ channel region 9 in contact with the gate insulating films 6c and 6d, that is, the on-state, is established. However, unlike the first transistor TR1, the $n^{++}$ emitter regions 8a and 8b are not formed in the second transistor TR2, and the emitter electrode 12b and the inversion layers 9a and 9b are spaced apart from each other. Therefore, electrons from the emitter electrode 12b are not injected into the $n^{--}$ drift region 1.

Also in the second transistor TR2, when the state where the inversion layers 9a and 9b are formed in the regions of the $p^-$ channel region 9 in contact with the gate insulating films 6c and 6d, that is, the on-state, is established, a depletion layer (not shown) is formed in regions of the $p^-$ channel region 9 some distance from the gate insulating films 6c and 6d.

In the specification of the application as described above, the expression "first transistor TR1 is in the on-state" means the state where the inversion layers 7a and 7b are formed in the $p^+$ channel region 7. Moreover, the expression "first transistor TR1 is in the off-state" means a state where the inversion layers 7a and 7b disappear in the $p^+$ channel region 7. On the other hand, the expression "second transistor TR2 is in the on-state" means the state where the inversion layers 9a and 9b are formed in the $p^-$ channel region 9. Moreover, the expression "second transistor TR2 is in the off-state" means a state where the inversion layers 9a and 9b disappear in the $p^-$ channel region 9.

Here, a width $L_D$ of the depletion layer when the depletion layer is formed is represented by the following formula (9).

$$L_D = 10^{-3} \times (2 \in_{si} V/(qN_a))^{1/2} \qquad (9)$$

In the formula (6), $N_a$ cm$^{-3}$) is the impurity concentration of the $p^-$ channel region 9, q (C) is the elementary charge of electron and hole, and $\in_{si}$ (F/m) is the permittivity of silicon (Si). Moreover, at interfaces of the $p^-$ channel region 9 with the gate insulating films 6c and 6d, an energy band is bent to such an extent that is necessary for forming the inversion layer, and the amount of bending of this energy band is V (eV).

Here, the amount V of bending of the energy band corresponds to the band gap of the p⁻ channel region 9. For this reason, V is the band gap in the formula (7). Besides, the amount V of bending of the energy band in the formula (9) is an amount of about 1 eV corresponding to the band gap V of silicon (Si). Hence, the width $L_D$ of the depletion layer formed at the interface of the p⁻ channel region 9 with one of the gate insulating films 6c and 6d is represented by the following formula (10), which is obtained by setting V=1 eV in the formula (9).

$$L_D = 10^{-3} \times (2 \in_{si}/(qN_a))^{1/2} \quad (10)$$

Then, if the gate-to-gate distance W2 of the second transistor TR2 is W (m), when the gate-to-gate distance W is smaller than the sum of the widths $L_D$ of the depletion layers formed at the interfaces of the p⁻ channel region 9 with the gate insulating films 6c and 6d, that is, when the gate-to-gate distance W satisfies the following formula (11), the entire p⁻ channel region 9 is depleted.

$$W < 2L_D \quad (11)$$

The formula (8) is obtained by combining the formula (11) and the formula (10). Hence, in the case where the relationship represented by the formula (8) is satisfied, the entire p⁻ channel region 9 is depleted when the second transistor TR2 is in the on-state. Therefore, the holes in the n⁻⁻ drift region 1 can be prevented from being discharged to the emitter electrode 12b through the p⁻ channel region 9. As a result, even when the second transistor TR2 is formed, the characteristics of the IGBT in the on-state can be the same as those when the second transistor TR2 is not formed.

In the formula (8), when, for example, $N_a = 10^{16}$ (cm⁻³), $q = 1.6 \times 10^{-19}$ (C), and $\in_{si} = 10.4 \times 10^{-10}$ (F/m), the gate-to-gate distance W is less than 0.72 μm.

Even in the case where the gate-to-gate distances W1 and W2 are equal to each other and the formula (8) is satisfied when the gate-to-gate distance W2 is W, if the impurity concentration $N_a$ in the p⁺ channel region 7 is sufficiently higher than the impurity concentration $N_a$ in the p⁻ channel region 9, the formula (8) is not satisfied when the gate-to-gate distance W1 is W. That is, if the impurity concentration $N_a$ in the p⁺ channel region 7 is sufficiently higher than the impurity concentration $N_a$ in the p⁻ channel region 9, even in the case where the gate-to-gate distances W1 and W2 are equal to each other, the entire p⁺ channel region 7 is not depleted when the first transistor TR1 is in the on-state. Hence, when the first transistor TR1 is in the on-state, the holes in the n⁻⁻ drift region 1 are discharged to the emitter electrode 12a through the p⁺ channel region 7.

That is, in a state where the collector voltage is applied to the collector electrode 13, when the first transistor TR1 and the second transistor TR2 are in the on-state, a current composed of holes as charges of positive polarity and electrons as charges of negative polarity opposite to positive polarity flows from the collector electrode 13 through the first transistor TR1 to the emitter electrode 12a. However, the current does not flow through the second transistor TR2.

Next, operation to switch the IGBT 50 from the on-state to the off-state will be described.

In the state where a predetermined voltage, that is, the collector voltage Vc, is applied to the collector electrode 13, the application of the gate voltage Vg1 to the gate electrodes 5a, 5b, 5c, and 5d is stopped. Specifically, in the state where, for example, the emitter electrode 12 is grounded, a gate voltage Vg2 to switch the first transistor TR1 and the second transistor TR2 from the on-state to the off-state is applied to the gate electrodes 5a, 5b, 5c, and 5d, or the gate electrodes 5a, 5b, 5c, and 5d are grounded. The gate voltage Vg2 is, for example, a voltage lower than both the threshold voltage of the first transistor TR1 and the threshold voltage of the second transistor TR2.

In the first transistor TR1, the application of the gate voltage Vg1 to the gate electrodes 5a and 5b is stopped, so that the inversion layers 7a and 7b formed in the p⁺ channel region 7 in the on-state disappear, and the injection of electrons from the emitter electrode 12a to the n⁻⁻ drift region 1 is stopped. Moreover, the holes excessively accumulated in the n⁻⁻ drift region 1 in the on-state are discharged to the emitter electrode 12a through the p⁺ channel region 7 as shown as a path PS3 in FIG. 4. However, electrons cannot flow through the p⁺ channel region 7.

On the other hand, the application of the gate voltage Vg1 to the gate electrodes 5c and 5d is stopped also in the second transistor TR2, so that the inversion layers 9a and 9b and the depletion layers (not shown) formed in the p⁻ channel region 9 in the on-state disappear. Moreover, the holes excessively accumulated in the n⁻⁻ drift region 1 in the on-state are discharged also to the emitter electrode 12b through the p⁻ channel region 9 as shown as a path PS4 in FIG. 4. However, electrons cannot flow through the p⁻ channel region 9.

That is, when the first transistor TR1 and the second transistor TR2 are switched from the on-state to the off-state, a current composed of holes flows from the n⁻⁻ drift region 1 through the first transistor TR1 and the second transistor TR2 to the emitter electrodes 12a and 12b.

Further, in Embodiment 1, the hole extraction region 14 is formed in contact with the p⁻ channel region 9 within the n⁻⁻ drift region 1 below the p⁻ channel region 9 constituting the second transistor TR2 in the second region AR2. Due to this, when the first transistor TR1 and the second transistor TR2 are switched from the on-state to the off-state, the current composed of holes flows from the n⁻⁻ drift region 1 through the hole extraction region 14 and the p⁻ channel region 9 to the p⁺⁺ emitter region 4b as shown as a path PS4 in FIG. 4. That is, when the first transistor TR1 and the second transistor TR2 are switched from the on-state to the off-state, the current composed of holes flows from the n⁻⁻ drift region 1 through the hole extraction region 14 and the second transistor TR2 to the emitter electrode 12b. Hence, when the first transistor TR1 and the second transistor TR2 are switched from the on-state to the off-state, the holes accumulated at a high concentration in the n⁻⁻ drift region 1 can be effectively discharged to the emitter electrode 12 side.

<Manufacturing Process of Semiconductor Device>

Next, an example of a manufacturing process of the semiconductor device of Embodiment 1 will be described with reference to the drawings. FIGS. 5 to 22 are cross-sectional views of the main portion of the semiconductor device of Embodiment 1 during the manufacturing process. In FIGS. 5 to 22, the first region AR1 indicates a region where the first transistor TR1 (see FIG. 17) is formed, the second region AR2 indicates a region where the second transistor TR2 (see FIG. 18) is formed, and the third region AR3 indicates a region where the p-well region 10 (see FIG. 19) is formed.

First, as shown in FIGS. 5 to 8, the semiconductor substrate 3S including the n⁻⁻ drift region 1 and the hole extraction region 14 formed in an upper surface-side portion of the n⁻⁻ drift region 1 in the second region AR2 on the upper surface side of the n⁻⁻ drift region 1 is prepared.

Figure 5:
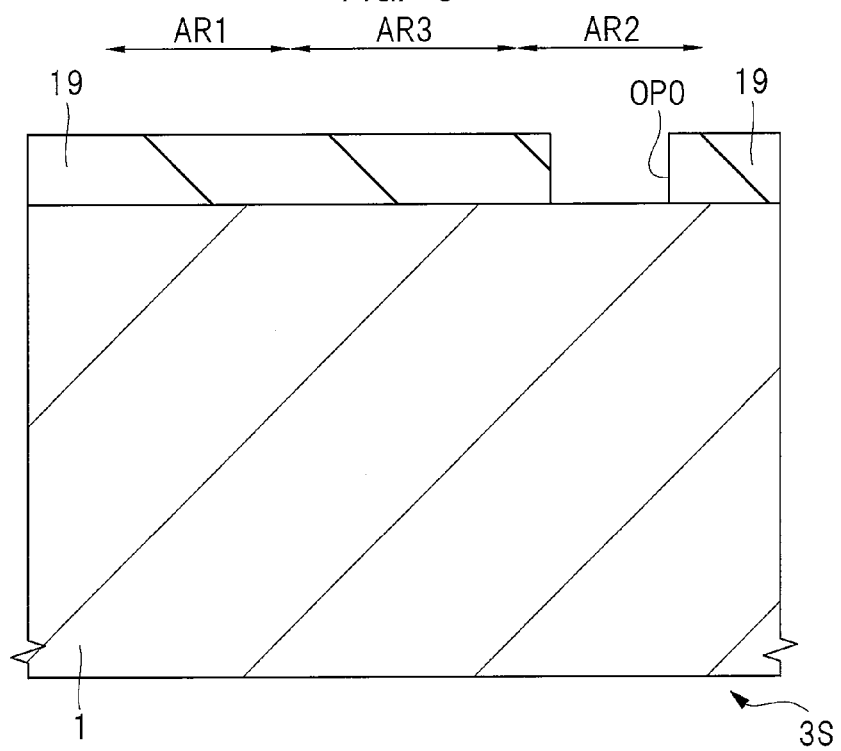
FIG. 5 is a cross-sectional view of the main portion of the semiconductor device of Embodiment 1 during a manufacturing process.

In this step of preparing the semiconductor substrate 3S, the semiconductor substrate 3S made of an n-type silicon (Si) substrate into which an n-type impurity such as, for example, phosphorus (P) has been introduced is first prepared as shown in FIG. 5. The semiconductor substrate 3S is a portion serving as the n⁻⁻ drift region 1. That is, the semiconductor substrate 3S includes the n⁻⁻ drift region 1.

For example, a pure silicon (Si) substrate into which an impurity is not substantially implanted is irradiated with a high energy neutron beam to convert some silicon (Si) atoms into phosphorus (P) atoms by nuclear transmutation, so that an n-type Si substrate having an impurity concentration of, for example, about $8\times10^{13}$ to $1\times10^{14}$ cm$^{-3}$ can be prepared.

Next, as shown in FIG. 5, a silicon oxide film 19 is formed. In this step of forming the silicon oxide film 19, the silicon oxide film 19 is formed on the semiconductor substrate 3S, that is, the n⁻⁻ drift region 1, as shown in FIG. 5. The silicon oxide film 19 can be formed by a wet oxidation method in a state where the substrate temperature of the semiconductor substrate 3S is maintained at, for example, about 1000° C.

Next, as shown in FIG. 5, the silicon oxide film 19 is patterned using a photolithography technique and an etching technique. The patterning of the silicon oxide film 19 is performed so as to form an opening OP0 in the silicon oxide film 19 by removing the silicon oxide film 19 in the second region AR2 as a region for forming the second transistor TR2 (see FIG. 18 described later). That is, as shown in FIG. 5, the opening OP0 is formed in the second region AR2.

Figure 6:
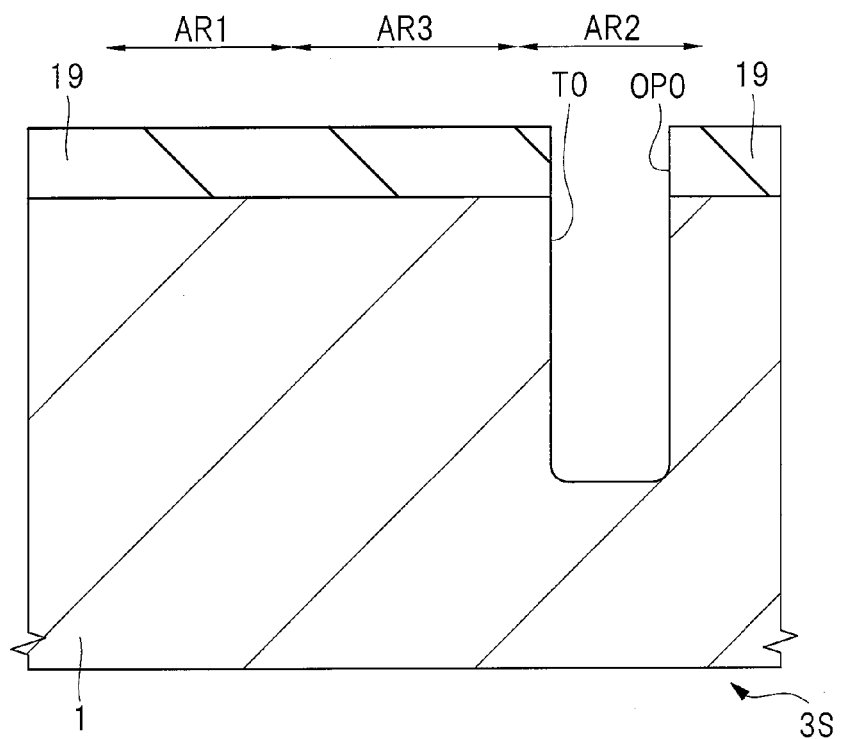
FIG. 6 is a cross-sectional view of the main portion of the semiconductor device of Embodiment 1 during the manufacturing process.

Next, as shown in FIG. 6, a trench T0 is formed. In this step of forming the trench T0, the trench T0 is formed in the semiconductor substrate 3S, that is, the n⁻⁻ drift region 1, by etching using as a mask the silicon oxide film 19 having the opening OP0 formed therein. The trench T0 is formed in an upper surface-side portion of the n⁻⁻ drift region 1 in the second region AR2.

Figure 7:
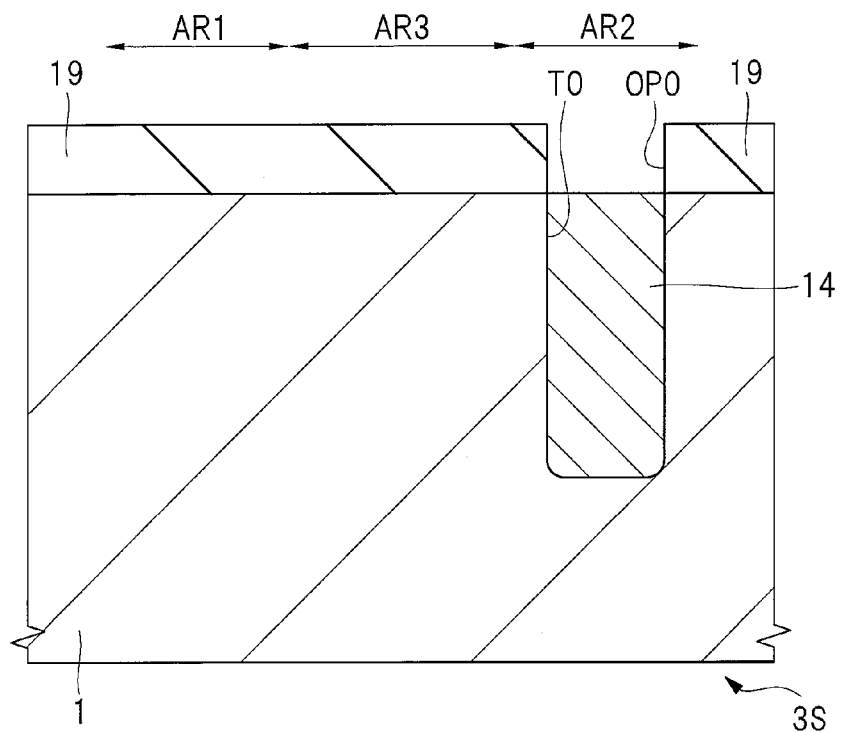
FIG. 7 is a cross-sectional view of the main portion of the semiconductor device of Embodiment 1 during the manufacturing process.

Next, as shown in FIG. 7, the hole extraction region 14 is formed in the interior of the trench T0. In this step of forming the hole extraction region 14, the hole extraction region 14 as a p-type semiconductor region made of silicon (Si) into which a p-type impurity such as, for example, boron (B) has been introduced is formed so as to be embedded in the trench T0 by selective epitaxial growth or the like.

Figure 8:
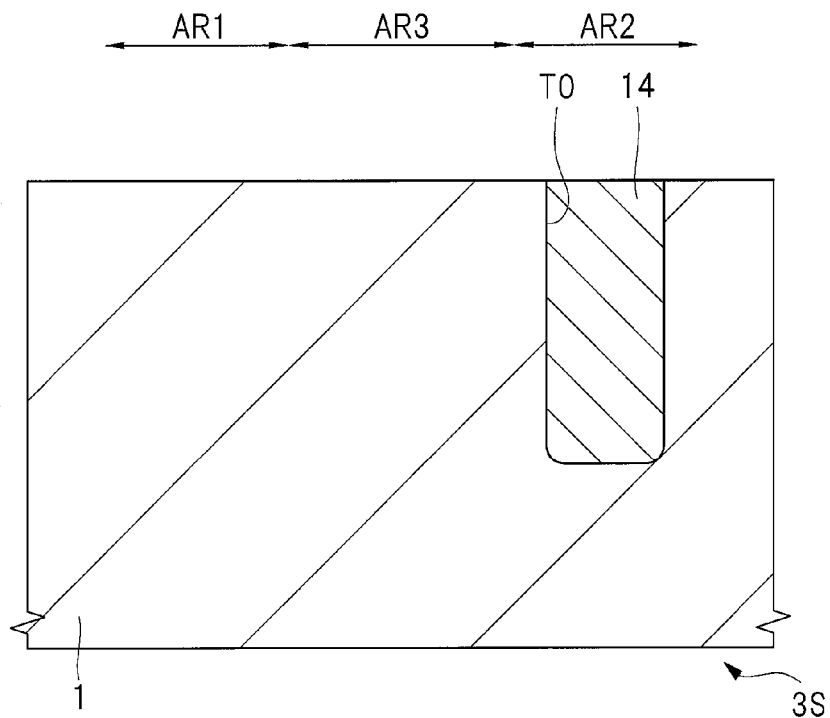
FIG. 8 is a cross-sectional view of the main portion of the semiconductor device of Embodiment 1 during the manufacturing process.

Next, as shown in FIG. 8, the silicon oxide film 19 is removed by, for example, a dry etching technique. Due to this, the semiconductor substrate 3S including the n⁻⁻ drift region 1 and the hole extraction region 14 formed in the upper surface-side portion of the n⁻⁻ drift region 1 in the second region AR2 on the upper surface side of the n⁻⁻ drift region 1 is prepared.

On the other hand, as a modified example of the method for forming the hole extraction region 14, a method shown below can also be performed.

Figure 9:
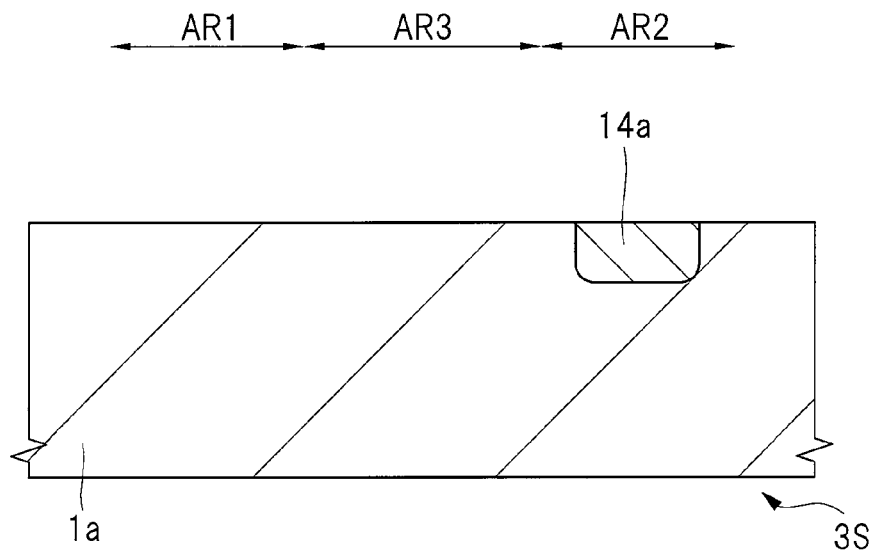
FIG. 9 is a cross-sectional view of the main portion of the semiconductor device of Embodiment 1 during the manufacturing process.

In this modified example, after a semiconductor substrate 3S including an n-type semiconductor layer 1a is prepared, a p-type impurity such as, for example, boron (B) is introduced from the upper surface side of the n-type semiconductor layer 1a into the n-type semiconductor layer 1a in the second region AR2 on the upper surface side of the n-type semiconductor layer 1a as shown in FIG. 9. Due to this, a p-type semiconductor region 14a is formed in an upper surface-side portion of the n-type semiconductor layer 1a in the second region AR2.

Figure 10:
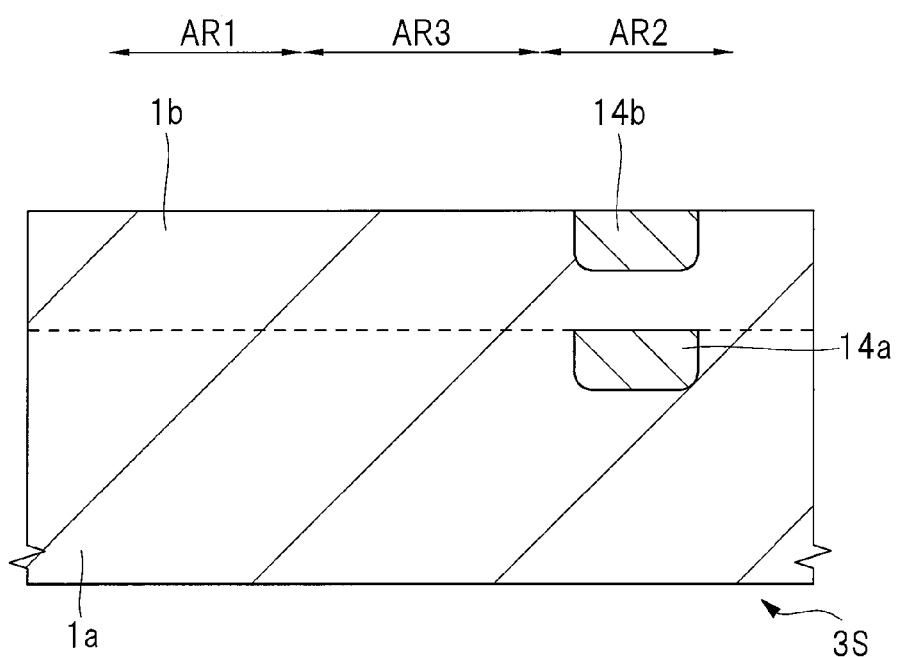
FIG. 10 is a cross-sectional view of the main portion of the semiconductor device of Embodiment 1 during the manufacturing process.

Next, as shown in FIG. 10, an n-type semiconductor layer 1b is formed by, for example, epitaxial growth on the n-type semiconductor layer 1a including the p-type semiconductor region 14a. Next, as shown in FIG. 10, a p-type impurity such as, for example, boron (B) is introduced from the upper surface side of the n-type semiconductor layer 1b into the n-type semiconductor layer 1b in the second region AR2. Due to this, a p-type semiconductor region 14b is formed in an upper surface-side portion of the n-type semiconductor layer 1b in the second region AR2.

Figure 11:
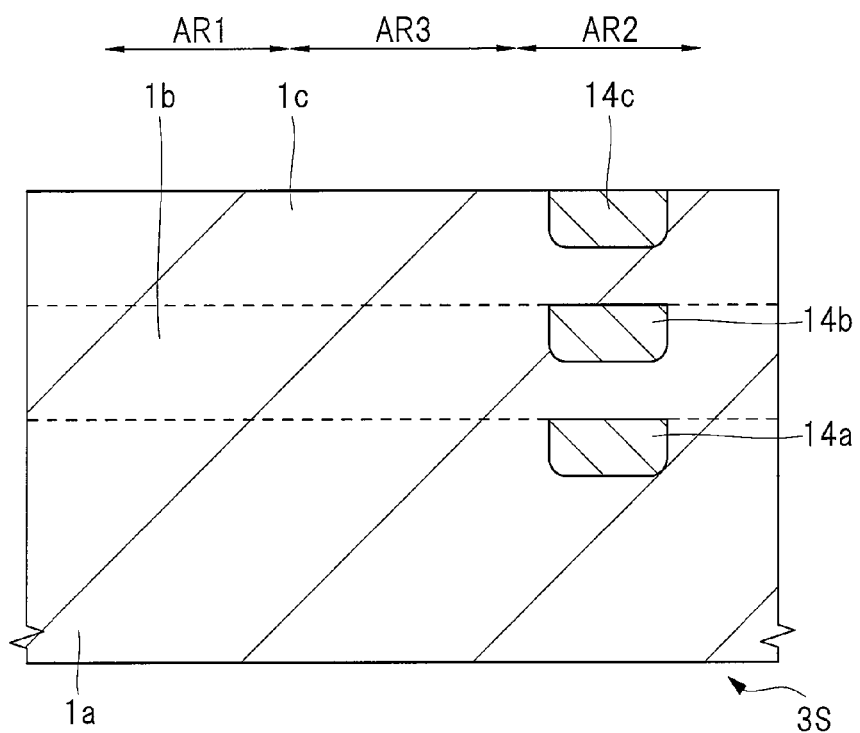
FIG. 11 is a cross-sectional view of the main portion of the semiconductor device of Embodiment 1 during the manufacturing process.

Next, as shown in FIG. 11, an n-type semiconductor layer 1c is formed by, for example, epitaxial growth on the n-type semiconductor layer 1b including the p-type semiconductor region 14b. Next, as shown in FIG. 11, a p-type impurity such as, for example, boron (B) is introduced from the upper surface side of the n-type semiconductor layer 1c into the n-type semiconductor layer 1c in the second region AR2. Due to this, a p-type semiconductor region 14c is formed in an upper surface-side portion of the n-type semiconductor layer 1c in the second region AR2.

Figure 12:
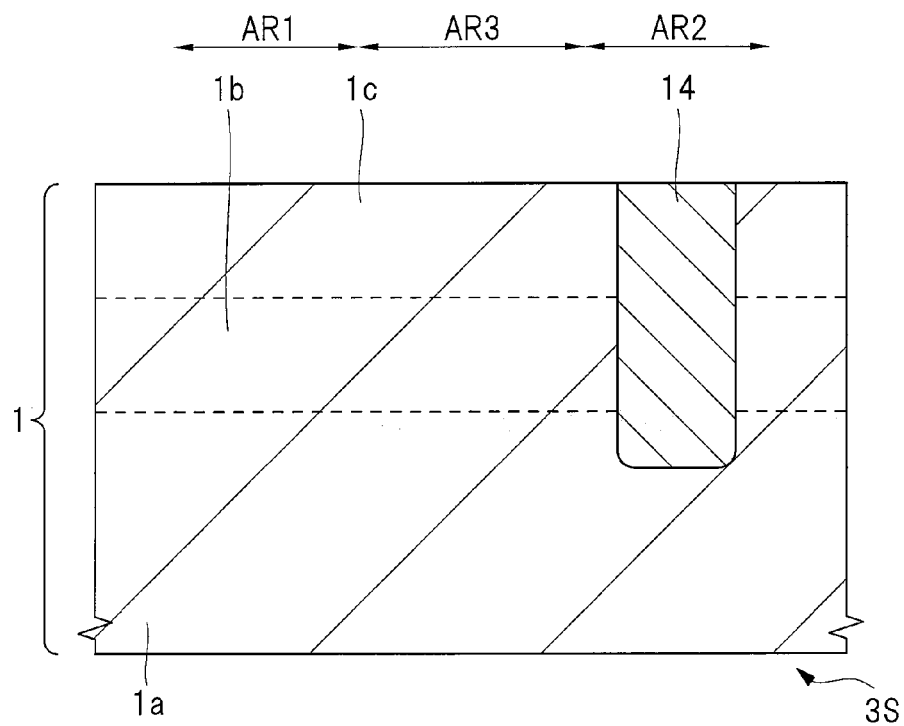
FIG. 12 is a cross-sectional view of the main portion of the semiconductor device of Embodiment 1 during the manufacturing process.

Next, as shown in FIG. 12, the semiconductor substrate 3S is subjected to a heat treatment to diffuse the p-type impurity introduced into the n-type semiconductor layer 1a, the p-type impurity introduced into the n-type semiconductor layer 1b, and the p-type impurity introduced into the n-type semiconductor layer 1c. Due to this, the hole extraction region 14 as a p-type semiconductor region is formed in the second region AR2 so as to penetrate the n-type semiconductor layer 1c and the n-type semiconductor layer 1b to reach the n-type semiconductor layer 1a. In FIG. 12, an example has been described in which two n-type semiconductor layers are formed on the n-type semiconductor layer 1a and a p-type impurity is introduced into the upper surface-side portion of each of the two semiconductor layers. However, the n-type semiconductor layer formed on the n-type semiconductor layer 1a may be a plurality of layers including three or more layers and a p-type impurity may be introduced into the upper surface-side portion of each of the plurality of semiconductor layers. In this case, the hole extraction region 14 is formed in the second region AR2 so as to penetrate the plurality of n-type semiconductor layers to reach the n-type semiconductor layer 1a.

Alternatively, besides the modified example, the hole extraction region 14 can be formed also by, after preparing the semiconductor substrate 3S including the n⁻⁻ drift region 1, performing deep high-energy ion implantation in an upper surface-side portion of the n⁻⁻ drift region 1 in the second region AR2.

In Embodiment 1, since the second transistor TR2 is formed continuously with the first transistor TR1 along the Y-axis direction in FIG. 2, the hole extraction region 14 formed in contact only with the second transistor TR2 is not formed continuously along the Y-axis direction in FIG. 2.

Figure 13:
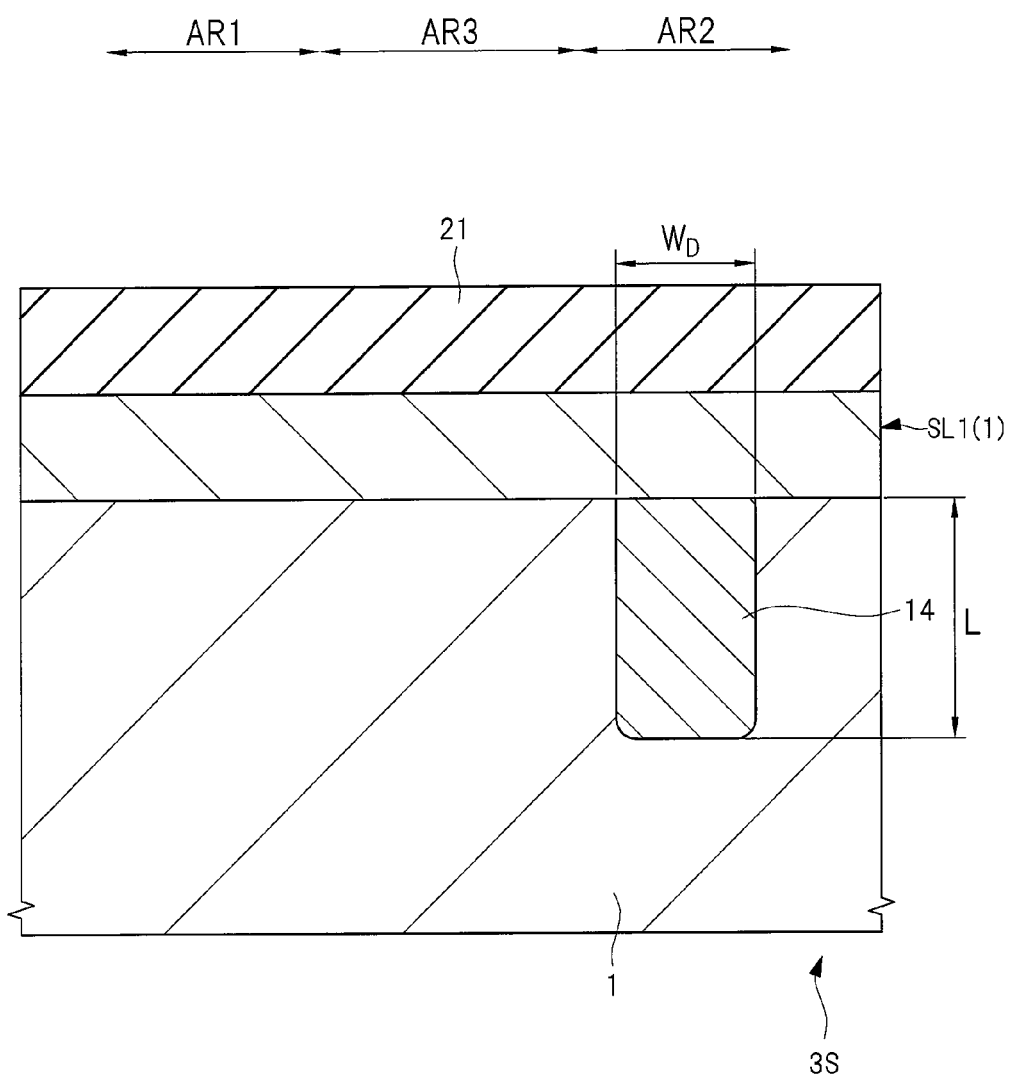
FIG. 13 is a cross-sectional view of the main portion of the semiconductor device of Embodiment 1 during the manufacturing process.

Next, as shown in FIG. 13, the semiconductor layer SL1 is formed. In this step of forming the semiconductor layer SL1, a p-type impurity such as, for example, boron (B) is introduced from the upper surface side of the semiconductor substrate 3S by, for example, an ion implantation method. Thereafter, an instantaneous annealing treatment of, for example, about several 100 μm, that is, a heat treatment, is performed on the upper surface of the semiconductor substrate 3S by, for example, a laser annealing apparatus to activate the introduced impurity. Due to this, in the first region AR1, the second region AR2, and the third region AR3, the semiconductor layer SL1 of p-type is formed in an upper surface-side portion, that is, an upper layer portion, of the n⁻⁻ drift region 1 including a portion where the hole extraction region 14 is formed in the first region AR1. In the second region AR2, the semiconductor layer SL1 is formed so as to be in contact with the hole extraction region 14. Moreover, the semiconductor layer SL1 is a portion serving as the $p^{++}$ emitter region 4, the $p^+$ channel region 7, the $n^{++}$ emitter region 8, or the $p^-$ channel region 9 as has been described with reference to FIG. 1. As described above, the thickness of the semiconductor layer SL1 can be, for example, about from 1 to 5 μm.

As shown in FIG. 13, after the semiconductor layer SL1 is formed, the hole extraction region 14 is formed in contact with the semiconductor layer SL1 within the $n^{--}$ drift region 1 in the second region AR2. Moreover, when the impurity concentration of the hole extraction region 14 is $N_d$ (cm$^{-3}$), it is preferable to satisfy the formula (1). When the length of the hole extraction region 14 in the vertical direction is L (μm) and a power supply voltage is $V_{cc}$ (V), it is preferable to satisfy the formula (2) and the formula (3). Further, when the width of the hole extraction region 14 in the gate length direction is $W_D$ (μm) and an arrangement pitch is $P_0$ (μm), it is preferable to satisfy the formula (6).

Instead of an ion implantation method and an annealing treatment (heat treatment), the semiconductor layer SL1 can be formed on the $n^{--}$ drift region 1 using, for example, an epitaxial growth method.

Next, as shown in FIG. 13, a silicon oxide film 21 is formed on the semiconductor layer SL1 of the semiconductor substrate 3S. The silicon oxide film 21 can be formed by a wet oxidation method in the state where the substrate temperature of the semiconductor substrate 3S is maintained at, for example, about 1000° C.

Figure 14:
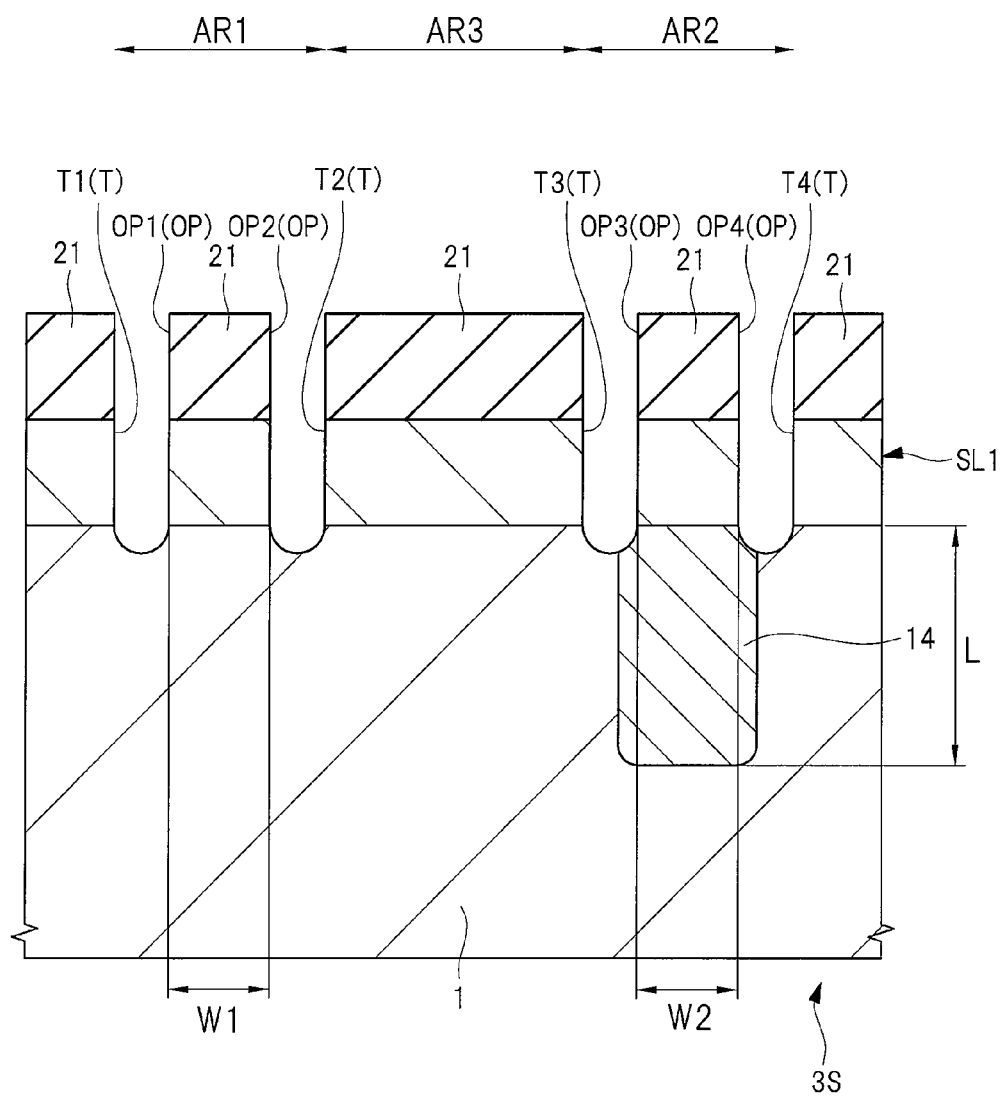
FIG. 14 is a cross-sectional view of the main portion of the semiconductor device of Embodiment 1 during the manufacturing process.

Next, as shown in FIG. 14, the silicon oxide film 21 is patterned using a photolithography technique and an etching technique. The patterning of the silicon oxide film 21 is performed so as to form an opening OP in the silicon oxide film 21 by removing the silicon oxide film 21 in a region for forming the trench T. As shown in FIG. 14, a pair of openings OP1 and OP2 are formed as the opening OP in the first region AR1, and a pair of openings OP3 and OP4 are formed as the opening OP in the second region AR2.

Next, as shown in FIG. 14, the trench T is formed in the semiconductor layer SL1 by etching using as a mask the silicon oxide film 21 having the opening OP formed therein. The trench T is formed in the first region AR1 and the second region AR2 so as to penetrate the semiconductor layer SL1 to reach the $n^{--}$ drift region 1. The pair of trenches T1 and T2 are formed spaced apart from each other as the trench T in the first region AR1, and the pair of trenches T3 and T4 are formed spaced apart from each other as the trench T in the second region AR2. Moreover, the pair of trenches T3 and T4 are formed in a manner such that the hole extraction region 14 is located between the pair of trenches T3 and T4 in the plan view.

As shown in FIG. 14, the spacing between the pair of trenches T1 and T2 is W1, and the spacing between the pair of trenches T3 and T4 is W2. In this case, it is preferable that the spacing W2 between the pair of trenches T3 and T4 satisfies the following relationship. Specifically, the spacing W2 is W (m); the impurity concentration of the $p^-$ channel region 9 (see FIG. 1) is $N_a$ (cm$^{-3}$); the elementary charge of electron and hole is q (C); the permittivity of the $p^-$ channel region 9 is $\in$ (F/m); and the band gap of the $p^-$ channel region 9 is V (eV). In this case, it is preferable to set the spacing so as to satisfy the formula (7).

Moreover, in Embodiment 1, the first transistor TR1 and the second transistor TR2 are formed, as shown in FIG. 2, so as to be adjacent along the Y-axis direction in FIG. 2. That is, in this step of forming the trench T, as shown in FIG. 2, the trenches T32 and T42 of the second transistor TR22 are formed continuously with the trenches T11 and T21, respectively, of the first transistor TR11 along the Y-axis direction in FIG. 2. Moreover, the trenches T12 and T22 of the first transistor TR12 are formed continuously with the trenches T31 and T41, respectively, of the second transistor TR21 along the Y-axis direction in FIG. 2. Hence, the spacing W1 between the pair of trenches T1 and T2 is equal to the spacing W2 between the pair of trenches T3 and T4.

Figure 15:
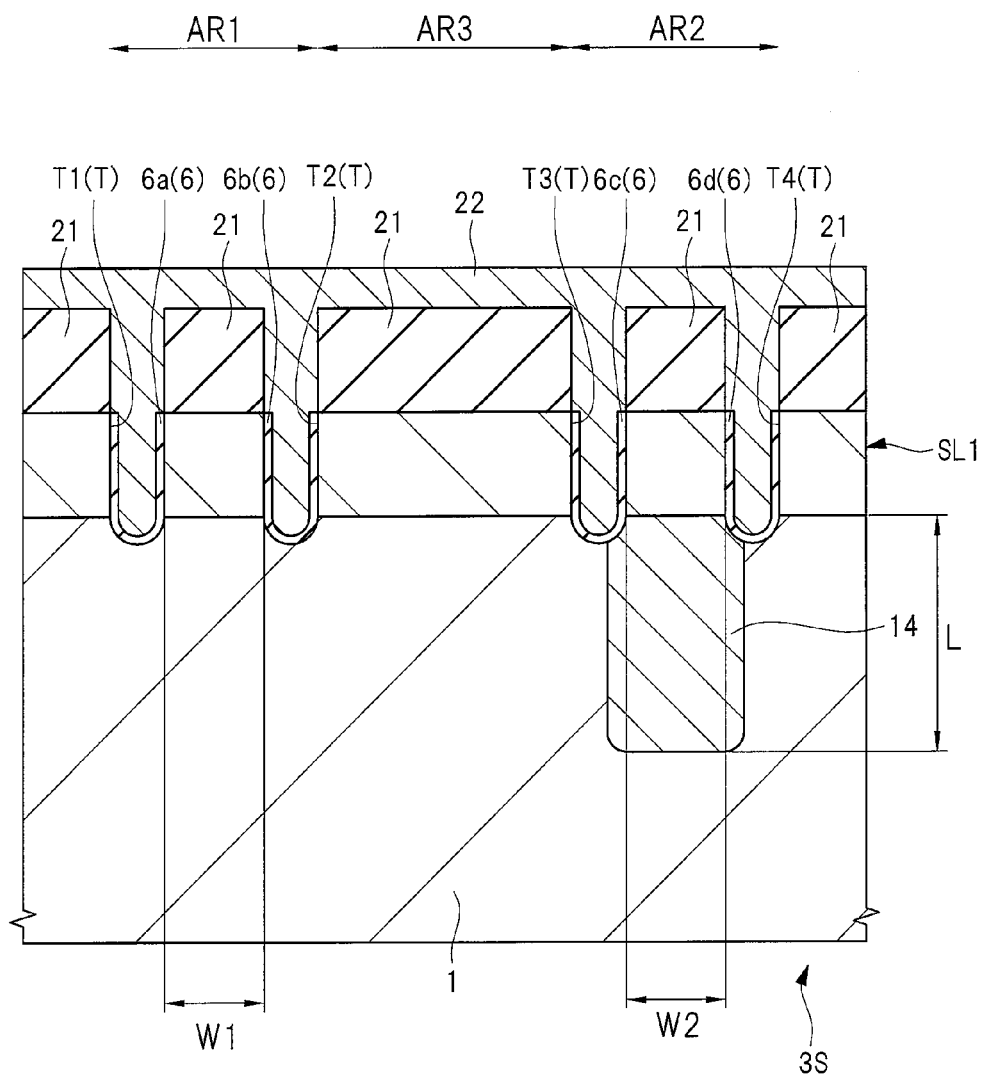
FIG. 15 is a cross-sectional view of the main portion of the semiconductor device of Embodiment 1 during the manufacturing process.

Next, as shown in FIG. 15, the gate insulating film 6 is formed on the inner wall of the trench T. The gate insulating film 6 can be, for example, a silicon oxide film, and can be formed by oxidizing the semiconductor layer SL1 exposed in the inner wall of the trench T by, for example, a thermal oxidation method. However, the gate insulating film 6 is not limited to a silicon oxide film but can be variously modified. For example, the gate insulating film 6 can be a silicon oxynitride (SiON) film. Alternatively, the gate insulating film 6 can be, for example, a high permittivity film having a higher permittivity than a silicon oxide film. As the high permittivity film, for example, a hafnium oxide (HfO$_2$) film can be employed.

In Embodiment 1, in this step of forming the gate insulating film 6, the pair of gate insulating films 6c and 6d are formed, as shown in FIG. 2, continuously with the pair of gate insulating films 6a and 6b, respectively, along the Y-axis direction in FIG. 2 on the inner walls of the pair of trenches T32 and T42. Moreover, the pair of gate insulating films 6a and 6b are formed continuously with the pair of gate insulating films 6c and 6d, respectively, along the Y-axis direction in FIG. 2 on the inner walls of the pair of trenches T12 and T22.

Next, as shown in FIG. 15, a polysilicon film 22 is formed on the silicon oxide film 21. In this case, the polysilicon film 22 is formed so as to fill the trench T on the inner wall of which the gate insulating film 6 is formed. That is, the polysilicon film 22 is formed so as to be embedded in the interior of the trench T via the gate insulating film 6. The polysilicon film 22 can be a polysilicon film into which an n-type impurity such as, for example, phosphorus (P) or arsenic (As) has been diffused at a high concentration, and can be formed by, for example, a CVD method.

Figure 16:
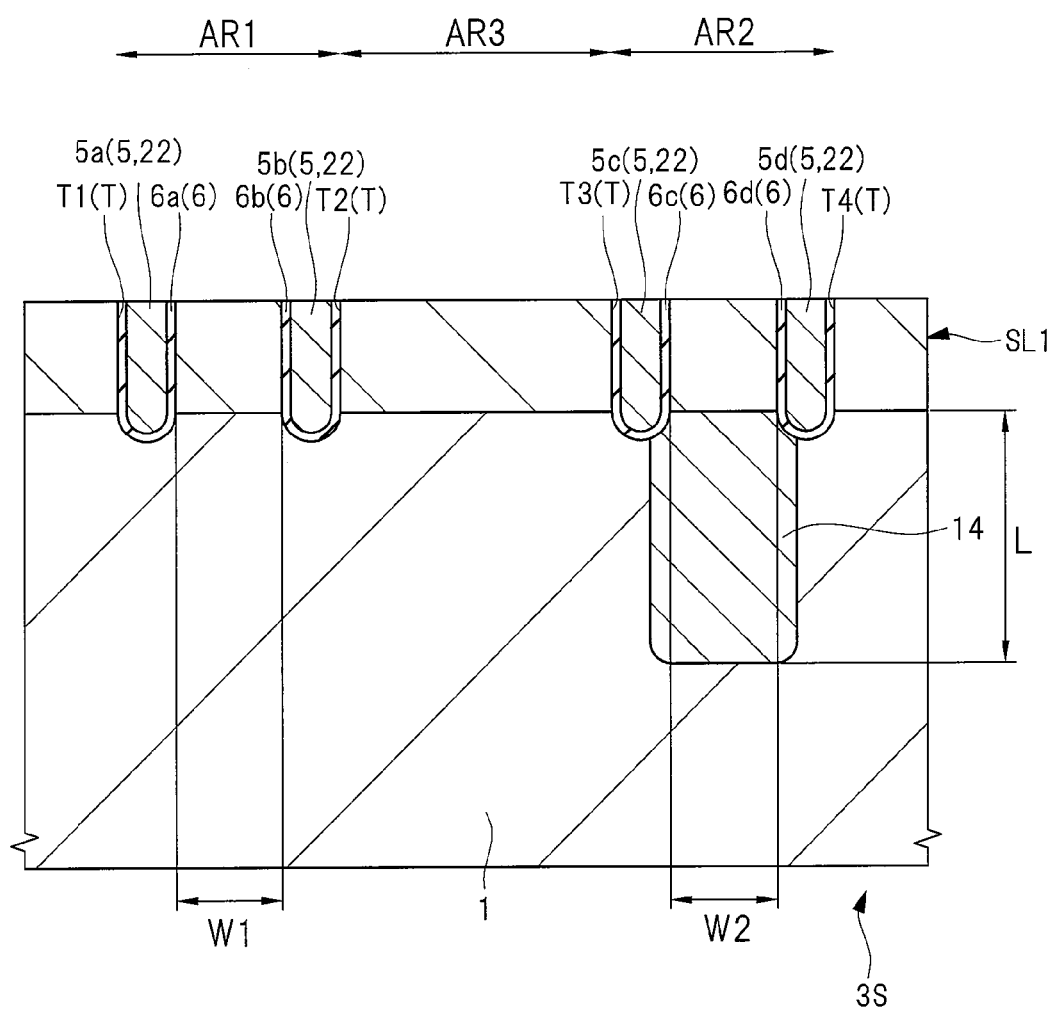
FIG. 16 is a cross-sectional view of the main portion of the semiconductor device of Embodiment 1 during the manufacturing process.

Next, as shown in FIG. 16, the gate electrode 5 is formed. In this step of forming the gate electrode 5, the polysilicon film 22 formed on the silicon oxide film 21 is removed by entire surface etch-back using dry etching, and the silicon oxide film 21 is removed by a dry etching technique. Due to this, the gate electrode 5 made of the polysilicon film 22 embedded in the interior of the trench T via the gate insulating film 6 is formed. As the gate electrode 5, the gate electrodes 5a, 5b, 5c, and 5d are formed in the trenches T1, T2, T3, and T4, respectively. For example, the pair of gate electrodes 5a and 5b are formed so as to be embedded in the interiors of the pair of trenches T1 and T2, respectively, via the pair of gate insulating films 6a and 6b. Moreover, the pair of gate electrodes 5c and 5d are formed so as to be embedded in the interiors of the pair of trenches T3 and T4, respectively, via the pair of gate insulating films 6c and 6d.

As shown in FIG. 2, the pair of gate electrodes 5c and 5d formed so as to be embedded in the interiors of the pair of trenches T32 and T42, respectively, via the pair of gate insulating films 6c and 6d are formed continuously with the pair of gate electrodes 5a and 5b, respectively, along the Y-axis direction in FIG. 2. Moreover, the pair of gate electrodes 5a and 5b formed so as to be embedded in the interiors of the pair of trenches T12 and T22, respectively, via the pair of gate insulating films 6a and 6b are formed continuously with the pair of gate electrodes 5c and 5d, respectively, along the Y-axis direction in FIG. 2.

Figure 17:
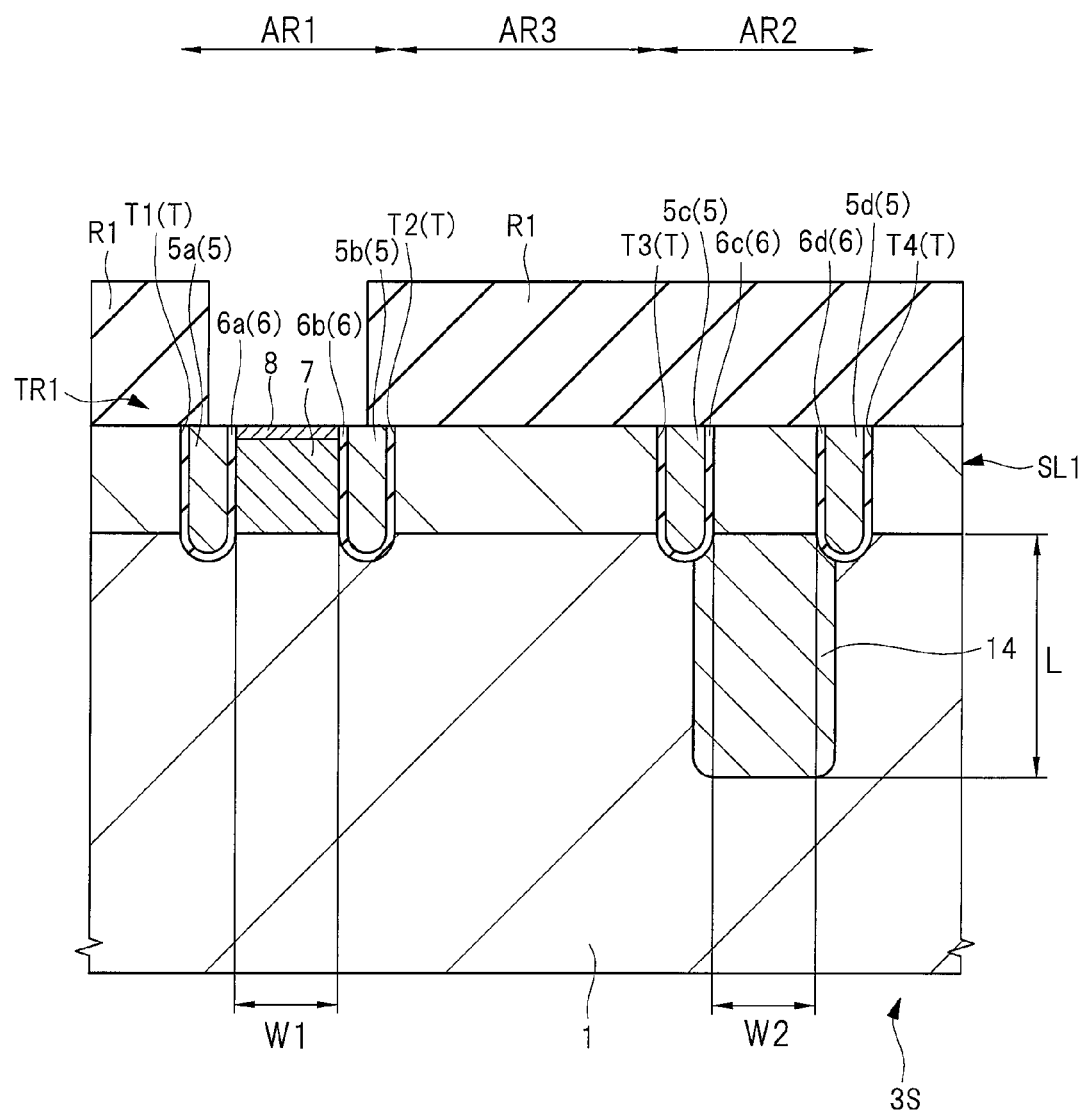
FIG. 17 is a cross-sectional view of the main portion of the semiconductor device of Embodiment 1 during the manufacturing process.

Next, as shown in FIG. 17, the p+ channel region 7 is formed. In this step of forming the p+ channel region 7, a resist film R1 is applied on the semiconductor substrate 3S. Then, an exposure and development treatment is applied to the applied resist film R1 using a photolithography technique to thereby pattern the resist film R1. The patterning of the resist film R1 is performed in a manner such that the second region AR2 and the third region AR3 are covered and the first region AR1 is exposed. Then, a p-type impurity such as, for example, boron (B) is introduced into the semiconductor layer SL1 by an ion implantation method using the patterned resist film R1 as a mask. Due to this, the p+ channel region 7 is formed in a portion of the semiconductor layer SL1 not covered with the resist film R1 in the first region AR1. The p+ channel region 7 is formed between the pair of trenches T1 and T2 in a manner such that the both sides of the p+ channel region 7 are in contact with the trenches T1 and T2 and the lower side of the p+ channel region 7 is in contact with the n$^{--}$ drift region 1. That is, the p+ channel region 7 is formed in the portion of the semiconductor layer SL1 interposed between the pair of trenches T1 and T2. The impurity concentration of the p+ channel region 7 can be, for example, about from $5 \times 10^{15}$ to $1 \times 10^{18}$ cm$^{-3}$ as described above.

Moreover, by forming the p+ channel region 7, the first transistor TR1 as a MISFET including the gate electrodes 5a and 5b, the gate insulating films 6a and 6b, and the p+ channel region 7 is formed in the semiconductor layer SL1 in the first region AR1.

Next, as shown in FIG. 17, the n++ emitter region 8 is formed. In this step of forming the n++ emitter region 8, an n-type impurity is introduced into the semiconductor layer SL1 by an ion implantation method using the patterned resist film R1 as a mask. Specifically, an n-type impurity such as, for example, phosphorus (P) or arsenic (As) is introduced into an upper portion of the p+ channel region 7 as a p-type semiconductor region so as to completely neutralize the p-type semiconductor region. Due to this, the n++ emitter region 8 is formed on the p+ channel region 7 in a portion of the semiconductor layer SL1 not covered with the resist film R1 in the first region AR1. The n++ emitter region 8 is formed between the pair of trenches T1 and T2 in a manner such that the both sides of the n++ emitter region 8 are in contact with the trenches T1 and T2. That is, the n++ emitter region 8 is formed in the portion of the semiconductor layer SL1 interposed between the pair of trenches T1 and T2 so as to be in contact with the gate insulating films 6a and 6b and the p+ channel region 7. The impurity concentration of the n++ emitter region 8 can be, for example, about from $1 \times 10^{18}$ to $5 \times 10^{20}$ cm$^{-3}$ as described above.

Figure 18:
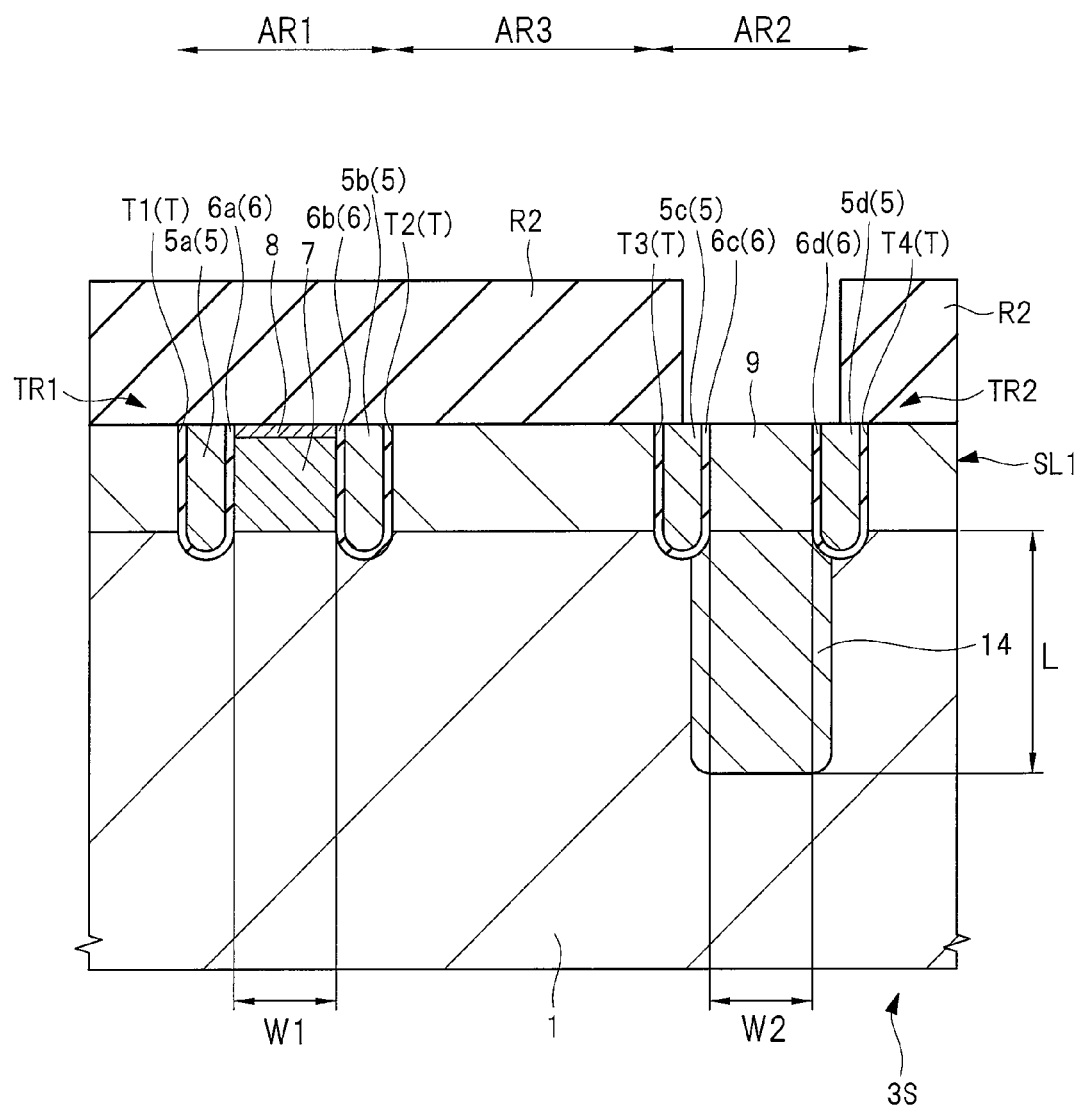
FIG. 18 is a cross-sectional view of the main portion of the semiconductor device of Embodiment 1 during the manufacturing process.

Next, as shown in FIG. 18, the p$^-$ channel region 9 is formed. In this step of forming the p$^-$ channel region 9, after the patterned resist film R1 (see FIG. 17) is removed, a resist film R2 is applied on the semiconductor substrate 3S. Then, an exposure and development treatment is applied to the applied resist film R2 using a photolithography technique to thereby pattern the resist film R2. The patterning of the resist film R2 is performed in a manner such that the first region AR1 and the third region AR3 are covered and the second region AR2 is exposed. Then, a p-type impurity such as, for example, boron (B) is introduced into the semiconductor layer SL1 by an ion implantation method using the patterned resist film R2 as a mask. Due to this, the p$^-$ channel region 9 is formed in a portion of the semiconductor layer SL1 not covered with the resist film R2 in the second region AR2. The p$^-$ channel region 9 is formed between the pair of trenches T3 and T4 in a manner such that the both sides of the p$^-$ channel region 9 are in contact with the trenches T3 and T4. That is, the p$^-$ channel region 9 is formed in the portion of the semiconductor layer SL1 interposed between the pair of trenches T3 and T4. Moreover, the p$^-$ channel region 9 is formed so as to be in contact with the hole extraction region 14. The impurity concentration of the p$^-$ channel region 9 can be, for example, about from $1 \times 10^{15}$ to $5 \times 10^{16}$ cm$^{-3}$ as described above.

Moreover, by forming the p$^-$ channel region 9, the second transistor TR2 as a MISFET including the gate electrodes 5c and 5d, the gate insulating films 6c and 6d, and the p$^-$ channel region 9 is formed in the semiconductor layer SL1 in the second region AR2.

In Embodiment 1, in the steps of forming the p+ channel region 7, the n++ emitter region 8, and the p$^-$ channel region 9 by an ion implantation method, ion implantation is performed in a manner such that, as shown in FIG. 2, the first transistor TR11 and the second transistor TR22 are adjacent to each other along the Y-axis direction in FIG. 2. Moreover, ion implantation is performed in a manner such that, as shown in FIG. 2, the first transistor TR12 and the second transistor TR21 are adjacent to each other along the Y-axis direction in FIG. 2. That is, the p$^-$ channel region 9 is formed adjacent to the p+ channel region 7 and the n++ emitter region 8 along the Y-axis direction in FIG. 2.

Figure 19:
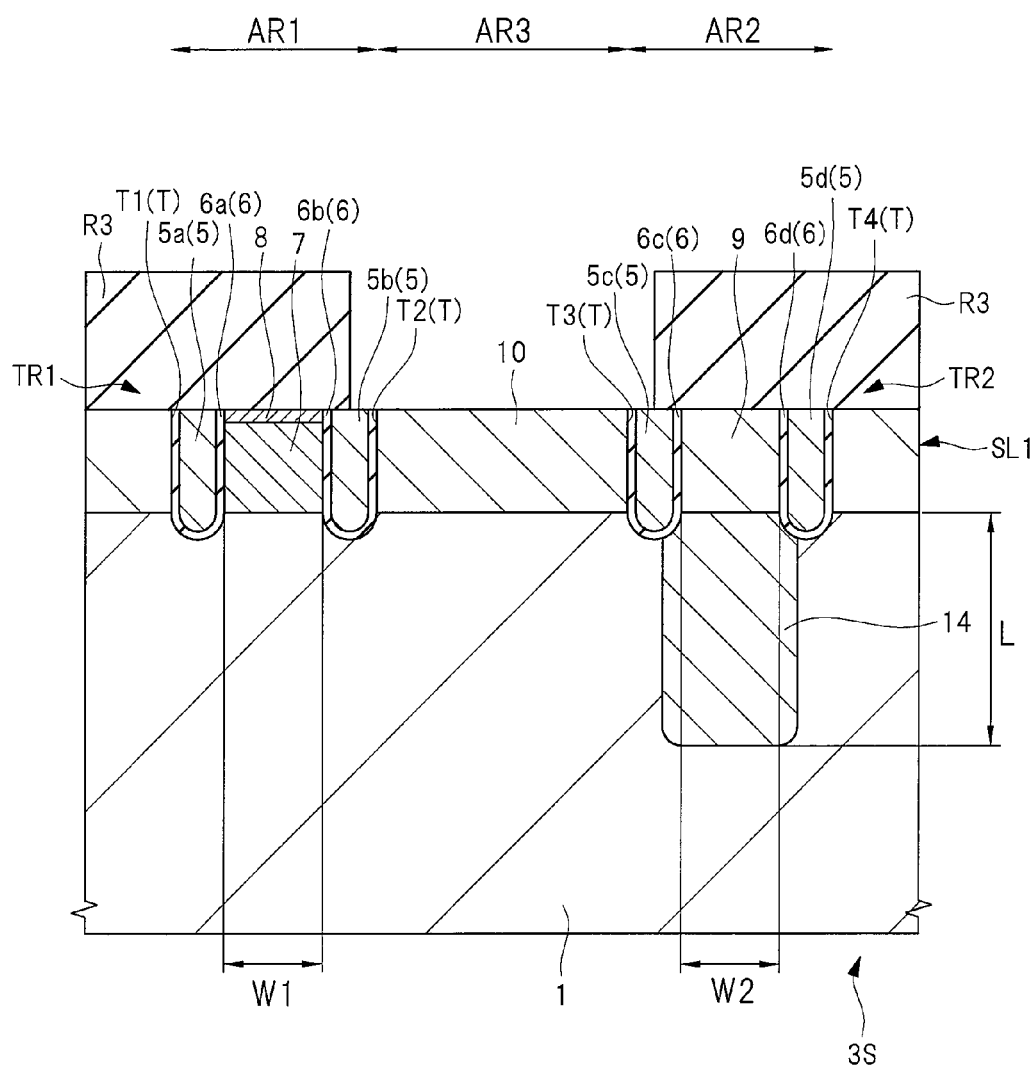
FIG. 19 is a cross-sectional view of the main portion of the semiconductor device of Embodiment 1 during the manufacturing process.

Next, as shown in FIG. 19, the p-well region 10 is formed. In this step of forming the p-well region 10, after the patterned resist film R2 (see FIG. 18) is removed, a resist film R3 is applied on the semiconductor substrate 3S. Then, an exposure and development treatment is applied to the applied resist film R3 using a photolithography technique to thereby pattern the resist film R3. The patterning of the resist film R3 is performed in a manner such that the first region AR1 and the second region AR2 are covered and the third region AR3 is exposed. Then, a p-type impurity such as, for example, boron (B) is introduced into the semiconductor layer SL1 by an ion implantation method using the patterned resist film R3 as a mask. Due to this, the p-well region 10 is formed in a portion of the semiconductor layer SL1 not covered with the resist film R3 in the third region AR3. The p-well region 10 is formed in a manner such that the both sides thereof are in contact with the trenches T2 and T3. The impurity concentration of the p-well region 10 can be, for example, about from $5 \times 10^{16}$ to $1 \times 10^{18}$ cm$^{-3}$ as described above.

The steps of forming the p+ channel region 7, the n++ emitter region 8, the p$^-$ channel region 9, and the p-well region 10 are not limited to the order described above, but may be performed in any order. Moreover, as to the steps of forming the p+ channel region 7, the n++ emitter region 8, the p$^-$ channel region 9, and the p-well region 10, a heat treatment can be performed at, for example, about 1050° C. to activate the implanted impurity after each of the steps or after completing all of the steps.

Figure 20:
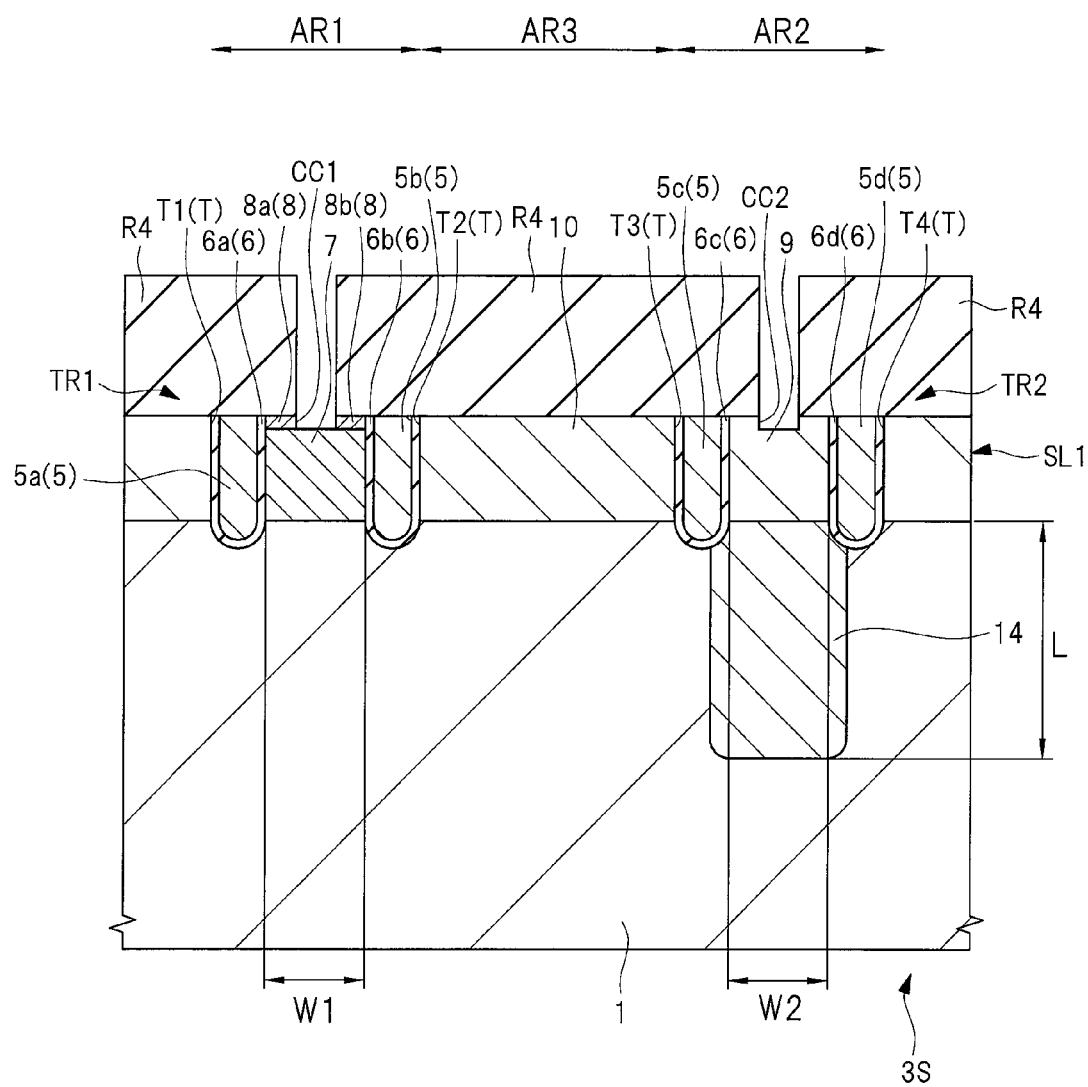
FIG. 20 is a cross-sectional view of the main portion of the semiconductor device of Embodiment 1 during the manufacturing process.

Next, as shown in FIG. 20, the recesses CC1 and CC2 are formed. In this step of forming the recesses CC1 and CC2, after the patterned resist film R3 (see FIG. 19) is removed, a resist film R4 is applied on the semiconductor substrate 3S. Then, an exposure and development treatment is applied to the applied resist film R4 using a photolithography technique to thereby pattern the resist film R4. The patterning of the resist film R4 is performed in a manner such that a portion of the first region AR1, in which the p++ emitter region 4a is formed, and a portion of the second region AR2, in which the p++ emitter region 4b is formed (see FIG. 21 described later), are exposed. Then, the recesses CC1 and CC2 are formed in the semiconductor layer SL1 using a photolithography technique and an etching technique with the patterned resist film R4 as a mask. In the first region AR1, the recess CC1 is formed so as to penetrate the $n^{++}$ emitter region 8 to reach the $p^+$ channel region 7. In this case, the recess CC1 is formed and the $n^{++}$ emitter region 8 is divided by the recess CC1, so that the two $n^{++}$ emitter regions 8a and 8b are formed in the first region AR1. Moreover, the $p^+$ channel region 7 is exposed in the bottom surface of the recess CC1, and the $p^-$ channel region 9 is exposed in the bottom surface of the recess CC2.

In Embodiment 1, in this step of forming the recesses CC1 and CC2, the recess CC2 in the second transistor TR22 is formed continuously with the recess CC1 in the first transistor TR11 along the Y-axis direction in FIG. 2 as shown in FIG. 2. Moreover, the recess CC1 in the first transistor TR12 is formed continuously with the recess CC2 in the second transistor TR21 along the Y-axis direction in FIG. 2.

Figure 21:
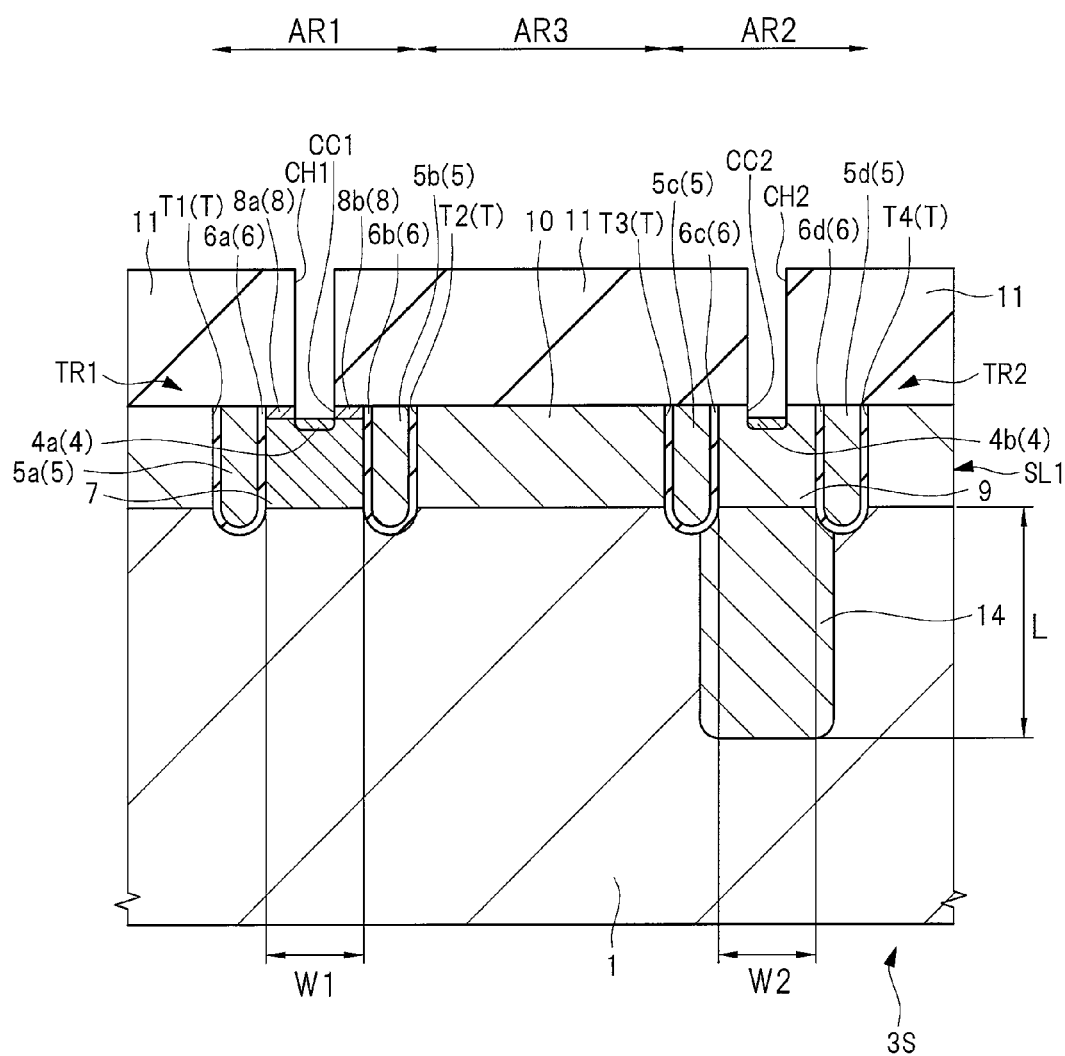
FIG. 21 is a cross-sectional view of the main portion of the semiconductor device of Embodiment 1 during the manufacturing process.

Next, as shown in FIG. 21, the interlayer insulating film 11 is formed. In this step of forming the interlayer insulating film 11, after the patterned resist film R4 (see FIG. 20) is removed, the interlayer insulating film 11 is formed on the semiconductor substrate 3S. As the interlayer insulating film 11, for example, an insulating film made of a silicon oxide film can be formed by, for example, a CVD method.

Next, as shown in FIG. 21, the contact holes CH1 and CH2 are formed in the interlayer insulating film 11 using a photolithography technique and an etching technique. The contact hole CH1 is formed in a portion where the $p^{++}$ emitter region 4a is formed in the first region AR1, and the contact hole CH2 is formed in a portion where the $p^{++}$ emitter region 4b is formed in the second region AR2. Hence, the contact hole CH1 is formed at a position overlapping the recess CC1 in the plan view, and the contact hole CH2 is formed at a position overlapping the recess CC2 in the plan view.

Next, as shown in FIG. 21, the $p^{++}$ emitter region 4 is formed. In this step of forming the $p^{++}$ emitter region 4, a p-type impurity such as, for example, boron (B) is introduced into the $p^+$ channel region 7 exposed in the bottom surface of the recess CC1 and the $p^-$ channel region 9 exposed in the bottom surface of the recess CC2 by an ion implantation method using the interlayer insulating film 11 as a mask. Due to this, in the first region AR1, the $p^{++}$ emitter region 4a is formed as the $p^{++}$ emitter region 4 in a portion of the semiconductor layer SL1 exposed in the bottom surface of the recess CC1. Moreover, in the second region AR2, the $p^{++}$ emitter region 4b is formed as the $p^{++}$ emitter region 4 in a portion of the semiconductor layer SL1 exposed in the bottom surface of the recess CC2.

That is, in the first region AR1, the $p^{++}$ emitter region 4a is formed, in the portion of the semiconductor layer SL1 interposed between the pair of trenches T1 and T2, so as to be spaced apart from both the pair of trenches T1 and T2 and be in contact with the $p^+$ channel region 7. Moreover, in the second region AR2, the $p^{++}$ emitter region 4b is formed, in the portion of the semiconductor layer SL1 interposed between the pair of trenches T3 and T4, so as to be spaced apart from both the pair of trenches T3 and T4 and be in contact with the $p^-$ channel region 9.

Figure 22:
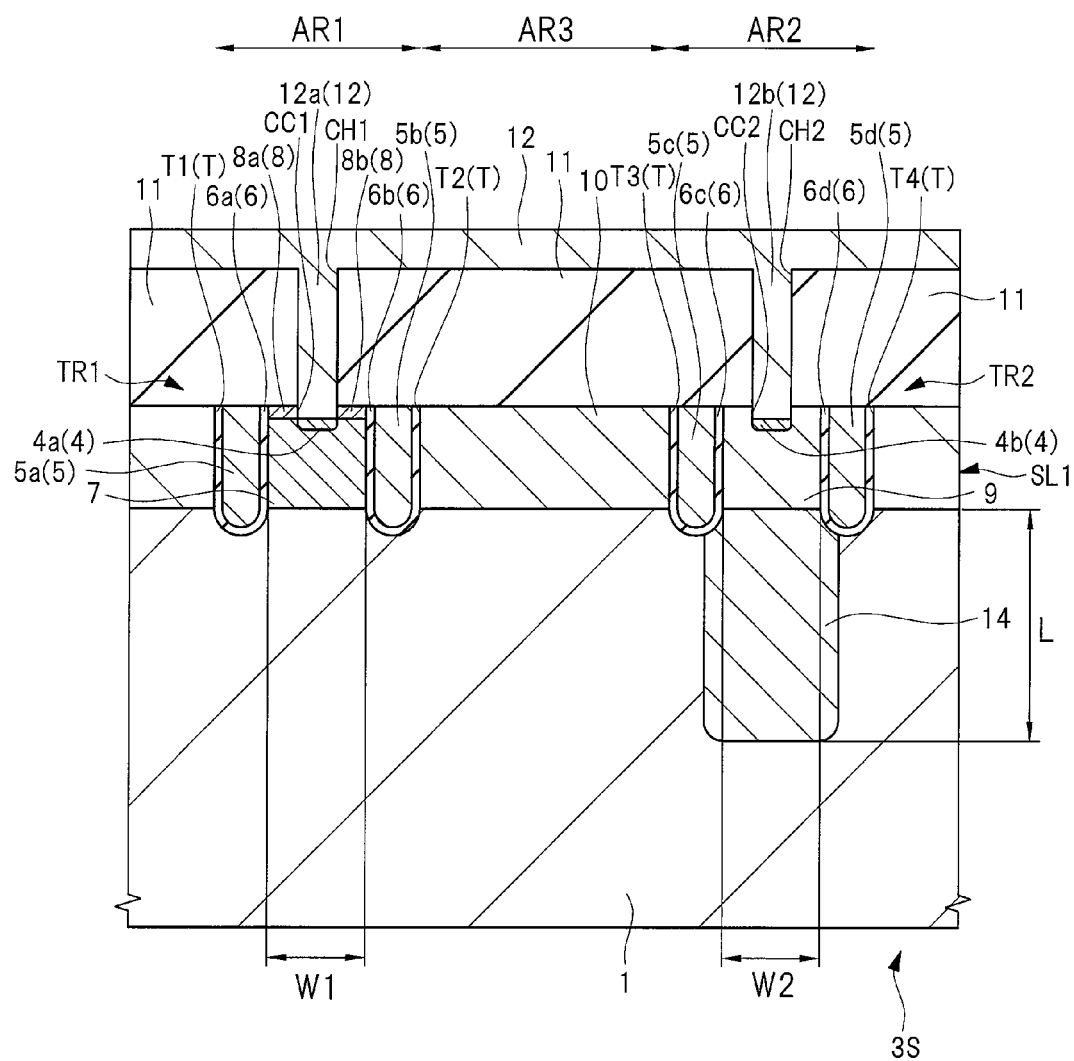
FIG. 22 is a cross-sectional view of the main portion of the semiconductor device of Embodiment 1 during the manufacturing process.

Next, as shown in FIG. 22, the emitter electrode 12 is formed in the interiors of the contact holes CH1 and CH2 and the recesses CC1 and CC2 and on the interlayer insulating film 11. Specifically, a barrier conductor film made of, for example, titanium tungsten (TiW) is first formed in the interiors of the contact holes CH1 and CH2 and the recesses CC1 and CC2 and on the interlayer insulating film 11 by, for example, a sputtering method. Next, a conductor film made of, for example, an aluminum (Al) film is formed on the barrier conductor film by, for example, a sputtering method, so that the emitter electrode 12 made of the stacked conductor film is formed. Due to this, the emitter electrode 12a is formed in the interiors of the contact hole CH1 and the recess CC1 in the first region AR1, and the emitter electrode 12b is formed in the interiors of the contact hole CH2 and the recess CC2 in the second region AR2.

As a result, in the first region AR1, the emitter electrode 12a formed in the interiors of the contact hole CH1 and the recess CC1 is electrically connected with the $p^{++}$ emitter region 4a and the $n^{++}$ emitter regions 8a and 8b. On the other hand, in the second region AR2, the emitter electrode 12b formed in the interiors of the contact hole CH2 and the recess CC2 is electrically connected with the $p^-$ channel region 9. Moreover, the $p^+$ channel region 7 is in contact with the $n^{++}$ emitter regions 8a and 8b, the gate insulating films 6a and 6b, and the $n^{--}$ drift region 1. The $n^{++}$ emitter regions 8a and 8b are in contact with the emitter electrode 12a, with the gate insulating films 6a and 6b respectively, and with the $p^+$ channel region 7. Further, the $p^-$ channel region 9 is in contact with the emitter electrode 12b, the gate insulating films 6c and 6d, and the $n^{--}$ drift region 1.

In Embodiment 1, in this step of forming the emitter electrodes 12a and 12b, the emitter electrode 12b of the second transistor TR22 is formed continuously with the emitter electrode 12a of the first transistor TR11 along the Y-axis direction in FIG. 2 as shown in FIG. 2. Moreover, the emitter electrode 12a of the first transistor TR12 is formed continuously with the emitter electrode 12b of the second transistor TR21 along the Y-axis direction in FIG. 2.

Next, the lower surface is ground, and the $n^+$ buffer region 2 and the $p^+$ collector region 3 (see FIG. 1) are formed.

First, the lower surface of the semiconductor substrate 3S is ground so that the thickness of the semiconductor substrate 3S is a predetermined thickness. The thickness of the semiconductor substrate 3S after grinding depends on, for example, the breakdown voltage of the IGBT to be formed. When the breakdown voltage is, for example, 3.3 kV, the thickness can be about 300 µm; when the breakdown voltage is, for example, 1.2 kV, the thickness can be about 120 µm; and when the breakdown voltage is, for example, 600 V, the thickness can be 60 µm.

Next, a p-type impurity such as, for example, boron (B) is introduced into a portion for forming the $p^+$ collector region 3, and an n-type impurity such as, for example, phosphorus (P) or arsenic (As) is introduced into a portion for forming the $n^+$ buffer region 2, from the lower surface side of the semiconductor substrate 3S by, for example, an ion implantation method. Thereafter, an instantaneous annealing treatment of, for example, about several 100 µm, that is, a heat treatment, is performed on the lower surface of the semiconductor substrate 3S by, for example, a laser annealing apparatus to activate the introduced impurity and a p-n junction. Due to this, as shown in FIG. 1, the $p^+$ collector region 3 and the $n^+$ buffer region 2 are formed in a lower surface-side portion of the semiconductor substrate 3S in order from the lower surface to the upper surface. As a result, the $n^+$ buffer region 2 is formed on the side of the $n^{--}$ drift region 1 opposite to the upper surface side, that is, on the lower surface side, and the $p^+$ collector region 3 is formed on the lower surface side of the $n^+$ buffer region 2.

As to the $n^+$ buffer region 2 and the $p^+$ collector region 3, one of the $n^+$ buffer region 2 and the $p^+$ collector region 3 can be formed by performing ion implantation and an annealing treatment, and then, the other can be formed.

Thereafter, a conductor film made of a metal such as aluminum (Al) or an alloy such as aluminum silicon (AlSi) is formed as the collector electrode 13 on the lower surface of the semiconductor substrate 3S. Due to this, the collector electrode 13 is formed so as to be in contact with the p⁺ collector region 3. As has been described above, the IGBT 50 as a semiconductor device in Embodiment 1 as shown in FIGS. 1 and 2 can be manufactured.

<On-Voltage and Switching Loss in IGBT>

Subsequently, the relationship between the on-voltage and switching loss in IGBT will be described in comparison with a semiconductor device of a comparative example.

Figure 23:
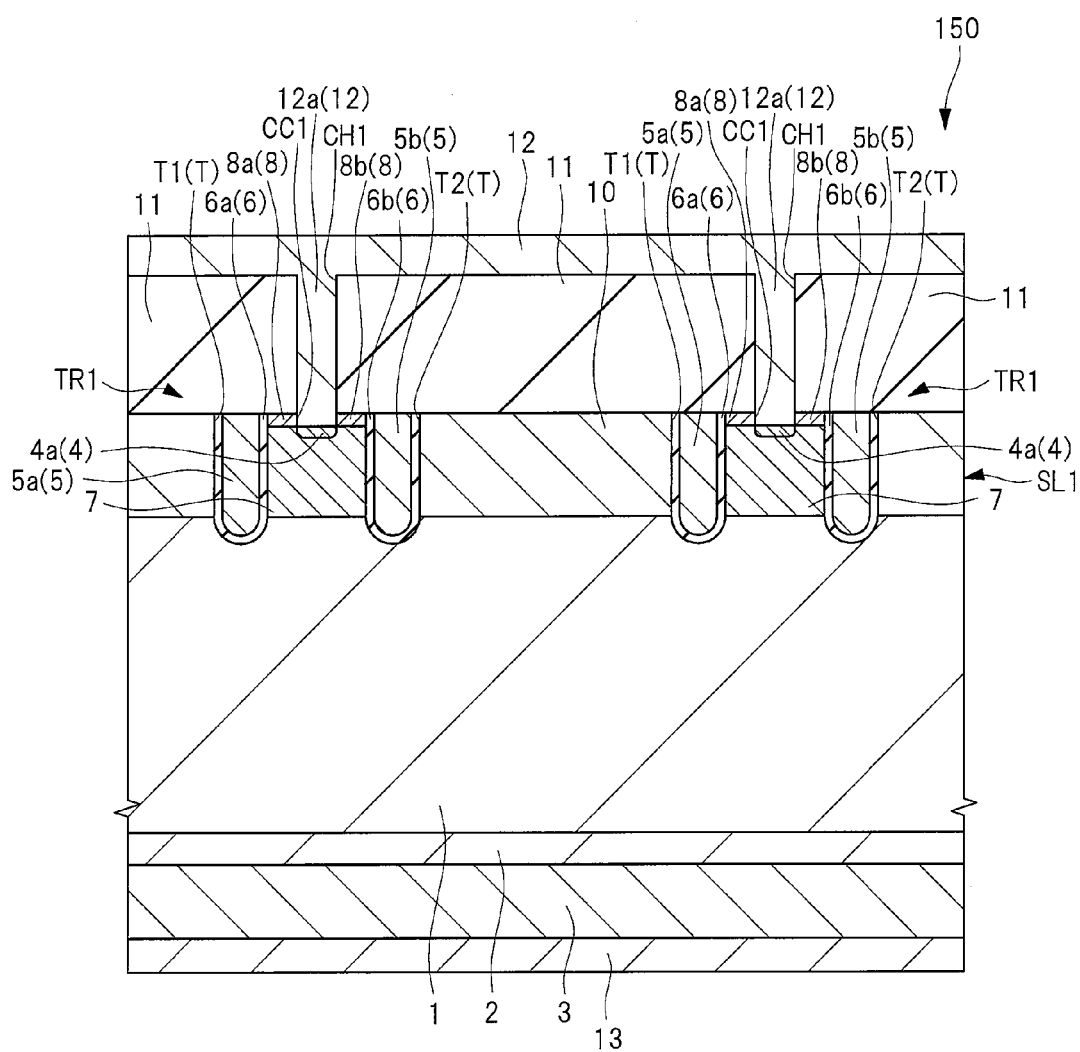
FIG. 23 is a cross-sectional view of a main portion of a semiconductor device of a comparative example.
Figure 24:
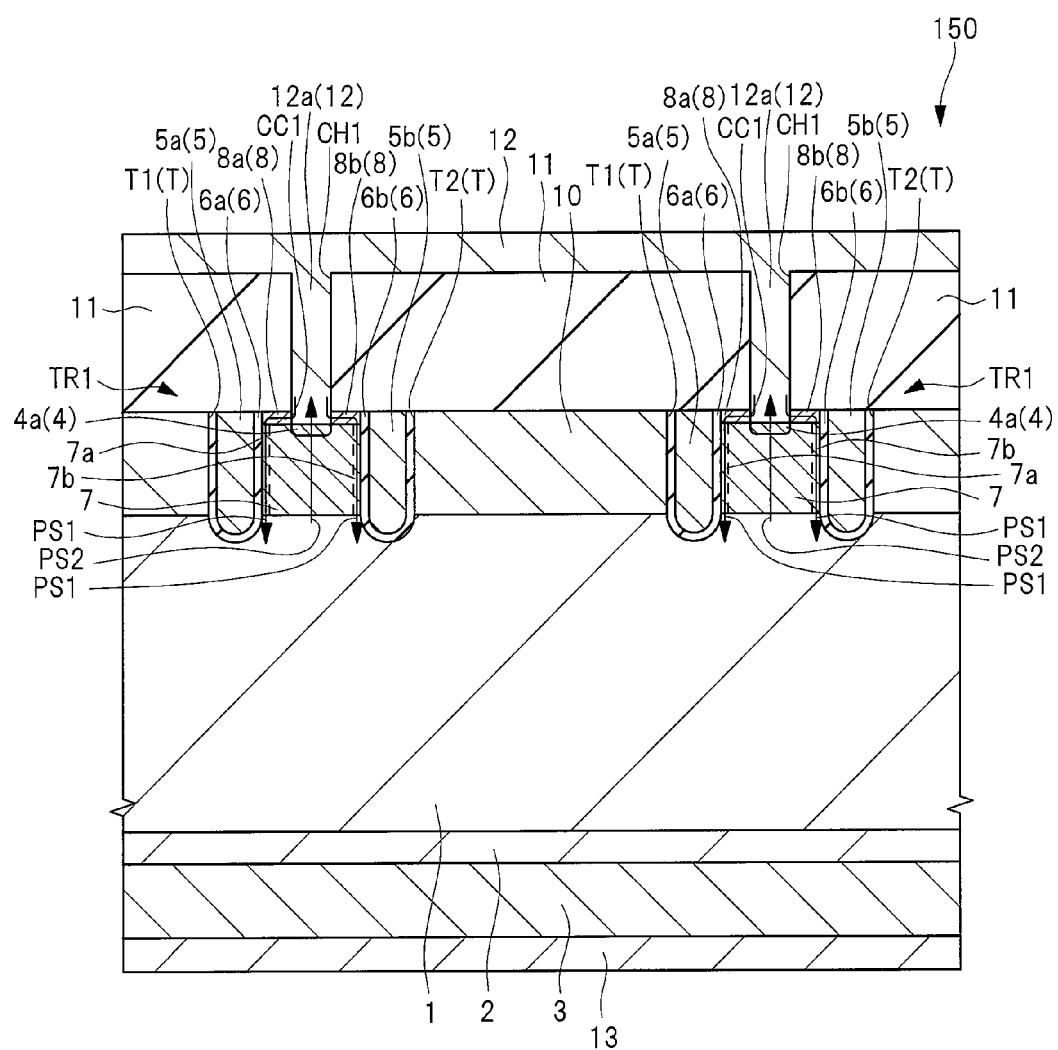
FIG. 24 is a diagram schematically showing paths through which charges flow when the IGBT is in the on-state in FIG. 23.
Figure 25:
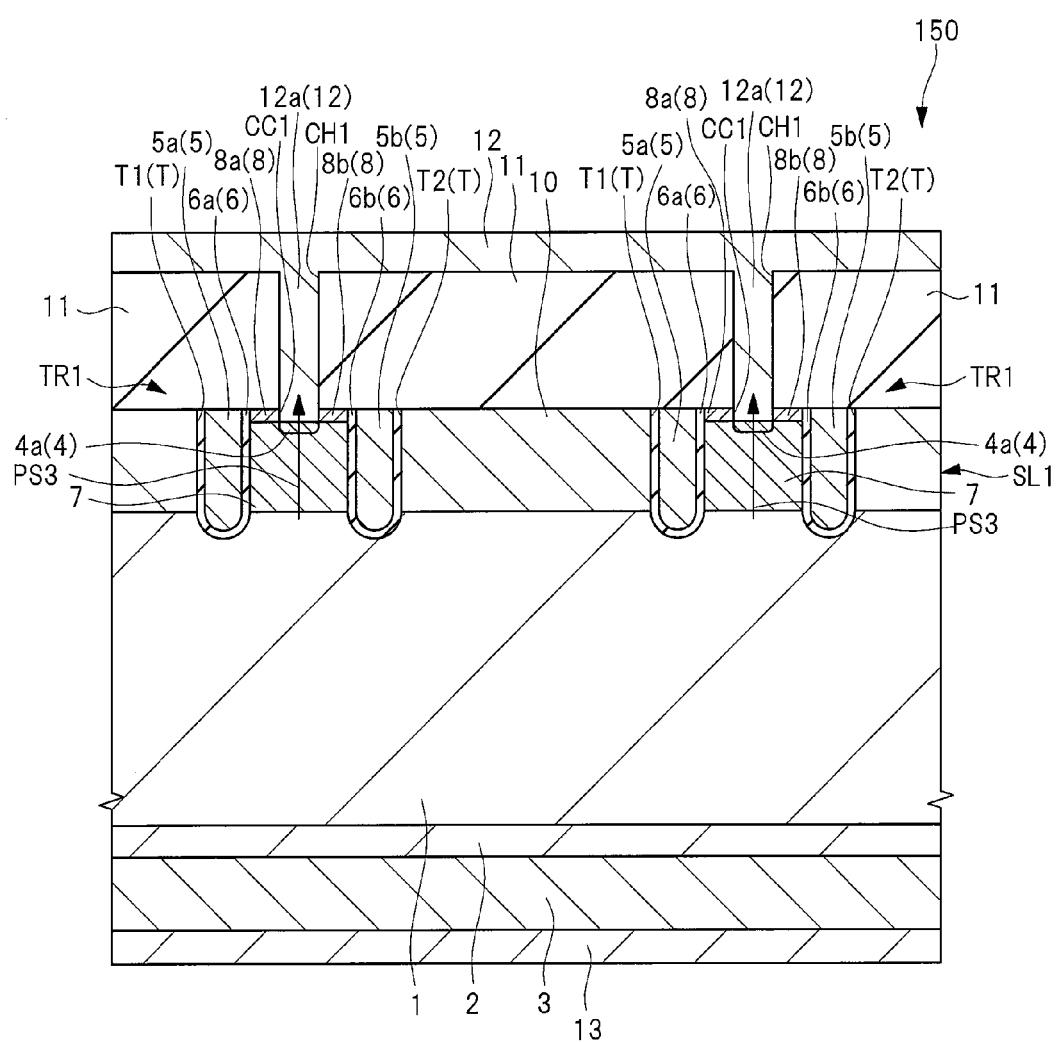
FIG. 25 is a diagram schematically showing paths through which charges flow when the IGBT is switched from the on-state to the off-state in FIG. 23.

FIG. 23 is a cross-sectional view of a main portion of a semiconductor device of the comparative example. FIG. 24 is a diagram schematically showing paths through which charges flow when the IGBT is in the on-state in FIG. 23. FIG. 25 is a diagram schematically showing paths through which charges flow when the IGBT is switched from the on-state to the off-state in FIG. 23.

In FIG. 23, the n⁻⁻ drift region 1, the n⁺ buffer region 2, and the p⁺ collector region 3 of an IGBT 150 as the semiconductor device of the comparative example correspond to the n⁻⁻ drift region 1, the n⁺ buffer region 2, and the p⁺ collector region 3, respectively, of the IGBT 50. The p⁺⁺ emitter region 4a, the gate electrodes 5a and 5b, the gate insulating films 6a and 6b, and the p⁺ channel region 7 of the IGBT 150 correspond to the p⁺⁺ emitter region 4a, the gate electrodes 5a and 5b, the gate insulating films 6a and 6b, and the p⁺ channel region 7, respectively, of the IGBT 50. The n⁺⁺ emitter regions 8a and 8b, the p-well region 10, the interlayer insulating film 11, the emitter electrode 12a, and the collector electrode 13 of the IGBT 150 correspond to the n⁺⁺ emitter regions 8a and 8b, the p-well region 10, the interlayer insulating film 11, the emitter electrode 12a, and the collector electrode 13, respectively, of the IGBT 50. The first transistor TR1 of the IGBT 150 corresponds to the first transistor TR1 of the IGBT 50.

However, the second transistor is not provided in the IGBT 150 as the semiconductor device of the comparative example.

Also in the IGBT 150 as the semiconductor device of the comparative example, the state where the inversion layers 7a and 7b are formed in the p⁺ channel region 7, that is, the on-state, is established by applying the collector voltage Vc to the collector electrode 13 and applying the gate voltage Vg1 to the gate electrodes 5a and 5b. Then, electrons from the emitter electrode 12a are injected into the n⁻⁻ drift region 1 through the n⁺⁺ emitter regions 8a and 8b and the formed inversion layers 7a and 7b as shown as the paths PS1 in FIG. 24. The electrons injected from the emitter electrode 12a into the n⁻⁻ drift region 1 and holes injected from the collector electrode 13 into the n⁻⁻ drift region 1 are attracted to each other due to Coulomb attraction in the n⁻⁻ drift region 1. Therefore, excess charges are accumulated in the n⁻⁻ drift region 1, so that a high on-current can flow through the IGBT 150.

Moreover, when the first transistor TR1 is in the on-state, the holes from the n⁻⁻ drift region 1 are discharged, that is, flow out to the emitter electrode 12a through a portion of the p⁺ channel region 7 other than the inversion layers 7a and 7b and depletion layers (not shown), that is, a center-side portion, as shown as the path PS2 in FIG. 24.

On the other hand, when the first transistor TR1 is switched from the on-state to the off-state, that is, when the application of the gate voltage Vg1 to the gate electrodes 5a and 5b is stopped, the holes excessively accumulated in the n⁻⁻ drift region 1 are discharged to the emitter electrode 12a through the p⁺ channel region 7 as shown as the path PS3 in FIG. 25. However, electrons cannot flow through the p⁺ channel region 7.

In the semiconductor device of the comparative example, however, power consumption (switching loss) in switching of the first transistor TR1 from the on-state to the off-state is large. This is because, the amount of holes that flow through the p⁺ channel region 7 is not too large only with the path PS3 shown in FIG. 25, and therefore, the holes cannot be efficiently discharged.

In order to reduce such switching loss, it is also considered that a transistor different from the first transistor TR1 is formed and holes are caused to flow through the different transistor when the first transistor TR1 and the different transistor are switched from the on-state to the off-state. However, when the first transistor TR1 and the different transistor are in the on-state, holes flow through the different transistor, and thus the area of the emitter region is substantially increased. Therefore, there is a problem in that the IE effect is reduced and the excess accumulation effect is reduced.

Moreover, in the case of forming the transistor different from the first transistor TR1, it is also considered that an n-type barrier region serving as a hole barrier layer is formed in the different transistor to suppress the flow of holes through the different transistor when the first transistor TR1 and the different transistor are in the on-state. However, in the case of forming the n-type barrier region, when, in turn, the first transistor TR1 and the different transistor are switched from the on-state to the off-state, holes cannot be efficiently discharged.

Figure 26:
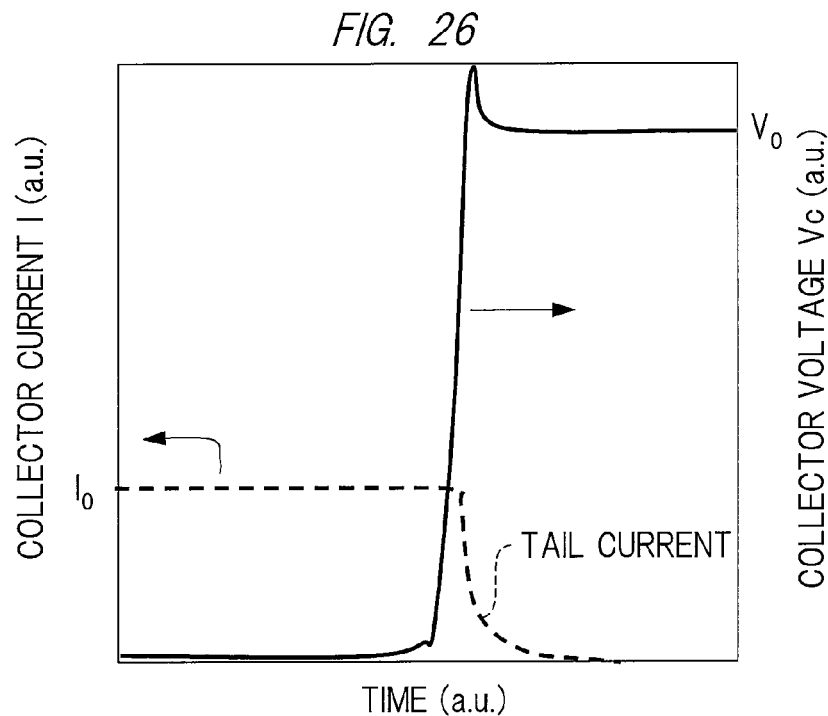
FIG. 26 is a graph schematically showing an example of time dependence between a collector current I and a collector voltage Vc when a transistor is switched from the on-state to the off-state.

FIG. 26 is a graph schematically showing an example of the time dependence of a collector current I and the collector voltage Vc when the first transistor TR1 is switched from the on-state to the off-state. In FIG. 26, the power supply voltage is shown by $V_0$, and the collector current I flowing through the first transistor TR1 when the first transistor TR1 is in the on-state is shown by $I_0$.

As shown in FIG. 26, when the first transistor TR1 is switched from the on-state to the off-state, the collector current I decreases from $I_0$ to 0 A but the collector voltage Vc increases from a voltage that is substantially equal to 0 V to the power supply voltage $V_0$. Then, as shown in FIG. 26, also after the collector voltage Vc increases equal to the power supply voltage $V_0$, the collector current I gradually decreases, and therefore, the collector current I continues flowing while decreasing for a constant time. As described above, such a current is referred to as "tail current". This tail current increases a loss when the first transistor TR1 as an IGBT is switched from the on-state to the off-state, that is, what is called a turn-off loss.

Figure 27:
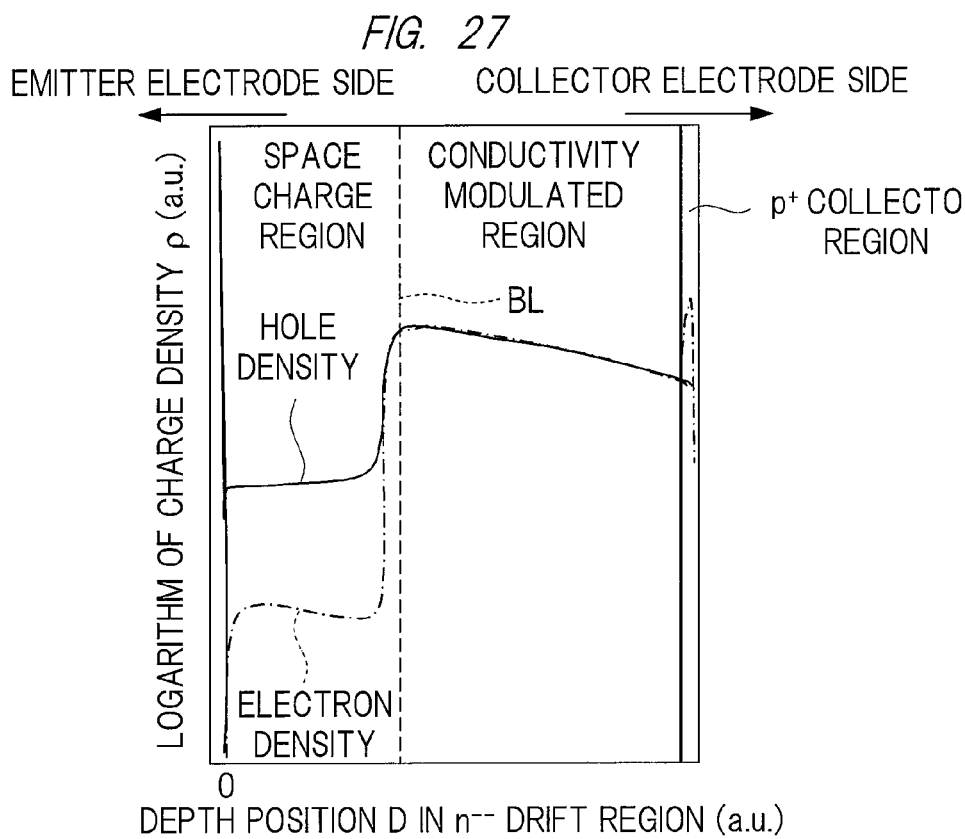
FIG. 27 is a graph schematically showing the distribution of charges in the interior of an n⁻⁻ drift region when the collector voltage Vc reaches a power supply voltage $V_0$ in FIG. 26.

FIG. 27 is a graph schematically showing the distribution of charges in the interior of the n⁻⁻ drift region 1 when the collector voltage Vc reaches the power supply voltage $V_0$ in FIG. 26. The horizontal axis in FIG. 27 represents a depth position D of the n⁻⁻ drift region 1 in a direction from the emitter electrode 12 side, that is, the upper surface side, toward the collector electrode 13 side, that is, the lower surface side, with the depth position of the n⁻⁻ drift region 1 at the upper surface thereof being 0, while the vertical axis in FIG. 27 represents the logarithm of charge density ρ. Moreover, in FIG. 27, the distributions of hole density and electron density are shown by two curves.

As shown in FIG. 27, the hole density in a region to the left of the broken line BL, that is, a region on the emitter electrode 12 side (hereinafter referred to as "space charge region"), is extremely smaller than the hole density in a region to the right of the broken line BL, that is, a region on the collector electrode 13 side (hereinafter referred to as "conductivity modulated region"). Moreover, the electron density in the space charge region is extremely smaller than the electron density in the conductivity modulated region. That is, it is found that charges of both conductivity types, electrons and holes, are accumulated in the conductivity modulated region when the collector voltage Vc reaches the power supply voltage $V_0$ whereby the tail current occurs.

Figure 28:
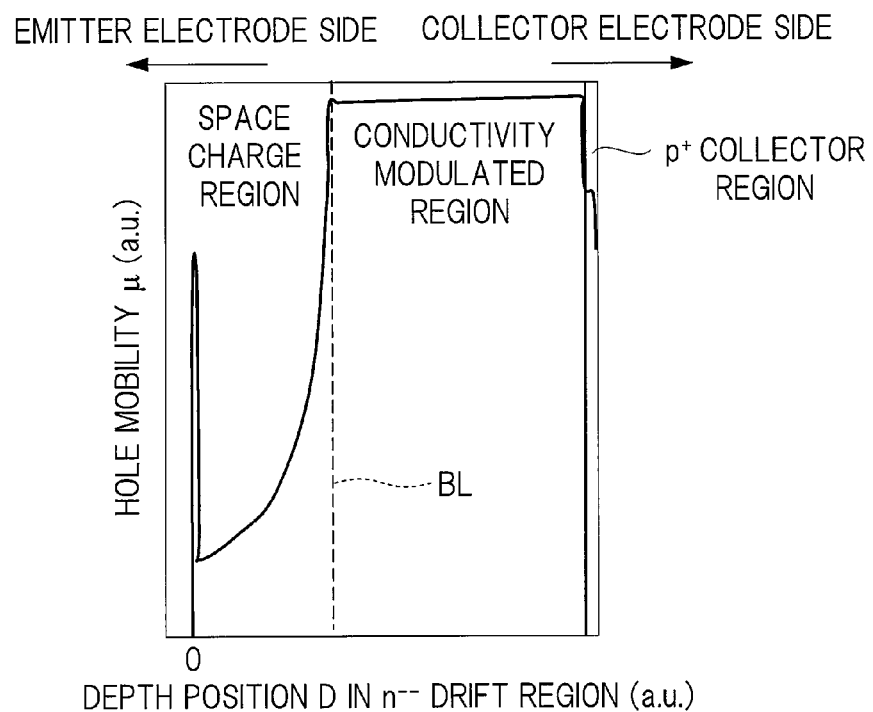
FIG. 28 is a graph schematically showing the distribution of hole mobility μ in the interior of the n⁻⁻ drift region 1 when the collector voltage Vc reaches the power supply voltage $V_0$ in FIG. 26.
Figure 29:
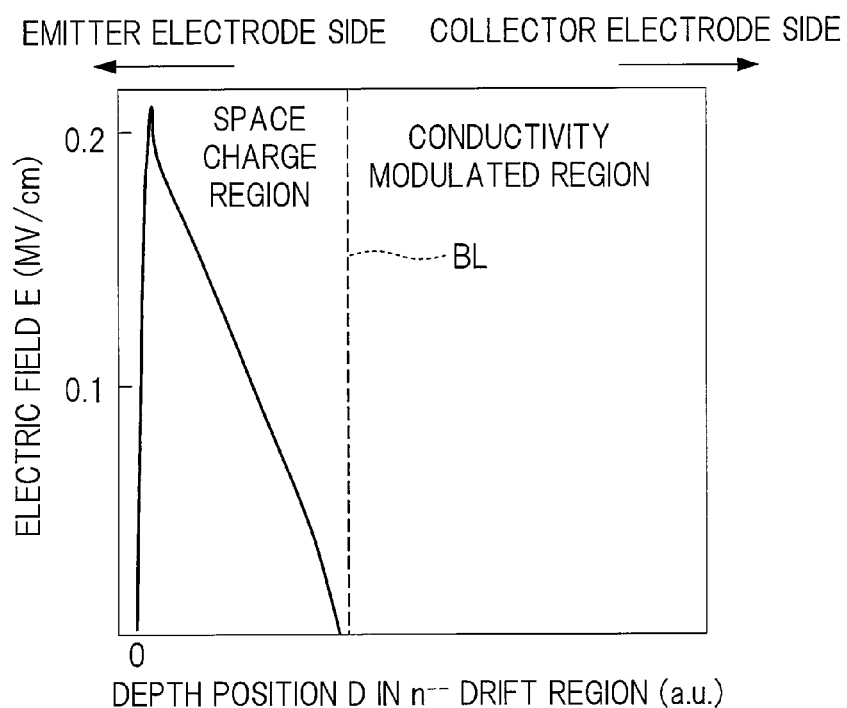
FIG. 29 is a graph schematically showing the distribution of an electric field E in the interior of the $n^{--}$ drift region 1 when the collector voltage Vc reaches the power supply voltage $V_0$ in FIG. 26.

FIG. 28 is a graph schematically showing the distribution of mobility of holes (hereinafter referred to as "hole mobility") μ in the interior of the $n^{--}$ drift region 1 when the collector voltage Vc reaches the power supply voltage $V_0$ in FIG. 26. FIG. 29 is a graph schematically showing the distribution of an electric field E in the interior of the $n^{--}$ drift region 1 when the collector voltage Vc reaches the power supply voltage $V_0$ in FIG. 26. Similarly to FIG. 27, the horizontal axis in FIGS. 28 and 29 represents the depth position D of the $n^{--}$ drift region 1 in the direction from the emitter electrode side (the upper surface side) toward the collector electrode side (lower surface side) with the depth position at the upper surface of the $n^{--}$ drift region 1 being 0. The vertical axis in FIG. 28 represents the hole mobility μ, while the vertical axis in FIG. 29 represents the electric field E (MV/cm).

As shown in FIG. 29, the electric field E in the space charge region to the left of the broken line BL is larger than the electric field E in the conductivity modulated region to the right of the broken line BL. As shown in FIG. 28, the hole mobility μ in the space charge region to the left of the broken line BL is smaller the hole mobility μ in the conductivity modulated region to the right of the broken line BL. This is because, a high electric field is generated in the space charge region, so that the hole mobility μ decreases due to a velocity saturation phenomenon.

The velocity saturation phenomenon is described in, for example, Yuan Taur, Tak H. Ning, "Fundamental of Modern VLSI Devices", Cambridge University Press, 1998, pp 149-150.

From the results shown in FIGS. 28 and 29, the followings are found. That is, when the first transistor TR1 is switched from the on-state to the off-state, the electric field in the space charge region as a portion of the $n^{--}$ drift region 1 on the emitter electrode 12 side increases, and the hole mobility μ in the space charge region as the portion of the $n^{--}$ drift region 1 on the emitter electrode 12 side decreases due to the velocity saturation phenomenon. Since this prevents the flow out of holes from the $n^{--}$ drift region 1 to the emitter electrode 12, charge accumulation of charges composed of electrons and holes occurs in the conductivity modulated region as a portion of the $n^{--}$ drift region 1 on the collector electrode 13 side, whereby the tail current occurs in the collector current. In other words, in the space charge region, the velocity of holes, which is the product of the hole mobility μ and the electric field E, saturates due to the velocity saturation phenomenon, the electric field E increases, and the hole mobility μ decreases.

As described above, when the first transistor TR1 is switched from the on-state to the off-state, the electric field increases in the space charge region as the portion of the $n^{--}$ drift region 1 on the emitter electrode 12 side, the velocity of holes saturates, and thus the holes are prevented from flowing out to the emitter electrode 12 side. Due to this, the electron and hole charges are excessively accumulated in the conductivity modulated region as the portion of the $n^{--}$ drift region 1 on the collector electrode 13 side, and thus the so-called tail current occurs.

Principal Features and Advantageous Effects of Embodiment

On the other hand, the IGBT 50 as the semiconductor device of Embodiment 1 includes the second transistor TR2 in addition to the first transistor TR1. In the second transistor TR2, regions corresponding to the $n^{++}$ emitter regions 8a and 8b formed in the first transistor TR1 are not formed. Therefore, the second transistor TR2 does not allow a current to flow therethrough when the second transistor TR2 is in the on-state, but allows a current composed of holes to flow therethrough when the second transistor TR2 is switched from the on-state to the off-state.

That is, in the semiconductor device of Embodiment 1, when the first transistor TR1 and the second transistor TR2 are in the on-state, a current composed of holes and electrons flows from the collector electrode 13 through the $p^+$ channel region 7 of the first transistor TR1 to the emitter electrode 12a. However, when the first transistor TR1 and the second transistor TR2 are in the on-state, the current does not flow through the $p^-$ channel region 9 of the second transistor TR2. Due to this, the IE effect in the on-state can be ensured, and the excess accumulation effect can be ensured. As a result, resistance in the $n^{--}$ drift region 1 can be reduced, and the collector voltage for causing a rated collector current to flow, that is, the on-voltage, can be reduced.

On the other hand, in the semiconductor device of Embodiment 1, when the first transistor TR1 and the second transistor TR2 are switched from the on-state to the off-state, a current composed of holes flows from the $n^{--}$ drift region 1 through the first transistor TR1 and the second transistor TR2 to the emitter electrodes 12a and 12b. Due to this, power consumption when the first transistor TR1 and the second transistor TR2 are switched from the on-state to the off-state, that is, a switching loss, can be reduced.

That is, according to the semiconductor device of Embodiment 1, the on-voltage can be reduced, and at the same time, the switching loss can be reduced. Hence, in order to reduce the on-voltage, even when the IE effect is increased to reduce the on-voltage by, for example, reducing the plane area (hereinafter simply referred to as "area") of the $p^{++}$ emitter region 4a of the first transistor TR1 or the plane area (hereinafter simply referred to as "area") of the $p^+$ channel region 7, the switching loss can be reduced. That is, a reduction in on-voltage and a reduction in switching loss, which are in a trade-off relationship in the related art, can both be achieved, and the performance of a semiconductor device composed of an IGBT can be improved.

Further, the IGBT 50 as the semiconductor device of Embodiment 1 includes, within the $n^{--}$ drift region 1, the hole extraction region 14 as a p-type semiconductor region formed in contact with the $p^-$ channel region 9 of the second transistor TR2.

The collector current when holes flow out through the $n^{--}$ drift region 1 is proportional to the hole mobility μ within the $n^{--}$ drift region 1, the electric field E within the $n^{--}$ drift region 1, and the concentration of holes within the $n^{--}$ drift region 1. As described above, when the second transistor TR2 is switched from the on-state to the off-state, the hole mobility μ decreases, the electric field E increases, and the velocity of holes, which is the product of the hole mobility μ and the electric field E, saturates due to the velocity saturation phenomenon, in the portion of the $n^{--}$ drift region 1 on the emitter electrode side. However, in Embodiment 1, the hole extraction region 14 is formed, so that the concentration of holes can be increased in the portion of the n⁻⁻ drift region 1 on the emitter electrode 12 side. Therefore, although the velocity of holes is not increased, the collector current when holes flow out through the n⁻⁻ drift region 1 can be increased.

In Embodiment 1, the area ratio of the area of the p⁺ channel region 7 to the area of the p⁻ channel region 9 is preferably determined by, for example, the following method. First, the area of the p⁺⁺ emitter regions 4a and 4b, that is, an emitter diameter, is determined, and the area of the p⁺ channel region 7 is determined with respect to the determined area of the p⁺⁺ emitter regions 4a and 4b in a manner such that the on-voltage can be maximally reduced due to the IE effect. Then, the remaining area obtained by subtracting the area of the p⁺ channel region 7 from the area with which the p⁺ channel region 7 and the p⁻ channel region 9 are to be formed is determined as the area of the p⁻ channel region 9.

Moreover, in Embodiment 1, even when the conductivity type of each of the n-type semiconductor region and the p-type semiconductor region is changed between p-type and n-type, advantageous effects similar to those of the semiconductor device of Embodiment 1 are obtained (the same applies to the following embodiments). In this case, the charge constituting a current that flows through the semiconductor device is changed between hole and electron. That is, the positive and negative polarities of the charge constituting a current that flows through the semiconductor device are opposite from each other (the same applies to the following embodiments).

Moreover, an example in which the semiconductor material constituting the semiconductor substrate 3S and the semiconductor regions is silicon (Si) has been described in Embodiment 1. However, the semiconductor material is not limited to silicon (Si), and other various kinds of semiconductor materials, such as, for example, silicon carbide (SiC) can be used (the same applies to the following embodiments). However, when other semiconductor materials are used instead of silicon (Si), and the gate-to-gate distance W is determined based on the formula (7), the permittivity ∈ is the permittivity of each of the semiconductor materials, and the band gap V is the band gap of each of the semiconductor materials.

Further, it has been described in Embodiment 1 that when the gate-to-gate distance W2 of the second transistor TR2 is W, it is preferable that the gate-to-gate distance W satisfies the formula (7) in order to prevent holes from flowing through the second transistor TR2 when the second transistor TR2 is in the on-state. However, even when the gate-to-gate distance W does not satisfy the formula (7), the impurity concentration of the p⁻ channel region 9 is made lower than impurity concentration of the p⁺ channel region 7 for example, and thus an adjustment can be made so that almost no hole flows through the p⁻ channel region 9 of the second transistor TR2 when the second transistor TR2 is in the on-state. Therefore, even when the gate-to-gate distance W does not satisfy the formula (7), the switching loss can be more reduced compared to the case where the second transistor TR2 is not formed.

Embodiment 2

Semiconductor Device

Next, a semiconductor device of Embodiment 2 of the invention will be described. In Embodiment 1 described above, the first transistor and the second transistor are adjacent to each other along one direction. In contrast, in Embodiment 2, the first transistor and the second transistor are formed at positions spaced apart from each other with the p-well region interposed therebetween, and are not adjacent to each other.

Figure 30:
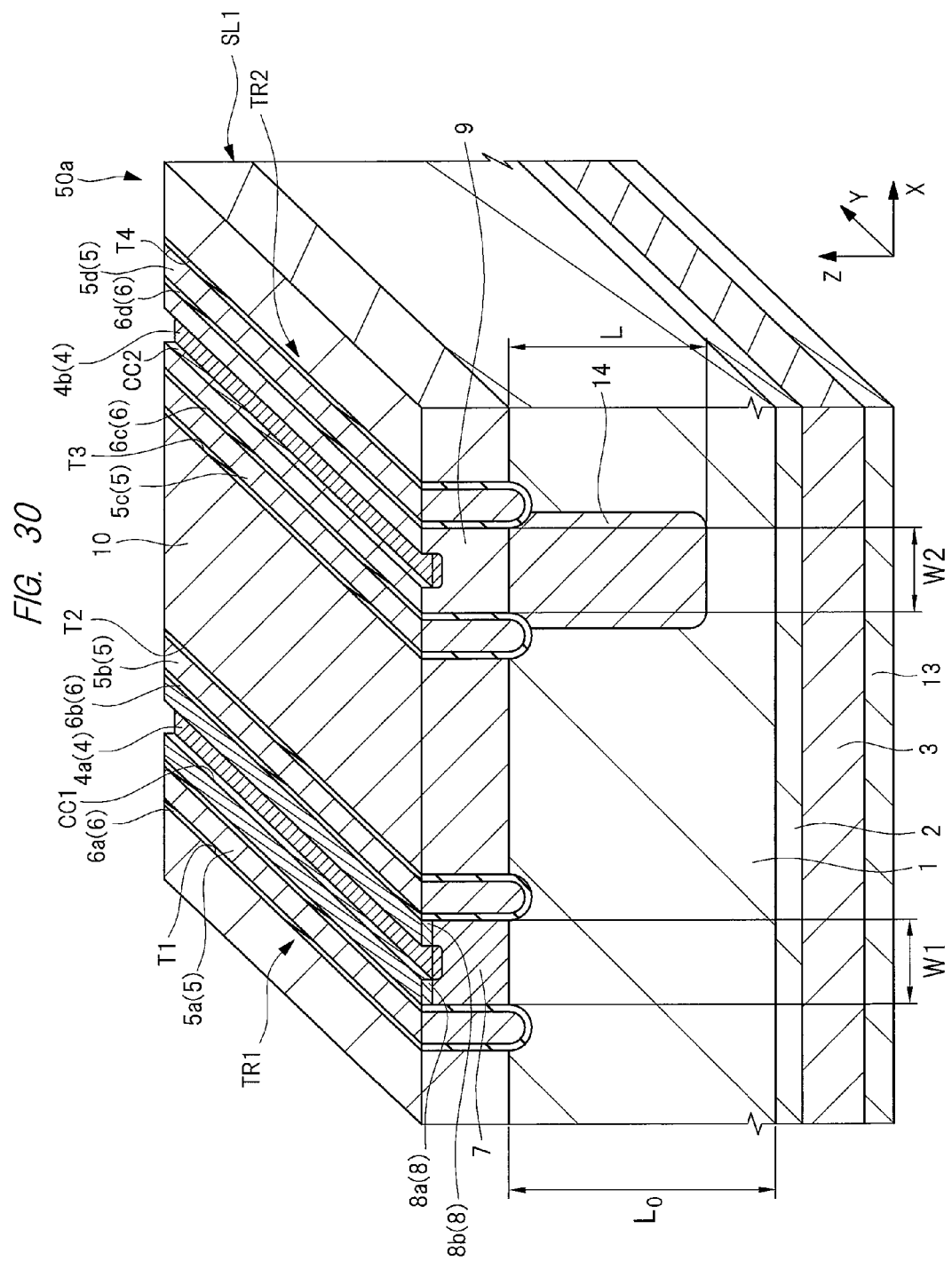
FIG. 30 is a perspective view of a semiconductor device of Embodiment 2.

FIG. 30 is a perspective view of the semiconductor device of Embodiment 2. A cross-sectional view of a main portion of the semiconductor device of Embodiment 2 is similar to the cross-sectional view of the main portion of the semiconductor device shown in FIG. 1 in Embodiment 1.

As shown in FIG. 30, an IGBT 50a as the semiconductor device of Embodiment 2 has substantially the same structure as the IGBT 50 as the semiconductor device of Embodiment 1. That is, similarly to the IGBT 50, the IGBT 50a includes the n⁻⁻ drift region 1, the n⁺ buffer region 2, the p⁺ collector region 3, and the p⁺⁺ emitter region 4 (the p⁺⁺ emitter regions 4a and 4b). Moreover, similarly to the IGBT 50, the IGBT 50a includes the gate electrode 5 (the gate electrodes 5a, 5b, 5c, and 5d) and the gate insulating film 6 (the gate insulating films 6a, 6b, 6c, and 6d). Further, similarly to the IGBT 50, the IGBT 50a includes the p⁺ channel region 7, the n⁺⁺ emitter region 8 (the n⁺⁺ emitter regions 8a and 8b), the p⁻ channel region 9, the p-well region 10, the interlayer insulating film 11, the emitter electrode 12 (the emitter electrodes 12a and 12b), and the collector electrode 13.

Moreover, also in Embodiment 2 as shown in FIG. 30, the trenches T1, T2, T3, and T4 are formed along one direction, that is, the Y-axis direction in FIG. 30. Hence, the p⁺⁺ emitter region 4 (the p⁺⁺ emitter regions 4a and 4b), the p⁺ channel region 7, the n⁺⁺ emitter region 8 (the n⁺⁺ emitter regions 8a and 8b), and the p⁻ channel region 9 are formed along the Y-axis direction in FIG. 30. Moreover, also the gate electrode 5 (the gate electrodes 5a, 5b, 5c, and 5d), and the gate insulating film 6 (the gate insulating films 6a, 6b, 6c, and 6d) are formed along the Y-axis direction in FIG. 30.

Also in Embodiment 2, similarly to Embodiment 1, the hole extraction region 14 is formed in contact with the p⁻ channel region 9 within the n⁻⁻ drift region 1. Moreover, when the impurity concentration of the hole extraction region 14 is $N_d$ (cm⁻³), it is preferable to satisfy the formula (1). When the length of the hole extraction region 14 in the vertical direction is L (µm), and the power supply voltage is $V_{cc}$ (V), it is preferable to satisfy the formula (2) and the formula (3). Further, when the width of the hole extraction region 14 in the gate length direction is $W_D$ (µm) (see FIG. 13), and an arrangement pitch is $P_0$ (µm), it is preferable to satisfy the formula (6).

Moreover, when the gate-to-gate distance W2 of the second transistor TR2 is W (m), the impurity concentration of the p channel region 9 is $N_a$ (m⁻³), the elementary charge of electron and hole is q (C), the permittivity of the p⁻ channel region 9 is ∈ (F/m), and the band gap of the p⁻ channel region 9 is V (eV), it is preferable to satisfy the formula (7).

However, in Embodiment 2, the first transistor TR1 and the second transistor TR2 are not adjacent to each other along one direction, that is, the Y-axis direction in FIG. 30. That is, the trenches T3 and T4 of the second transistor TR2 are not formed continuously with the trenches T1 and T2, respectively, of the first transistor TR1 along the Y-axis direction in FIG. 30. The trenches T3 and T4 of the second transistor TR2 are formed in a direction intersecting the Y-axis direction in FIG. 30, that is, the X-axis direction in FIG. 30, at positions spaced apart from the trenches T1 and T2 of the first transistor TR1. Moreover, the gate-to-gate distance W1 of the first transistor TR1, that is, the spacing between the trenches T1 and T2, may not be equal to the gate-to-gate distance W2 of the second transistor TR2, that is, the spacing between the trenches T3 and T4.

Therefore, the gate-to-gate distance W1 in the first transistor TR1 and the gate-to-gate distance W2 in the second transistor TR2 can be individually designed as follows. That is, the gate-to-gate distance W1 can be designed as a distance that is needed to reduce the on-voltage. Moreover, the gate-to-gate distance W2 can be designed as a distance that is needed to reduce a current that flows through the second transistor TR2 when the second transistor TR2 is in the on-state and to increase a current that flows through the second transistor TR2 when the second transistor TR2 is in the off-state.

Although not shown in the drawing, the gate electrodes 5a and 5b are electrically connected to each other at a position on the far side (or the near side) of the cross-section, which is similar to the cross-section shown in FIG. 1. Also the gate electrodes 5c and 5d are electrically connected to each other at a position on the far side (or the near side) of the cross-section, which is similar to the cross-section shown in FIG. 1. Moreover, the gate electrodes 5 (the gate electrodes 5a, 5b, 5c, and 5d) formed at the positions spaced apart from each other in the X-axis direction in FIG. 30 can be electrically connected to each other. With the configuration described above, a gate voltage to be applied to the gate electrodes 5a and 5b of the first transistor TR1 and a gate voltage to be applied to the gate electrodes 5c and 5d of the second transistor TR2 can be collectively controlled.

Moreover, unlike Embodiment 1, since the second transistor TR2 is continuously formed along the Y-axis direction in FIG. 30 in Embodiment 2, also the hole extraction region formed in contact with the second transistor TR2 is continuously formed along the Y-axis direction in FIG. 30.

The operation of the IGBT 50a as the semiconductor device of Embodiment 2 is similar to the operation of the IGBT 50 as the semiconductor device of Embodiment 1, and therefore, the description of the operation is omitted.

<Manufacturing Process of Semiconductor Device>

A manufacturing process of the semiconductor device of Embodiment 2 is similar to the manufacturing process of the semiconductor device of Embodiment 1, except for the step of patterning the silicon oxide film 21, the step of forming the trench T, and the steps of forming the $p^+$ channel region 7, the $n^{++}$ emitter region 8, and the $p^-$ channel region 9, and therefore, the description of similar steps is omitted.

A step of preparing the semiconductor substrate 3S can be performed substantially similarly to the step described with reference to FIGS. 5 to 8 in Embodiment 1, or the step described with reference to FIGS. 9 to 12 in Embodiment 1. However, unlike Embodiment 1, since the second transistor TR2 (see FIG. 30) is continuously formed along the Y-axis direction in FIG. 30 in Embodiment 2, also the hole extraction region 14 formed in contact with the second transistor TR2 is continuously formed along the Y-axis direction in FIG. 30.

A step of patterning the silicon oxide film 21 and a step of forming the trench T can be performed substantially similarly to the steps described with reference to FIG. 14 in Embodiment 1. However, unlike Embodiment 1, the pair of trenches T3 and T4 are formed at positions spaced apart from the pair of trenches T1 and T2 in the X-axis direction in FIG. 30 in Embodiment 2. Hence, the pair of trenches T3 and T4 are not formed continuously with the pair of trenches T1 and T2 along the Y-axis direction in FIG. 30.

A step of forming the gate insulating film 6 can be performed substantially similarly to the step described with reference to FIG. 15 in Embodiment 1. However, unlike Embodiment 1, the pair of gate insulating films 6c and 6d are formed at positions spaced apart from the pair of gate insulating films 6a and 6b in the X-axis direction in FIG. 30 in Embodiment 2. Hence, the pair of gate insulating films 6c and 6d are not formed continuously with the pair of gate insulating films 6a and 6b along the Y-axis direction in FIG. 30.

A step of forming the gate electrode 5 can be performed substantially similarly to the step described with reference to FIGS. 15 and 16 in Embodiment 1. However, unlike Embodiment 1, the pair of gate electrodes 5c and 5d are formed at positions spaced apart from the pair of gate electrodes 5a and 5b in the X-axis direction in FIG. 30 in Embodiment 2. Hence, the pair of gate electrodes 5c and 5d are not formed continuously with the pair of gate electrodes 5a and 5b along the Y-axis direction in FIG. 30.

Steps of forming the $p^+$ channel region 7, the $n^{++}$ emitter region 8, and the $p^-$ channel region 9 can be performed substantially similarly to the steps described with reference to FIGS. 17 and 18 in Embodiment 1. However, unlike Embodiment 1, in the steps of forming the $p^+$ channel region 7, the $n^{++}$ emitter region 8, and the $p^-$ channel region 9 by an ion implantation method, ion implantation is performed in a manner such that the first transistor TR1 and the second transistor TR2 are not adjacent to each other along the Y-axis direction in FIG. 30 in Embodiment 2. That is, the $p^-$ channel region 9 is formed so as not to be adjacent to the $p^+$ channel region 7 and the $n^{++}$ emitter regions 8a and 8b along the Y-axis direction in FIG. 30.

Principal Features and Advantageous Effects of Embodiment

Also in Embodiment 2, similarly to Embodiment 1, when the first transistor TR1 and the second transistor TR2 are in the on-state, holes and electrons flow through the first transistor TR1, but a current does not flow through the second transistor TR2. Moreover, when the first transistor TR1 and the second transistor TR2 are switched from the on-state to the off-state, holes flow through the first transistor TR1 and the second transistor TR2. Therefore, similarly to Embodiment 1, both a reduction in on-voltage and a reduction in switching loss can be achieved.

Moreover, in Embodiment 2, the hole extraction region 14 as a p-type semiconductor region formed in contact with the $p^-$ channel region 9 of the second transistor TR2 is included within the $n^{--}$ drift region 1. Due to this, similarly to Embodiment 1, the concentration of holes can be increased in a portion of the $n^{--}$ drift region 1 on the emitter electrode 12 side. Therefore, although the velocity of holes is not increased, a collector current when holes flow out through the $n^{--}$ drift region 1 can be increased.

On the other hand, unlike Embodiment 1, the first transistor TR1 and the second transistor TR2 are not adjacent to each other along the Y-axis direction in FIG. 30 in Embodiment 2. Therefore, the gate-to-gate distance W1 of the first transistor TR1 may not be equal to the gate-to-gate distance W2 of the second transistor TR2. Hence, the gate-to-gate distance W1 of the first transistor TR1 and the gate-to-gate distance W2 of the second transistor TR2 can be individually designed.

Embodiment 3

Semiconductor Device

Next, a semiconductor device of Embodiment 3 of the invention will be described. The semiconductor device of Embodiment 3 is a semiconductor device including an n-barrier region formed between the p+ channel region and the n-- drift region in the semiconductor device of Embodiment 1. Therefore, the description of a portion other than the n-barrier region is omitted.

Figure 31:
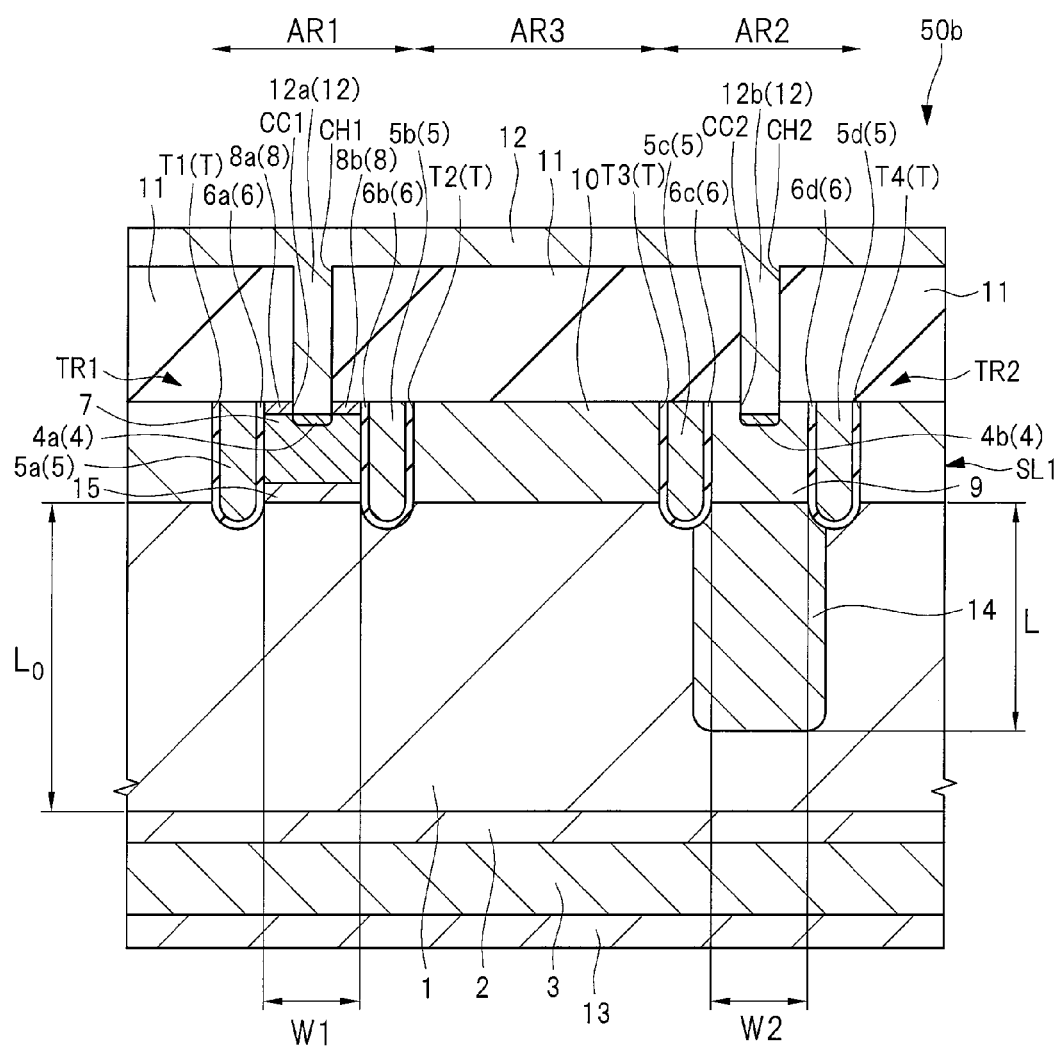
FIG. 31 is a cross-sectional view of a main portion of a semiconductor device of Embodiment 3.
Figure 32:
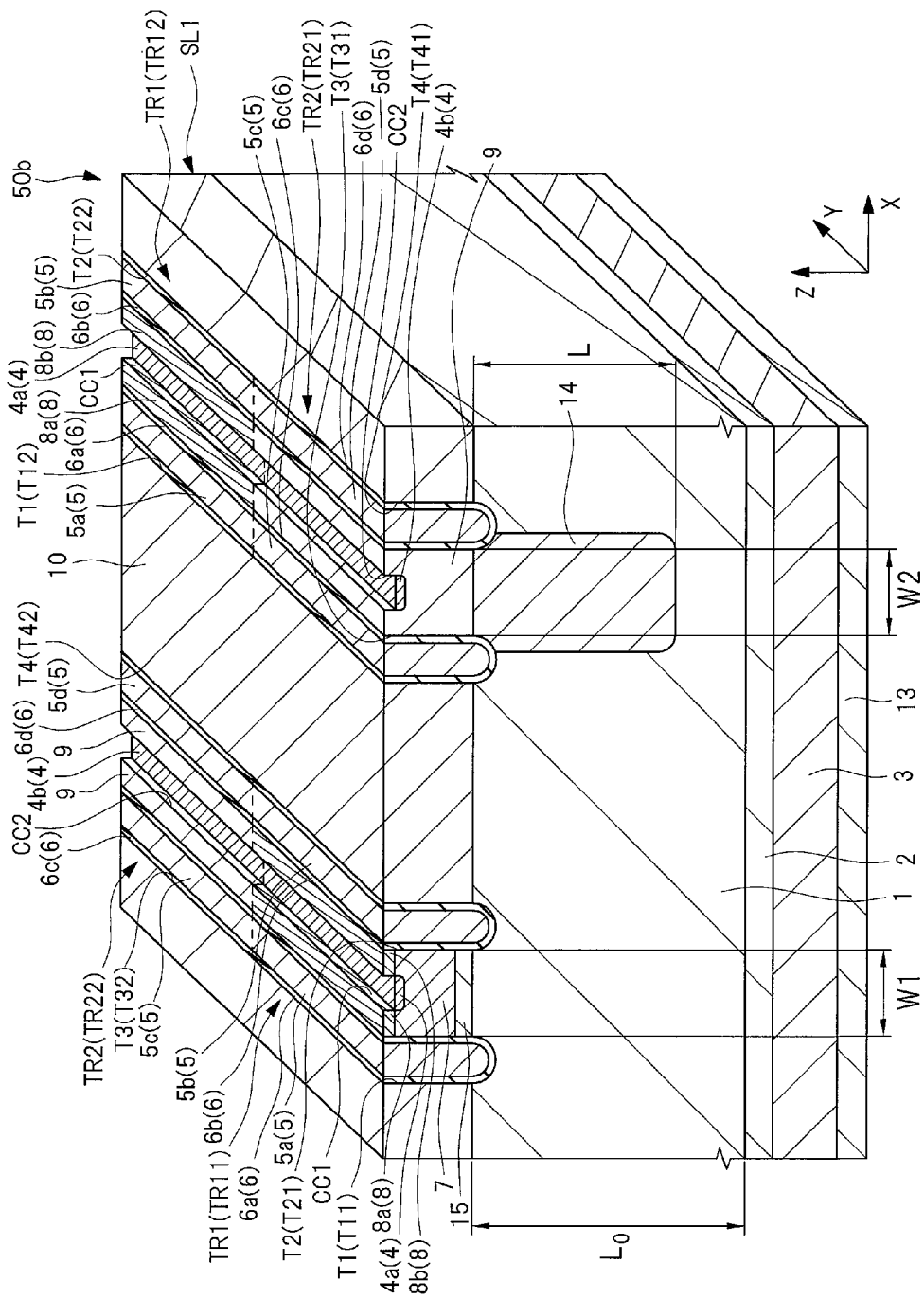
FIG. 32 is a perspective view of the semiconductor device of Embodiment 3.

FIG. 31 is a cross-sectional view of a main portion of the semiconductor device of Embodiment 3. FIG. 32 is a perspective view of the semiconductor device of Embodiment 3.

As shown in FIG. 31, in an IGBT 50b as the semiconductor device of Embodiment 3, an n-barrier region 15 is formed between the p+ channel region 7 and the n-- drift region 1 in the first region AR1. The n-barrier region 15 is an n-type semiconductor region made of silicon (Si) into which an n-type impurity such as, for example, phosphorus (P) or arsenic (As) has been diffused. The impurity concentration of the n-barrier region 15 can be, for example, about from $5 \times 10^{16}$ to $1 \times 10^{18}$ cm$^{-3}$.

By forming the n-barrier region 15, the discharge of holes excessively accumulated in the n-- drift region 1 to the emitter electrode 12a through the p+ channel region 7, that is, the flowing out of the holes, can be suppressed when the first transistor TR1 is in the on-state. Hence, by adjusting the impurity concentration of the n-barrier region 15, the degree of IE effect can be adjusted.

Moreover, in Embodiment 3 as shown in FIG. 32, the first transistor TR1 and the second transistor TR2 are adjacent to each other along one direction, that is, the Y-axis direction in FIG. 32, similarly to Embodiment 1.

The operation of the IGBT 50b as the semiconductor device of Embodiment 3 is substantially similar to the operation of the IGBT 50 as the semiconductor device of Embodiment 1, and therefore, the description of the operation is omitted.

However, in Embodiment 3, when the first transistor TR1 is in the on-state, the discharge of the holes excessively accumulated in the n-- drift region 1 to the emitter electrode 12a through the first transistor TR1 is suppressed by the n-barrier region 15.

<Manufacturing Process of Semiconductor Device>

Figure 33:
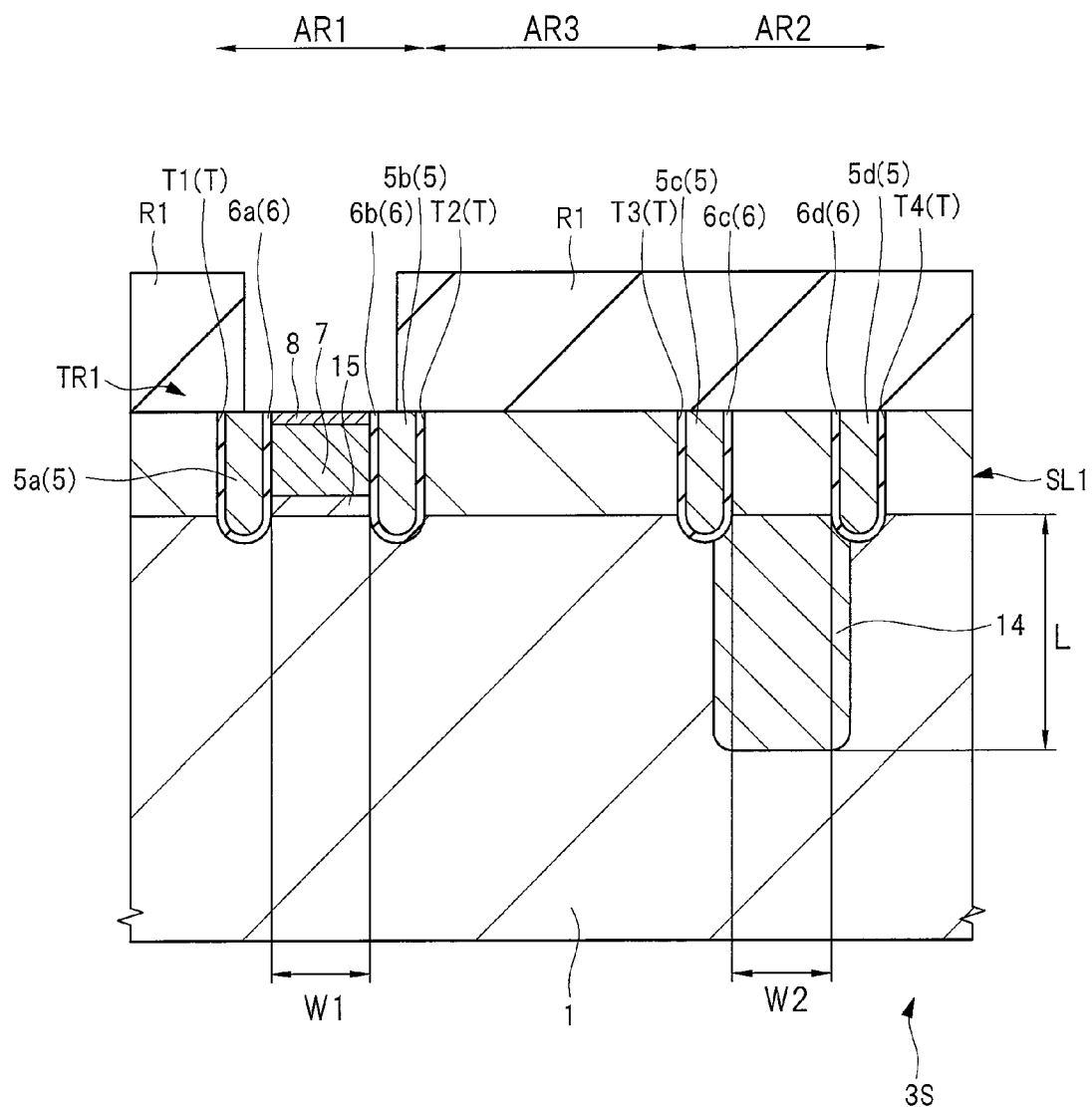
FIG. 33 is a cross-sectional view of the main portion of the semiconductor device of Embodiment 3 during a manufacturing process.

FIG. 33 is a cross-sectional view of a main portion of the semiconductor device of Embodiment 3 during a manufacturing process.

The manufacturing process of the semiconductor device of Embodiment 3 is similar to the manufacturing process of the semiconductor device of Embodiment 1, except for a step of forming the n-barrier region 15, and therefore, the description of similar steps is omitted.

In Embodiment 3, after the gate electrode 5 is formed for example, and before the p+ channel region 7 is formed, the n-barrier region 15 is formed as shown in FIG. 33.

Specifically, the resist film R1 is applied on the semiconductor substrate 3S. Then, an exposure and development treatment is applied to the applied resist film R1 using a photolithography technique to thereby pattern the resist film R1. The patterning of the resist film R1 is performed in a manner such that the second region AR2 and the third region AR3 are covered and the first region AR1 is exposed. Then, an n-type impurity is introduced into the semiconductor layer SL1 by an ion implantation method using the patterned resist film R1 as a mask. Due to this, the n-barrier region 15 is formed in a portion of the semiconductor layer SL1 not covered with the resist film R1 in the first region AR1. The n-barrier region 15 is formed between the pair of trenches T1 and T2 in a manner such that the both sides of the n-barrier region 15 are in contact with the trenches T1 and T2 and the lower side of the n-barrier region 15 is in contact with the n-- drift region 1. The impurity concentration of the n-barrier region 15 can be, for example, about from $5 \times 10^{16}$ to $1 \times 10^{18}$ cm$^{-3}$ as described above.

Next, as shown in FIG. 33, the p+ channel region 7 and the n++ emitter region 8 are formed. This step of forming the p+ channel region 7 and the n++ emitter region 8 can be performed similarly to the step described with reference to FIG. 17.

Principal Features and Advantageous Effects of Embodiment

Also in Embodiment 3, similarly to Embodiment 1, when the first transistor TR1 and the second transistor TR2 are in the on-state, holes and electrons flow through the first transistor TR1, but a current does not flow through the second transistor TR2. Moreover, when the first transistor TR1 and the second transistor TR2 are switched from the on-state to the off-state, holes flow through the first transistor TR1 and the second transistor TR2. Therefore, similarly to Embodiment 1, both a reduction in on-voltage and a reduction in switching loss can be achieved.

Moreover, in Embodiment 3, the hole extraction region 14 as a p-type semiconductor region formed in contact with the p- channel region 9 of the second transistor TR2 is included within the n-- drift region 1. Due to this, similarly to Embodiment 1, the concentration of holes can be increased in a portion of the n-- drift region 1 on the emitter electrode 12 side. Therefore, although the velocity of holes is not increased, a collector current when holes flow out through the n-- drift region 1 can be increased.

On the other hand, unlike Embodiment 1, the n-barrier region 15 is formed between the p+ channel region 7 and the n-- drift region 1 in Embodiment 3. Therefore, by adjusting the impurity concentration of the n-barrier region 15, the degree of IE effect can be adjusted, and the on-voltage can be further reduced compared to Embodiment 1.

Embodiment 4

Semiconductor Device

Next, a semiconductor device of Embodiment 4 of the invention will be described. The semiconductor device of Embodiment 4 is a semiconductor device including an n-barrier region formed between the p+ channel region and the n-- drift region in the semiconductor device of Embodiment 2. Therefore, the description of a portion other than the n-barrier region is omitted.

Figure 34:
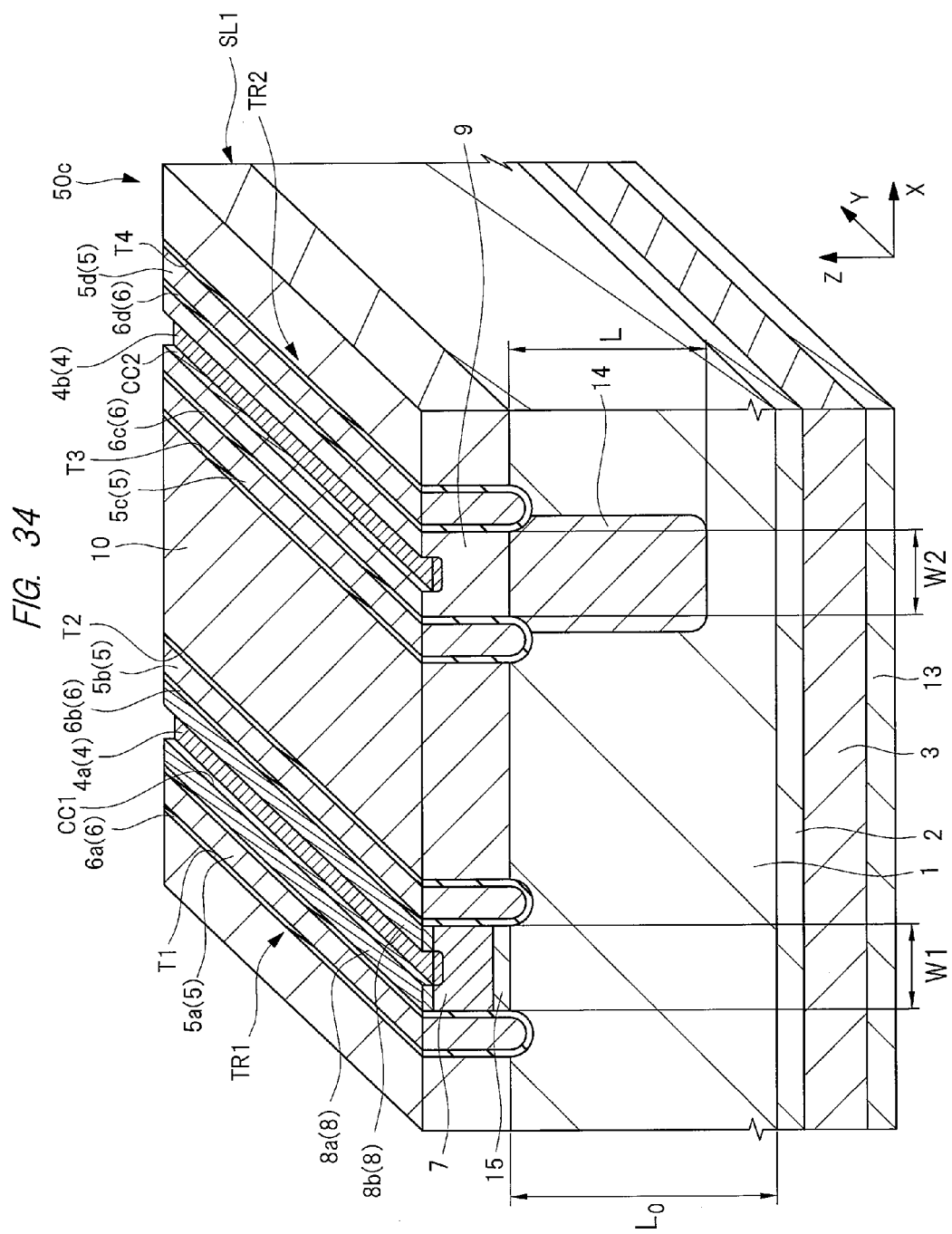
FIG. 34 is a perspective view of a semiconductor device of Embodiment 4.

FIG. 34 is a perspective view of the semiconductor device of Embodiment 4. A cross-sectional view of a main portion of the semiconductor device of Embodiment 4 is similar to the cross-sectional view of the main portion of the semiconductor device shown in FIG. 31 in Embodiment 3.

As shown in FIG. 34, in an IGBT 50c as the semiconductor device of Embodiment 4, the n-barrier region 15 is formed between the p+ channel region 7 and the n-- drift region 1 similarly to the IGBT 50b as the semiconductor device of Embodiment 3.

Moreover, in Embodiment 4 as shown in FIG. 34, the first transistor TR1 and the second transistor TR2 are not adjacent to each other along one direction, that is, the Y-axis direction in FIG. 34, similarly to Embodiment 2.

The operation of the semiconductor device of Embodiment 4 is similar to the operation of the semiconductor device of Embodiment 3, and therefore, the description of the operation is omitted.

<Manufacturing Process of Semiconductor Device>

A manufacturing process of the semiconductor device of Embodiment 4 is similar to the manufacturing method of the semiconductor device of Embodiment 2 except for a step of forming the n-barrier region 15, and therefore, the description of similar steps is omitted.

In Embodiment 4, after the gate electrode 5 is formed for example, and before the $p^+$ channel region 7 is formed, the n-barrier region 15 is formed by performing a step similar to the step described with reference to FIG. 33 in Embodiment 3.

Principal Features and Advantageous Effects of Embodiment

Also in Embodiment 4, similarly to Embodiment 1, when the first transistor TR1 and the second transistor TR2 are in the on-state, holes and electrons flow through the first transistor TR1, but a current does not flow through the second transistor TR2. Moreover, when the first transistor TR1 and the second transistor TR2 are switched from the on-state to the off-state, holes flow through the first transistor TR1 and the second transistor TR2. Therefore, similarly to Embodiment 1, both a reduction in on-voltage and a reduction in switching loss can be achieved.

Moreover, in Embodiment 4, the hole extraction region 14 as a p-type semiconductor region formed in contact with the $p^-$ channel region 9 of the second transistor TR2 is included within the $n^{--}$ drift region 1. Due to this, similarly to Embodiment 1, the concentration of holes can be increased in a portion of the $n^{--}$ drift region 1 on the emitter electrode 12 side. Therefore, although the velocity of holes is not increased, a collector current when holes flow out through the $n^{--}$ drift region 1 can be increased.

Further, in Embodiment 4, similarly to Embodiment 2, the first transistor TR1 and the second transistor TR2 are not adjacent to each other along the Y-axis direction in FIG. 34. Therefore, the gate-to-gate distance W1 of the first transistor TR1 may not be equal to the gate-to-gate distance W2 of the second transistor TR2. Hence, the gate-to-gate distance W1 of the first transistor TR1 and the gate-to-gate distance W2 of the second transistor TR2 can be individually designed.

On the other hand, in Embodiment 4, the n-barrier region 15 is formed between the $p^+$ channel region 7 and the $n^{--}$ drift region 1 similarly to Embodiment 3. Therefore, by adjusting the impurity concentration of the n-barrier region 15, the degree of IE effect can be adjusted, and the on-voltage can be further reduced compared to the semiconductor device of Embodiment 2.

The invention made by the present inventor has been specifically described so far based on the embodiments of the invention. However, the invention is not limited to the embodiments, and it goes without saying that various modifications can be made within the range not departing from the gist of the invention.

For example, in the embodiments, an example in which the gate electrode is formed in the interior of the trench has been described. However, the embodiments are not limited to the case where the gate electrode is formed in the interior of the trench, and can be applied also to the case where, for example, a pair of gate electrodes are formed on a semiconductor layer, and then a channel region is formed in a region interposed between the pair of gate electrodes.

INDUSTRIAL APPLICABILITY

The invention is effectively applied to a semiconductor device and a method for manufacturing the same.

REFERENCE SIGNS LIST

1: $n^{--}$ drift region
1a to 1c: semiconductor layer
2: $n^+$ buffer region
3: $p^+$ collector region
3S: semiconductor substrate
4, 4a, 4b: $p^{++}$ emitter region
5, 5a to 5d: gate electrode
6, 6a to 6d: gate insulating film
7: $p^+$ channel region
7a, 7b: inversion layer
8, 8a, 8b: $n^{++}$ emitter region
9: $p^-$ channel region
9a, 9b: inversion layer
10: p-well region
11: interlayer insulating film
12, 12a, 12b: emitter electrode
13: collector electrode
14: hole extraction region
14a to 14c: semiconductor region
15: n-barrier region
19, 21: silicon oxide film
22: polysilicon film
50, 50a to 50c: IGBT
AR1: first region
AR2: second region
AR3: third region
BL: broken line
CC1, CC2: recess
CH1, CH2: contact hole
L: length
OP, OP0 to OP4: opening
PS1 to PS4: path
R1 to R4: resist film
SL1: semiconductor layer
T, T0 to T4: trench
T11, T12, T21, T22, T31, T32, T41, T42: trench
TR1, TR11, TR12: first transistor
TR2, TR21, TR22: second transistor
W1, W2: gate-to-gate distance (spacing)

The invention claimed is:

1. A semiconductor device comprising:
a first semiconductor layer of a first conductivity type;
a second semiconductor layer of a second conductivity type formed on one main surface side of the first semiconductor layer, the second conductivity type being different from the first conductivity type;
a first transistor formed on the other main surface side of the first semiconductor layer and including a first gate electrode;
a second transistor formed on the other main surface side of the first semiconductor layer and including a second gate electrode electrically connected with the first gate electrode;
an emitter electrode electrically connected with the first transistor and the second transistor;
a collector electrode electrically connected with the second semiconductor layer; and
a first semiconductor region of the second conductivity type formed in contact with the second transistor within the first semiconductor layer, wherein
when the first transistor and the second transistor are in an on-state, a current composed of charges of a first polarity and charges of a second polarity opposite to the first polarity flows from the collector electrode through the first transistor to the emitter electrode but does not flow through the second transistor, and when the first transistor and the second transistor are switched from the on-state to the off-state, a current composed of charges of the second polarity flows from the first semiconductor layer through the first transistor to the emitter electrode and a current composed of charges of the second polarity flows from the first semiconductor layer through the first semiconductor region and the second transistor to the emitter electrode.

2. The semiconductor device according to claim 1, wherein
the first transistor includes
a first emitter region of the second conductivity type in contact with the emitter electrode,
a pair of the first gate electrodes respectively formed on both sides of the first emitter region,
a pair of first gate insulating films respectively covering surfaces of the pair of first gate electrodes,
a first channel region of the second conductivity type in contact with the first emitter region and the first gate insulating films, and
a second emitter region of the first conductivity type in contact with the emitter electrode, the first gate insulating film, and the first channel region, and
the second transistor includes
a third emitter region of the second conductivity type in contact with the emitter electrode,
a pair of the second gate electrodes formed spaced apart from each other with a first spacing therebetween on both sides of the third emitter region,
a pair of second gate insulating films respectively covering surfaces of the pair of second gate electrodes, and
a second channel region of the second conductivity type in contact with the emitter electrode and the second gate insulating films, and
the first semiconductor region is formed in contact with the second channel region within the first semiconductor layer.

3. The semiconductor device according to claim 2, wherein
when the first spacing is W (m), the impurity concentration of the second channel region is $N_a$ (cm$^{-3}$), an elementary charge is q (C), the permittivity of the second channel region is $\in$ (F/m), and the band gap of the second channel region is V (eV), the semiconductor device satisfies $W<2\times10^{-3}\times(2V\in/(qN_a))^{1/2}$.

4. The semiconductor device according to claim 2, wherein
when a power supply voltage is $V_{cc}$ (V) and the length of the first semiconductor region in a direction from the collector electrode toward the emitter electrode is L (μm), the semiconductor device satisfies $L<8\times10^{-2}\times V_{cc}$, and
when the impurity concentration of the first semiconductor region is $N_d$ (cm$^{-3}$), the semiconductor device satisfies $N_d<2\times10^{16}$.

5. The semiconductor device according to claim 1, further comprising a third semiconductor layer formed on the other main surface side of the first semiconductor layer, wherein
the first transistor and the second transistor are formed in the third semiconductor layer,
the first transistor includes
a pair of first trenches formed spaced apart from each other and penetrating the third semiconductor layer,
a pair of first gate insulating films formed respectively on inner walls of the pair of first trenches,
a pair of the first gate electrodes respectively embedded in interiors of the pair of first trenches via the first gate insulating films,
a first emitter region of the second conductivity type formed in a first portion of the third semiconductor layer and in contact with the emitter electrode, the first portion being interposed between the pair of first trenches,
a first channel region of the second conductivity type formed in the first portion of the third semiconductor layer and in contact with the first emitter region and the first gate insulating films, and
a second emitter region of the first conductivity type formed in the first portion of the third semiconductor layer and in contact with the emitter electrode, the first gate insulating film, and the first channel region,
the second transistor includes
a pair of second trenches formed spaced apart from each other with a first spacing therebetween in a plan view and penetrating the third semiconductor layer,
a pair of second gate insulating films respectively formed on inner walls of the pair of second trenches,
a pair of the second gate electrodes respectively embedded in interiors of the pair of second trenches via the second gate insulating films,
a third emitter region of the second conductivity type formed in a second portion of the third semiconductor layer and in contact with the emitter electrode, the second portion being interposed between the pair of second trenches, and
a second channel region of the second conductivity type formed in the second portion of the third semiconductor layer and in contact with the emitter electrode and the second gate insulating films, and
the first semiconductor region is formed in contact with the second channel region within the first semiconductor layer.

6. The semiconductor device according to claim 5, wherein
when the first spacing is W (m), the impurity concentration of the second channel region is $N_a$ (cm$^{-3}$), an elementary charge is q (C), the permittivity of the second channel region is $\in$ (F/m), and the band gap of the second channel region is V (eV), the semiconductor device satisfies $W<2\times10^{-3}\times(2\in/(qN_a))^{1/2}$.

7. The semiconductor device according to claim 5, wherein
when a power supply voltage is $V_{cc}$ (V) and the length of the first semiconductor region in a direction from the collector electrode toward the emitter electrode is L (μm), the semiconductor device satisfies $L<8\times10^{-2}\times V_{cc}$, and
when the impurity concentration of the first semiconductor region is $N_d$ (cm$^{-3}$), the semiconductor device satisfies $N_d<2\times10^{16}$.

8. The semiconductor device according to claim 2, wherein
the first emitter region, the pair of first gate electrodes, the pair of first gate insulating films, the first channel region, and the second emitter region are formed along a first direction in a plan view,
the pair of first gate electrodes are formed spaced apart from each other with the first spacing therebetween,
the third emitter region is formed continuously with the first emitter region along the first direction, the pair of second gate electrodes are respectively formed continuously with the pair of first gate electrodes along the first direction, the pair of second gate insulating films are respectively formed continuously with the pair of first gate insulating films along the first direction, and the second channel region is formed adjacent to the first channel region and the second emitter region along the first direction.

9. The semiconductor device according to claim 5, wherein the pair of first trenches are formed along a first direction in a plan view and formed spaced apart from each other with the first spacing therebetween, the first emitter region, the pair of first gate electrodes, the pair of first gate insulating films, the first channel region, and the second emitter region are formed along the first direction in the plan view, the pair of second trenches are respectively formed continuously with the pair of first trenches along the first direction, the third emitter region is formed continuously with the first emitter region along the first direction, the pair of second gate insulating films are respectively formed continuously with the pair of first gate insulating films along the first direction, the pair of second gate electrodes are respectively formed continuously with the pair of first gate electrodes along the first direction, and the second channel region is formed adjacent to the first channel region and the second emitter region along the first direction.

10. The semiconductor device according to claim 2, further comprising a first barrier region of the first conductivity type formed between the first channel region and the first semiconductor layer.

11. The semiconductor device according to claim 5, further comprising a first barrier region of the first conductivity type formed between the first channel region and the first semiconductor layer.

12. A method for manufacturing a semiconductor device, comprising the steps of:
(a) preparing a semiconductor substrate including a first semiconductor layer of a first conductivity type and a first semiconductor region of a second conductivity type formed, in a first region on one main surface side of the first semiconductor layer, in a first portion of the first semiconductor layer on the one main surface side, the second conductivity type being different from the first conductivity type;
(b) forming, in the first region and a second region on the one main surface side of the first semiconductor layer, a second semiconductor layer on the one main surface side of the first semiconductor layer including the first portion where the first semiconductor region is formed;
(c) forming, in the second region, a pair of first trenches spaced apart from each other so as to penetrate the second semiconductor layer and forming, in the first region, a pair of second trenches spaced apart from each other with a first spacing therebetween so as to penetrate the second semiconductor layer;
(d) forming a pair of first gate insulating films respectively on inner walls of the pair of first trenches and forming a pair of second gate insulating films respectively on inner walls of the pair of second trenches;
(e) forming a pair of first gate electrodes so as to be respectively embedded in interiors of the pair of first trenches via the first gate insulating films and forming a pair of second gate electrodes so as to be respectively embedded in interiors of the pair of second trenches via the second gate insulating films;
(f) forming a first channel region of the second conductivity type in a second portion of the second semiconductor layer, the second portion being interposed between the pair of first trenches;
(g) forming a second channel region of the second conductivity type in a third portion of the second semiconductor layer, the third portion being interposed between the pair of second trenches;
(h) forming a first emitter region of the first conductivity type in the second portion of the second semiconductor layer so as to be in contact with the first gate insulating film and the first channel region;
(i) forming a second emitter region of the second conductivity type in the second portion of the second semiconductor layer so as to be spaced apart from both the pair of the first trenches and be in contact with the first channel region;
(j) forming a third emitter region of the second conductivity type in the third portion of the second semiconductor layer so as to be spaced apart from both the pair of the second trenches and be in contact with the second channel region;
(k) forming an emitter electrode so as to be in contact with the first emitter region, the second emitter region, and the third emitter region;
(l) forming a third semiconductor layer of the second conductivity type on the side opposite to the second semiconductor layer with the first semiconductor layer interposed therebetween; and
(m) forming a collector electrode so as to be in contact with the third semiconductor layer, wherein in the step (b), the second semiconductor layer is formed so as to be in contact with the first semiconductor region, in the step (c), the pair of second trenches are formed in a manner such that the first semiconductor region is located between the pair of second trenches in a plan view, and in the step (g), the second channel region is formed so as to be in contact with the first semiconductor region.

13. The method for manufacturing a semiconductor device according to claim 12, wherein when the first spacing is W (m), the impurity concentration of the second channel region is $N_a$ (cm$^{-3}$), an elementary charge is q (C), the permittivity of the second channel region is $\in$ (F/m), and the band gap of the second channel region is V (eV), the method satisfies $W<2\times10^{-3}\times(2V\in/(qN_a))^{1/2}$.

14. The method for manufacturing a semiconductor device according to claim 12, wherein when a power supply voltage is $V_{cc}$ (V) and the length of the first semiconductor region in a direction from the collector electrode toward the emitter electrode is L (μm), the method satisfies $L<8\times10^{-2}\times V_{cc}$, and when the impurity concentration of the first semiconductor region is $N_d$ (cm$^{-3}$), the method satisfies $N_d<2\times10^{16}$.

15. The method for manufacturing a semiconductor device according to claim 12, wherein the step (a) includes the steps of
(a1) preparing the semiconductor substrate including the first semiconductor layer, (a2) forming, in the first region, a third trench in the first portion of the first semiconductor layer, and
(a3) forming the first semiconductor region so as to be embedded in the third trench to prepare the semiconductor substrate including the first semiconductor layer and the first semiconductor region.

* * * * *